(12) United States Patent
Makiyama et al.

(10) Patent No.: US 10,002,942 B2
(45) Date of Patent: *Jun. 19, 2018

(54) SEMICONDUCTOR DEVICE AND METHOD OF MANUFACTURING SEMICONDUCTOR DEVICE

(71) Applicant: FUJITSU LIMITED, Kawasaki-shi, Kanagawa (JP)

(72) Inventors: Kozo Makiyama, Kawasaki (JP); Shirou Ozaki, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/602,793

(22) Filed: May 23, 2017

(65) Prior Publication Data

US 2017/0256400 A1    Sep. 7, 2017

Related U.S. Application Data

(60) Continuation of application No. 15/189,191, filed on Jun. 22, 2016, now Pat. No. 9,779,933, which is a
(Continued)

(30) Foreign Application Priority Data

Apr. 17, 2014  (JP) ................................. 2014-085621
Mar. 2, 2015   (JP) ................................. 2015-040411

(51) Int. Cl.
*H01L 29/66*    (2006.01)
*H01L 29/20*    (2006.01)
(Continued)

(52) U.S. Cl.
CPC .... *H01L 29/66462* (2013.01); *H01L 21/0217* (2013.01); *H01L 21/0272* (2013.01);
(Continued)

(58) Field of Classification Search
None
See application file for complete search history.

(56) References Cited

U.S. PATENT DOCUMENTS 8,309,987 B2    11/2012  Derluyn et al.
9,412,830 B2 *   8/2016  Makiyama .......... H01L 29/2003
(Continued)

FOREIGN PATENT DOCUMENTS

JP    08-264760      10/1996
JP    2002-359256    12/2002
(Continued)

OTHER PUBLICATIONS

JPOA—Office Action dated Jun. 20, 2017 issued with respect to the basic Japanese Patent Application No. 2014-085621, with full machine translated office action.
(Continued)

*Primary Examiner* — Eva Y Montalvo
*Assistant Examiner* — Kevin Quinto
(74) *Attorney, Agent, or Firm* — Fujitsu Patent Center

(57) ABSTRACT

A semiconductor device includes a first semiconductor layer made of a nitride semiconductor and formed on a substrate, a second semiconductor layer made of a material including InAlN and formed on the first semiconductor layer, an insulator layer formed by an oxidized surface part of the second semiconductor layer, a gate electrode formed on the insulator layer, and a source electrode and a drain electrode respectively formed on the first or second semiconductor layer.

17 Claims, 45 Drawing Sheets

Related U.S. Application Data division of application No. 14/688,031, filed on Apr. 16, 2015, now Pat. No. 9,412,830.

(51) Int. Cl.
| | |
|---|---|
| *H01L 29/51* | (2006.01) |
| *H01L 21/02* | (2006.01) |
| *H01L 21/311* | (2006.01) |
| *H01L 21/033* | (2006.01) |
| *H01L 29/778* | (2006.01) |
| *H01L 21/28* | (2006.01) |
| *H01L 21/027* | (2006.01) |
| *H03F 3/21* | (2006.01) |
| *H01L 29/423* | (2006.01) |
| *H01L 21/32* | (2006.01) |
| *H03F 1/32* | (2006.01) |

(52) U.S. Cl.
CPC .. *H01L 21/02175* (2013.01); *H01L 21/02178* (2013.01); *H01L 21/02241* (2013.01); *H01L 21/02255* (2013.01); *H01L 21/0332* (2013.01); *H01L 21/28264* (2013.01); *H01L 21/31111* (2013.01); *H01L 21/31116* (2013.01); *H01L 21/31144* (2013.01); *H01L 29/2003* (2013.01); *H01L 29/517* (2013.01); *H01L 29/7786* (2013.01); *H01L 21/32* (2013.01); *H01L 29/42364* (2013.01); *H01L 29/42376* (2013.01); *H01L 29/513* (2013.01); *H01L 2224/0603* (2013.01); *H01L 2224/48247* (2013.01); *H01L 2224/48257* (2013.01); *H01L 2224/4903* (2013.01); *H01L 2924/181* (2013.01); *H03F 1/3252* (2013.01); *H03F 3/21* (2013.01)

(56) References Cited

U.S. PATENT DOCUMENTS

| | | |
|---|---|---|
| 2008/0248639 A1 | 10/2008 | Moriyama |
| 2010/0012977 A1 | 1/2010 | Derluyn |
| 2010/0327322 A1 | 12/2010 | Kub |
| 2011/0024796 A1* | 2/2011 | Miyoshi .................. C30B 19/00 257/194 |
| 2011/0140242 A1 | 6/2011 | Ramdani |
| 2012/0211760 A1* | 8/2012 | Yamada .............. H01L 29/2003 257/76 |
| 2012/0211761 A1 | 8/2012 | Yamada |
| 2012/0313145 A1 | 12/2012 | Makabe |
| 2013/0099285 A1 | 4/2013 | Hwang |
| 2013/0105810 A1 | 5/2013 | Nishimori |
| 2013/0307027 A1 | 11/2013 | Lu |
| 2014/0158976 A1 | 6/2014 | Dasgupta |
| 2014/0206158 A1 | 7/2014 | Yamada |

FOREIGN PATENT DOCUMENTS

| | | |
|---|---|---|
| JP | 2007-329154 | 12/2007 |
| JP | 2010-045343 | 2/2010 |
| JP | 2012-074544 | 4/2012 |
| JP | 2012-174875 | 9/2012 |
| JP | 2013-235986 | 11/2013 |

OTHER PUBLICATIONS

USPTO, [QUINTO], Notice of Allowance dated Jul. 14, 2017 for U.S. Appl. No. 15/189,191 [allowed].
USPTO, (QUINTO) Notice of Allowance and Notice of Allowability, dated Apr. 12, 2017 in parent U.S. Appl. No. 15/189,191 [pending].
USPTO, (QUINTO) Non-Final Rejection, dated Sep. 14, 2016, in parent U.S. Appl. No. 15/189,191 [pending].
USPTO, (QUINTO) Issue Notification, Jul. 20, 2016, in grand-parent U.S. Appl. No. 14/688,031 [patented U.S. Pat. No. 9,412,830].
USPTO, (QUINTO) Notice of Allowance and Notice of Allowability, dated Apr. 27, 2016, in grand-parent U.S. Appl. No. 14/688,031 [patented U.S. Pat. No. 9,412,830].
USPTO, (LAIR) Non-Final Rejection, dated Dec. 7, 2015, in grand-parent U.S. Appl. No. 14/688,031 [patented U.S. Pat. No. 9,412,830].
USPTO, (LAIR) Restriction Requirement, dated Aug. 6, 2015, in grand-parent U.S. Appl. No. 14/688,031 [patented U.S. Pat. No. 9,412,830].

* cited by examiner

| | Semiconductor Device in First Embodiment | Semiconductor Device in Second Embodiment |
|---|---|---|
| $C_{gs}$(fF/mm) | 500 | 500 |
| $C_{gd}$(fF/mm) | 130 | 110 |
| $C_{ds}$(fF/mm) | 150 | 150 |
| $f_{max}$(GHz) | 240 | 270 |

FIG.47

|  | Semiconductor Device in Fourth Embodiment | Semiconductor Device in Sixth Embodiment |
|---|---|---|
| $C_{gs}$(fF/mm) | 500 | 500 |
| $C_{gd}$(fF/mm) | 130 | 110 |
| $C_{ds}$(fF/mm) | 150 | 150 |
| $f_{max}$(GHz) | 240 | 250 |

SEMICONDUCTOR DEVICE AND METHOD OF MANUFACTURING SEMICONDUCTOR DEVICE

CROSS-REFERENCE TO RELATED APPLICATIONS

This application is a continuation of application Ser. No. 15/189,191, filed Jun. 22, 2016, which is a divisional of Ser. No. 14/688,031, filed Apr. 16, 2015 (now issued U.S. Pat. No. 9,412,830), which is based upon and claims the benefit of priorities of the prior Japanese Patent Applications No. 2014-085621, filed on Apr. 17, 2014, and No. 2015-040411, filed on Mar. 2, 2015, the entire contents of which are incorporated herein by reference.

FIELD

The embodiments discussed herein are related to a semiconductor device and a method of manufacturing the semiconductor device.

BACKGROUND

Materials such as nitride semiconductors, including GaN, AlN, and InN, and mixed crystals of such nitride semiconductors, have a wide band gap. Hence, such materials having the wide band gap are used for high-output electronic devices, short wavelength light emitting devices, or the like. For example, GaN, which is an example of the nitride semiconductor, has a band gap of 3.4 eV that is wider than a band gap of Si that is 1.1 eV and also wider than a band gap of GaAs that is 1.4 eV.

An FED (Field Effect Transistor), and particularly an HEMT (High Electron Mobility Transistor) as proposed in Japanese Laid-Open Patent Publication No. 2002-359256, for example, is an example of the high-output electronic device. The HEMT using the nitride semiconductor may be used for a high-output and high-efficiency amplifier, a high-power switching device, or the like. More particularly, in the HEMT that uses AlGaN for an electron supply layer and GaN for an electron transit layer, a piezoelectric polarization or the like may occur in AlGaN due to a distortion caused by a difference between lattice constants of AlGaN and GaN, to thereby generate 2DEG (2-Dimensional Electron Gas) having a high concentration. For this reason, this HEMT may operate at a high voltage, and may be used in a high-efficiency switching device, a high voltage power device for an electric vehicle, or the like.

In some ultra-high-frequency devices using the nitride semiconductor, InAlN having a high spontaneous polarization is used for the electron supply layer in place of AlGaN, in order to obtain a high output from the device. Even a thin InAlN layer may induce the 2DEG having a high concentration, and thus, InAlN is being regarded as a material enabling both high output properties and high frequency properties.

However, in the HEMT that uses InAlN for the electron supply layer, the high spontaneous polarization of InAlN increases an electric field intensity within the electron supply layer. Particularly in the case of an HEMT having a Schottky gate electrode, there is a problem in that a gate leak current increases.

Accordingly, it is desirable to reduce the gate leak current in the HEMT that uses InAlN for the electron supply layer and has the Schottky gate electrode.

SUMMARY

According to one aspect of the embodiments, a semiconductor device includes a first semiconductor layer made of a nitride semiconductor and formed on a substrate; a second semiconductor layer made of a material including InAlN and formed on the first semiconductor layer; a first insulator layer formed by an oxidized surface part of the second semiconductor layer; a gate electrode formed on the first insulator layer; and a source electrode and a drain electrode respectively formed on the first or second semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 47 is a diagram for explaining properties of the semiconductor devices in the fourth embodiment and the sixth embodiment;

DESCRIPTION OF EMBODIMENTS

Figure 1:
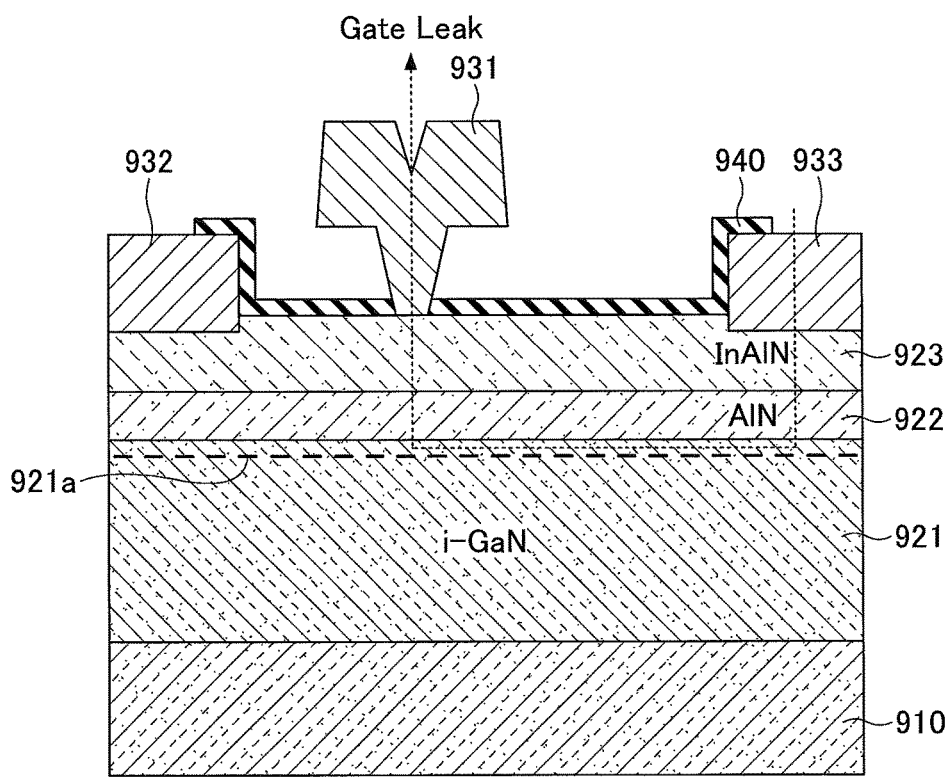
FIG. 1 is a structure diagram illustrating a semiconductor device using InAlN for an electron supply layer.

Preferred embodiments of the present invention will be described with reference to the accompanying drawings.

A description will now be given of the semiconductor device and the method of manufacturing the semiconductor device, in each embodiment according to the present invention. In the figures, those parts that are the same are designated by the same reference numerals, and a repetition of the same parts will be omitted.

First Embodiment

First, a description will be given of a semiconductor device using InAlN for an electron supply layer, by referring to FIG. 1. FIG. 1 is a structure diagram illustrating the semiconductor device using InAlN for the electron supply layer. The semiconductor device illustrated in FIG. 1 includes a buffer layer (not illustrated), an i-GaN electron transit layer 921, an AlN intermediate layer 922, and an InAlN electron supply layer 923 that are stacked on a substrate 910. A gate electrode 931, a source electrode 932, and a drain electrode 933 are provided on the electron supply layer 923. A protection layer 940 made of SiN or the like is formed on an exposed region of the electron supply layer 923, not provided with the gate electrode 931, the source electrode 932, and the drain electrode 933. The substrate 910 is made of semi-insulating SiC, and a 2DEG 921a is generated in the electron transit layer 921 at a vicinity of an interface between the electron transit layer 921 and the intermediate layer 922.

Figure 2:
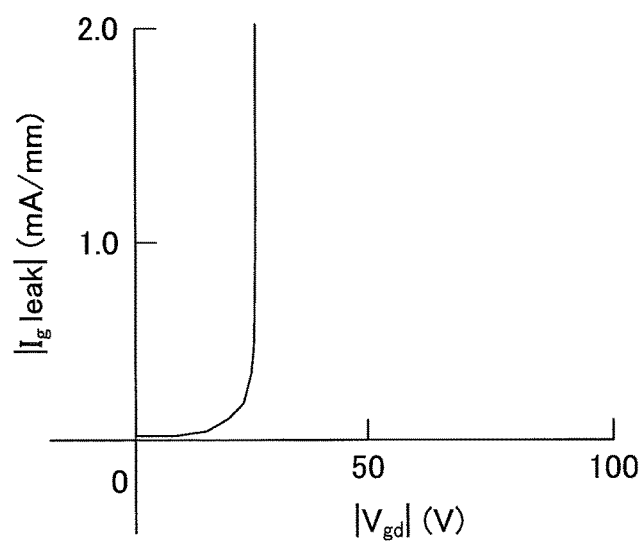
FIG. 2 is a diagram illustrating a correlation between a gate-drain voltage and a gate leak current of the semiconductor device illustrated in FIG. 1.

In the semiconductor device having the structure illustrated in FIG. 1, when a 0 V potential is applied to the gate electrode 931 and the drain electrode 933 is set to a high potential, a gate leak current $I_g$leak may flow as indicated by a dotted arrow in FIG. 1. This gate leak current $I_g$leak increases exponentially with an increase of a gate-drain voltage $V_{gd}$, as illustrated in FIG. 2. FIG. 2 is a diagram illustrating a correlation between the gate-drain voltage and the gate leak current of the semiconductor device illustrated in FIG. 1. More particularly, when the gate-drain voltage $V_{gd}$, which becomes a gate reverse voltage applied across the gate electrode 931 and the drain electrode 933, exceeds approximately 20 V, the gate leak current $I_g$leak sharply increases exponentially. For this reason, the gate-drain voltage $V_{gd}$ which exceeds approximately 20 V cannot be applied to the semiconductor device, and it is difficult to obtain a high output from the semiconductor device.

(Semiconductor Device)

Figure 3:
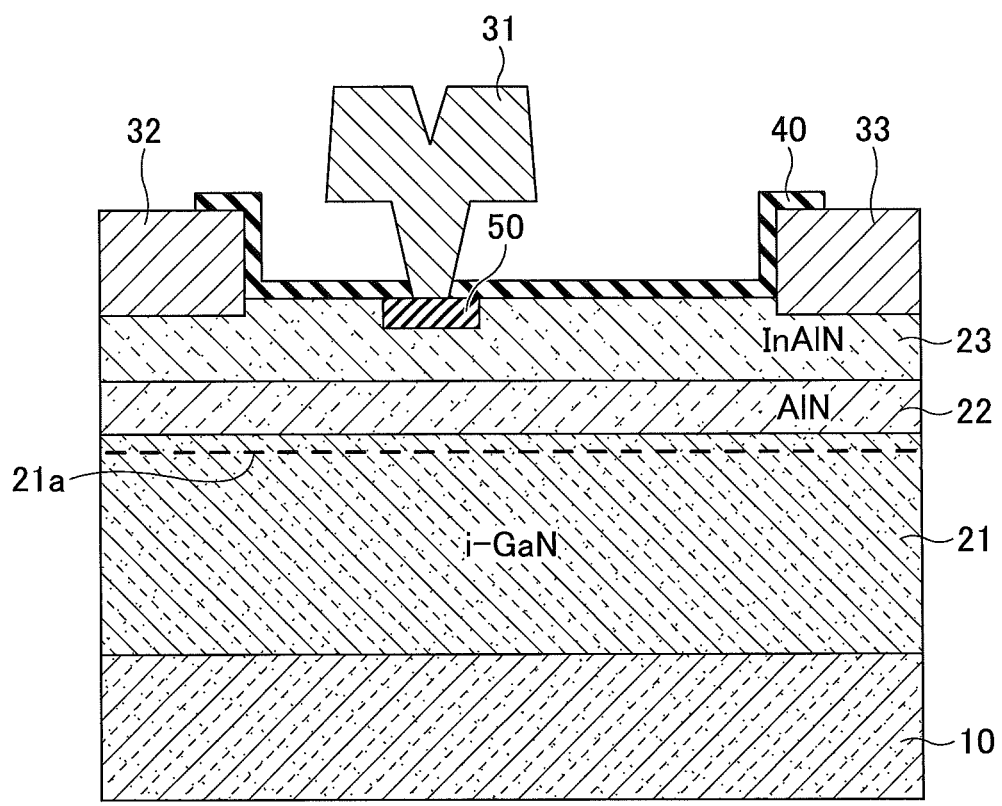
FIG. 3 is a structure diagram illustrating a semiconductor device in a first embodiment.

Next, a description will be given of a semiconductor device in a first embodiment, by referring to FIG. 3. FIG. 3 is a structure diagram illustrating the semiconductor device in the first embodiment. The semiconductor device illustrated in FIG. 3 includes a buffer layer (not illustrated), an i-GaN electron transit layer 21, an AlN intermediate layer 22, and an InAlN electron supply layer 23 that are stacked on a substrate 10. A source electrode 32 and a drain electrode 33 are provided on the electron supply layer 23, and a gate electrode 31 is provided on an insulator layer 50 that is provided on the electron supply layer 23 to form a gate insulator layer. A protection layer 40 made of SiN or the like is formed on an exposed region of the electron supply layer 23. In this embodiment, the substrate 10 is made of semi-insulating SiC, and a 2DEG 21a is generated in the electron transit layer 21 at a vicinity of an interface between the electron transit layer 21 and the intermediate layer 22. In this embodiment, the electron transit layer 21 may also be referred to as "a first semiconductor layer", the electron supply layer 23 may also be referred to as "a second semiconductor layer", and the intermediate layer 22 may also be referred to as "a third semiconductor layer".

The insulator layer 50 of the semiconductor device in this embodiment is formed by oxidizing the electron supply layer 23. By forming the insulator layer 50 under the gate electrode 31, it is possible to improve insulation directly under the gate electrode 31, reduce the gate leak current, and obtain a high output from the semiconductor device.

In this embodiment, the insulator layer 50 is formed by oxidizing a part of the electron supply layer 23. However, because the electron supply layer 23 is formed by InAlN, the insulator layer 50 includes $In_2O_3$ and $Al_2O_3$ that are formed when InAlN is oxidized. $In_2O_3$ has a narrow band gap and a poor capability of preventing the gate leak current. In addition, $In_2O_3$ is unstable, and inconsistencies or the like are likely to occur in properties thereof. Hence, $In_2O_3$ is not a preferable material for forming the insulator layer 50. On the other hand, $Al_2O_3$ has a wide band gap and is stable. Thus, $Al_2O_3$ is a preferable material for forming the insulator layer 50. Accordingly, in order to obtain a high insulation by the insulator layer 50, an $Al_2O_3$-content of the insulator layer 50 is preferably higher than an $In_2O_3$-content of the insulator layer 50. The insulator layer 50 of the semiconductor device in this embodiment includes more $Al_2O_3$ than $In_2O_3$. As a result, the gate leak current can be reduced, and generation of current collapse can be suppressed.

In this embodiment, the gate electrode 31 is a so-called T-shaped gate electrode having a T-shape. However, the gate electrode 31 is not limited to the T-shaped gate electrode, and other gate electrodes, such as an overhanging type gate electrode and a rectangular gate electrode, may be used for the gate electrode 31. In this embodiment, the insulator has a thickness of 1 nm or greater, preferably 5 nm or greater, and more preferably 1 nm or greater and 3 nm or less.

[Oxidation of InAlN]

Methods of oxidizing the nitride semiconductor, such as InAlN, or the like, include $H_2O$ oxidation using water vapor (or water vapor-assisted H2 oxidation), O plasma oxidation, a thermal oxidation using oxygen, or the like. In the thermal oxidation using oxygen, the temperature at the time of the oxidation is approximately 600° C. and relatively high, which is not preferable since the high temperature may damage the semiconductor device that is manufactured. In the $H_2O$ oxidation using water vapor and the O plasma oxidation, the temperature at the time of the oxidation is approximately 300° C. and relatively low, which enables the semiconductor device to be manufactured without being damaged.

Figure 4A:
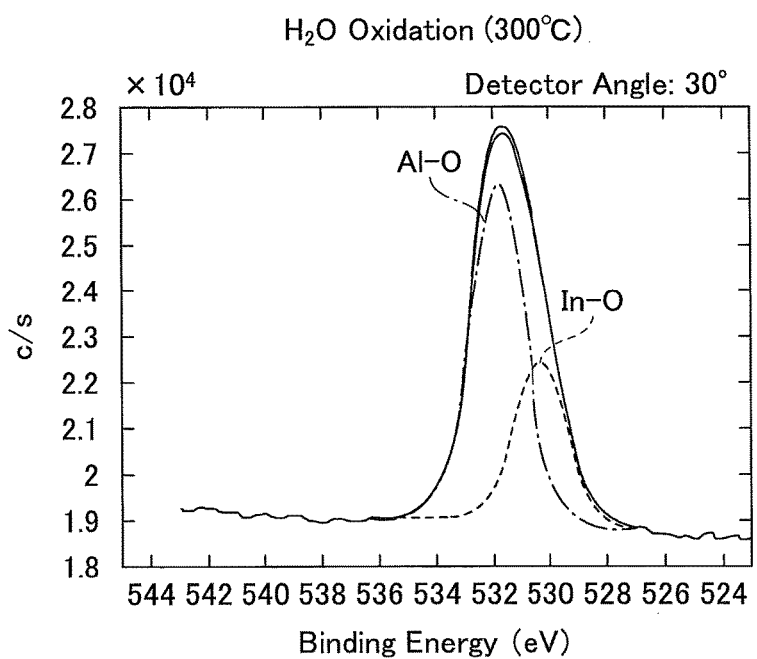
FIGS. 4A and 4B are diagrams illustrating analysis results of an insulator layer analyzed by XPS (X-ray Photoelectron Spectroscopy)
Figure 4B:
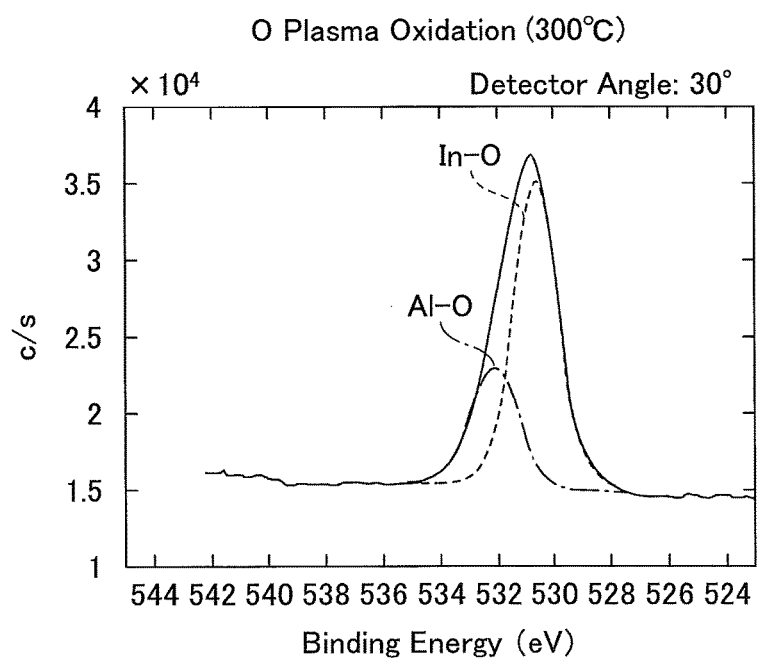

Next, a description will be given of analysis results of the insulator layer analyzed by XPS (X-ray Photoelectron Spectroscopy), by referring to FIGS. 4A and 4B. FIG. 4A illustrates the analysis results for a case in which the insulator layer analyzed by the XPS is an oxide obtained by subjecting InAlN to the $H_2O$ oxidation using water vapor, and FIG. 4B illustrates the analysis results for a case in which the insulator layer analyzed by the XPS is an oxide obtained by subjecting InAlN to the O plasma oxidation. The $H_2O$ oxidation of InAlN using water vapor and the O plasma oxidation of InAlN are both performed at 300° C.

As illustrated in FIG. 4A, in the oxide obtained by subjecting InAlN to the $H_2O$ oxidation using water vapor, more Al—O is observed than In—O. On the other hand, as illustrated in FIG. 4B, in the oxide obtained by subjecting InAlN to the O plasma oxidation, more In—O is observed than Al—O. Accordingly, the oxide obtained by subjecting InAlN to the $H_2O$ oxidation using water vapor includes more $Al_2O_3$ than the oxide obtained by subjecting InAlN to the O plasma oxidation. For this reason, the insulation can be improved by forming the insulator layer 50 by the $H_2O$ oxidation using water vapor, according to which more Al—O is observed than In—O, when compared to the O plasma oxidation.

Figure 5:
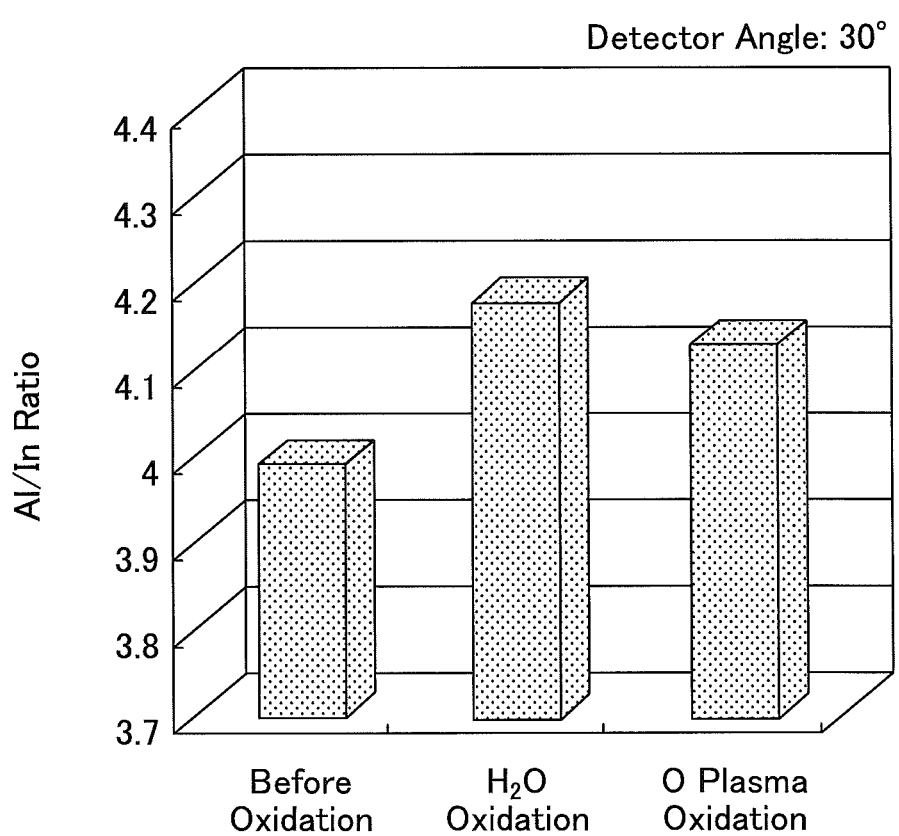
FIG. 5 is a diagram illustrating a correlation between oxidation methods and an Al/In ratio when forming the insulator layer.

FIG. 5 is a diagram illustrating a correlation between the oxidation methods and an Al/In ratio when forming the insulator layer. FIG. 5 illustrates the Al/In ratio of the Al-content with respect to the In-content in the InAlN before oxidation, the oxide obtained by oxidizing InAlN by the $H_2O$ oxidation using water vapor, and the oxide obtained by oxidizing InAlN by the O plasma oxidation. A composition of InAlN is $In_{17}Al_{83}N$. As illustrated in FIG. 5, the Al/In ratio becomes high when InAlN is subjected to the $H_2O$ oxidation using water vapor and also when InAlN is subjected to the O plasma oxidation. In addition, the Al/In ratio is higher for the case in which InAlN is subjected to the $H_2O$ oxidation using water vapor, when compared to the case in which InAlN is subjected to the O plasma oxidation. In other words, the In-content in the oxide obtained by oxidizing InAlN by the $H_2O$ oxidation using water vapor is reduced compared to the oxide obtained by oxidizing InAlN by the O plasma oxidation.

($H_2O$ Oxidation Using Water Vapor)

Next, a description will be given on why the Al/In ratio becomes high in the case in which InAlN is subjected to the H₂O oxidation using water vapor, when compared to the case in which InAlN is subjected to the O plasma oxidation.

In the following, a formula (1) represents a chemical reaction formula for a case in which Al is oxidized by the H₂O oxidation using water vapor. Formulas (2) and (3) represent chemical reaction formulas during reaction processes of the chemical reaction formula (1). In addition, a formula (4) represents a chemical reaction formula for a case in which In is oxidized by the H₂O oxidation using water vapor. Formulas (5) and (6) represent chemical reaction formulas during reaction processes of the chemical reaction formula (4).

$$2Al+6H_2O \rightarrow Al_2O_3+3H_2O+3H_2-845 \text{ kJ/mol} \quad (1)$$

$$2Al+6H_2O \rightarrow 2Al(OH)_3+3H_2 \quad (2)$$

$$2Al(OH)_3 \rightarrow Al_2O_3+3H_2O \quad (3)$$

$$2In+6H_2O \rightarrow In_2O_3+3H_2O+3H_2-91 \text{ kJ/mol} \quad (4)$$

$$2In+6H_2O \rightarrow 2In_2(OH)_3+3H_2 \quad (5)$$

$$2In(OH)_3 \rightarrow In_2O_3+H_2O \quad (6)$$

As represented by the formula (1), $Al_2O_3$ is generated by oxidizing Al included in InAlN by the H₂O oxidation using water vapor. This reaction first generates $Al(OH)_3$ by oxidizing Al included in InAlN by the H₂O oxidation using water vapor, as represented by the formula (2), and thereafter generates $Al_2O_3$ from $Al(OH)_3$ via a dehydration reaction, as represented by the formula (3).

In addition, as represented by the formula (4), $In_2O_3$ is generated by oxidizing In included in InAlN by the H₂O oxidation using water vapor. This reaction first generates $In(OH)_3$ by oxidizing In included in InAlN by the H₂O oxidation using water vapor, as represented by the formula (5), and thereafter generates $In_2O_3$ from $In(OH)_3$ via a dehydration reaction, as represented by the formula (6).

Accordingly, in the case in which InAlN is subjected to the H₂O oxidation using water vapor, hydroxide is generated, and thereafter, the oxide is generated from the hydroxide via the dehydration reaction.

$Al(OH)_3$ generated in the formula (2) is a solid, however, $In(OH)_3$ generated in the formula (5) has an unstable solid phase and easily vaporizes. Accordingly, in the process of oxidizing InAlN by the H₂O oxidation using water vapor, a part of In vaporizes, to thereby reduce the In-content of the oxide that is obtained by oxidizing InAlN by the H₂O oxidation using water vapor. As a result, the Al/In ratio becomes high.

On the other hand, in the case in which InAlN is oxidized by the O plasma oxidation, no $In(OH)_3$ is generated, and thus, a large amount of In remains within the oxide without being vaporized or the like. It may be regarded, for this reason, that the Al/In ratio of the oxide that is obtained by oxidizing InAlN by the H₂O oxidation using water vapor is high compared to that of the oxide that is obtained by oxidizing InAlN by the O plasma oxidation.

In this embodiment, the substrate or the like is heated when oxidizing InAlN by the H₂O oxidation using water vapor. In order to smoothly perform the oxidation without damaging the nitride semiconductor layer by this heating, the heating is preferably performed to a temperature of 150° C. or higher and 550° C. or lower, and more preferably performed to a temperature of 200° C. or higher and 400° C. or lower.

(Properties of Semiconductor Device)

Figure 6:
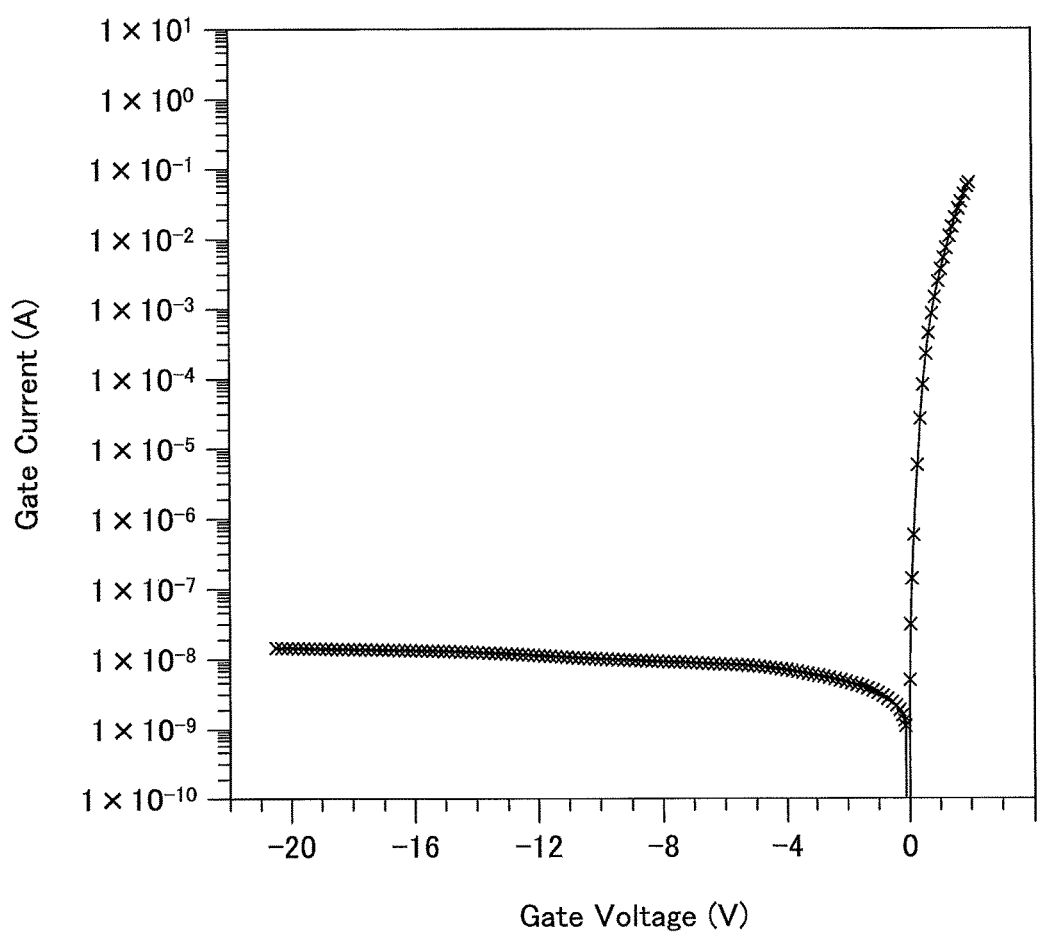
FIG. 6 is a diagram illustrating a correlation between a gate voltage and the gate leak current of the semiconductor device in the first embodiment.
Figure 7:
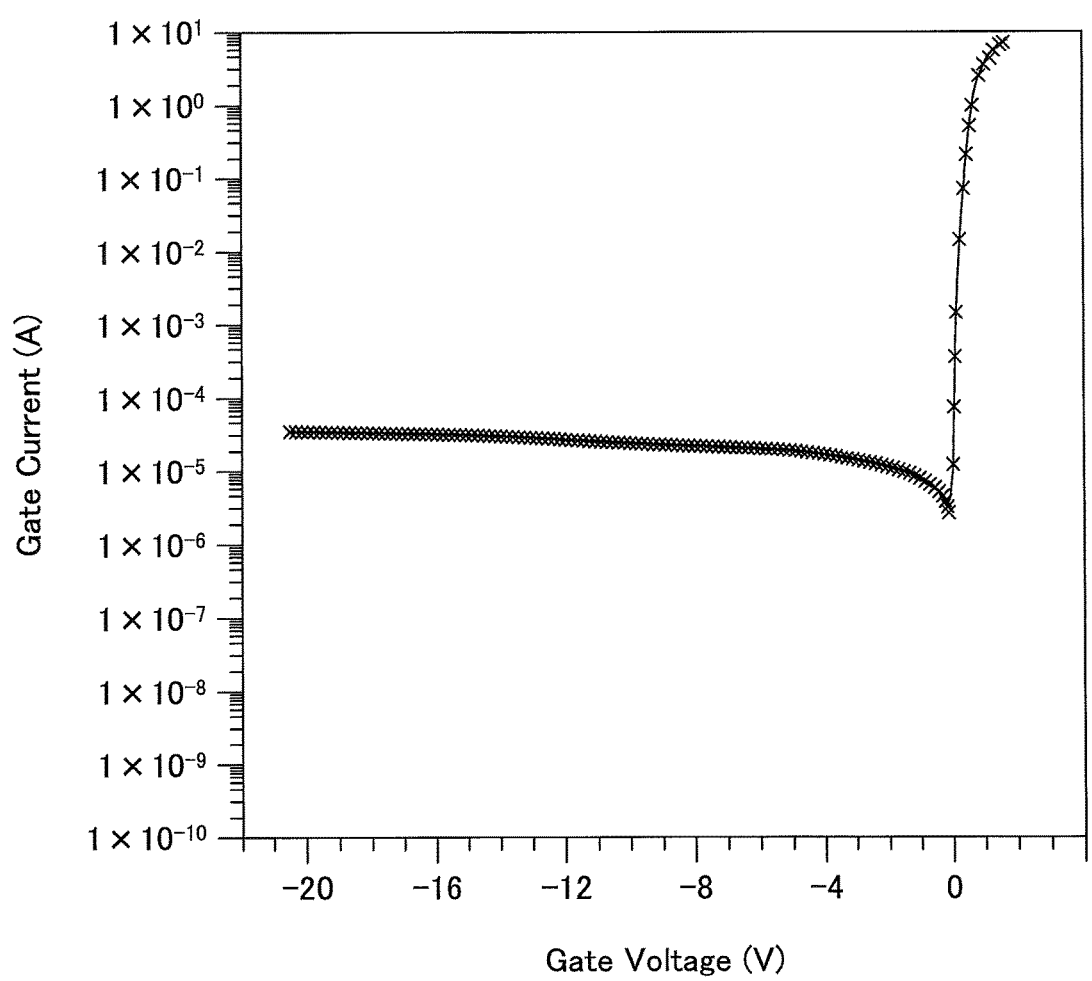
FIG. 7 is a diagram illustrating a correlation between the gate voltage and the gate leak current of the semiconductor device illustrated in FIG. 1.

Next, a description will be given of the properties of the semiconductor device in this embodiment, by referring to FIGS. 6 and 7. FIGS. 6 and 7 illustrate properties of the current value of the gate leak current that flows in a case in which the potential of the source electrode or the drain electrode is 0 V and the potential of the gate electrode is varied. FIG. 6 is a diagram illustrating a correlation between the gate voltage and the gate leak current of the semiconductor device in this embodiment. FIG. 7 is a diagram illustrating a correlation between the gate voltage and the gate leak current of the semiconductor device illustrated in FIG. 1. As illustrated in FIGS. 6 and 7, the gate leak current of the semiconductor device in this embodiment can be reduced by 3 or more digits compared to that of the semiconductor device illustrated in FIG. 1. In other words, the gate leak current of the semiconductor device can be reduced compared to the semiconductor device illustrated in FIG. 1. The gate leak current of the semiconductor device in this embodiment can be reduced, because the insulator layer 50 is provided directly under the gate electrode 31.

(Method of Manufacturing Semiconductor Device)

Next, a description will be given of the method of manufacturing the semiconductor device in the first embodiment, by referring to FIGS. 8A through 13C. FIGS. 8A through 13C are diagrams for explaining processes of the method of manufacturing the semiconductor device in this embodiment.

Figure 8A:
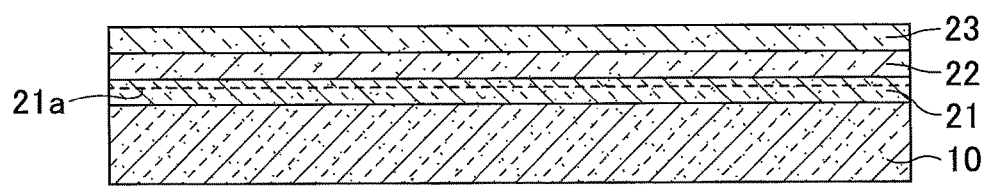
FIGS. 8A, 8B, and 8C are diagrams for explaining processes of a method of manufacturing the semiconductor device in the first embodiment.

First, as illustrated in FIG. 8A, the buffer layer (not illustrated), the electron transit layer 21, the intermediate layer 22, and the electron supply layer 23 are expitaxially grown on the substrate 10 by MOVPE (Metal Organic Vapor Phase Epitaxy) and successively stacked. In this embodiment, each of the buffer layer (not illustrated), the electron transit layer 21, the intermediate layer 22, and the electron supply layer 23 may also be referred to as "a nitride semiconductor layer". The electron transit layer 21 is formed by i-GaN to a thickness of approximately 3 μm, the intermediate layer 22 is formed by i-AlN to a thickness of approximately 1 nm, and the electron supply layer 23 is formed by i-In$_{0.17}$Al$_{0.83}$N to a thickness of approximately 10 nm. Hence, the 2DEG 21a is generated in the electron transit layer 21 at the vicinity of the interface between the electron transit layer 21 and the intermediate layer 22. The substrate 10 is formed by semi-insulating SiC, and the buffer layer (not illustrated) is formed by GaN, AlGaN, or the like.

Figure 8B:
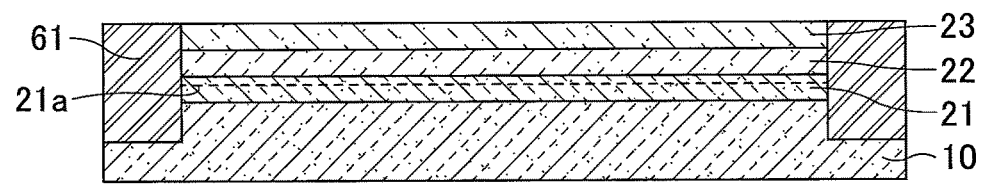

Next, as illustrated in FIG. 8B, an isolation region 61 is formed in the nitride semiconductor layers that are formed on the substrate 10. More particularly, a photoresist is coated on the electron supply layer 23, and a resist pattern (not illustrated), having an opening in a region where the isolation region 61 is to be formed, is formed by exposing the photoresist by an exposure apparatus and developing the exposed photoresist. Thereafter, Ar ions or the like are injected into the nitride semiconductor layers within the opening of the resist pattern, in order to form the isolation region 61. When forming the isolation region 61, the Ar ions or the like may be injected into a part of the substrate 10. The resist pattern is thereafter removed using an organic solvent or the like.

Figure 8C:
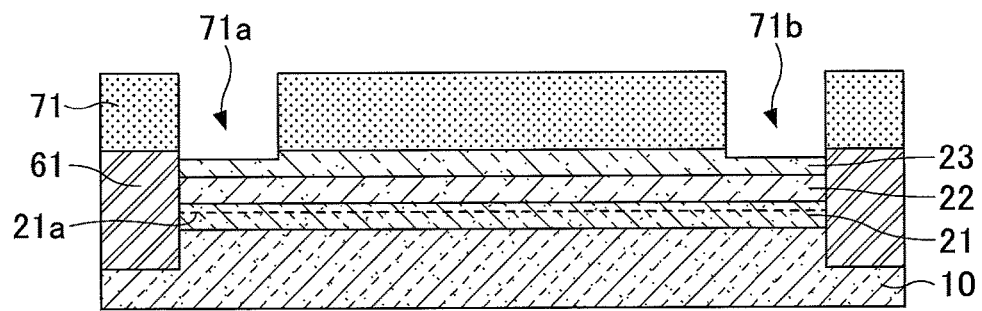

Next, as illustrated in FIG. 8C, a resist pattern 71, having openings 71a and 71b in regions where the source electrode 32 and the drain electrode 33 are to be formed, is formed on the electron supply layer 23, and then, a part at the surface of the electron supply layer 23 is removed within the openings 71a and 71b. More particularly, a photoresist is coated on the electron supply layer 23, and the resist pattern 71, having the openings 71a and 71b in the regions where the source electrode 32 and the drain electrode 33 are to be formed, is formed by exposing the photoresist by the exposure apparatus and developing the exposed photoresist. Thereafter, the part at the surface of the electron supply layer 23, exposed within the openings 71a and 71b of the resist pattern 71 and not covered by the photoresist of the resist pattern 71, is removed by RIE (Reactive Ion Etching) or the like. The RIE may use, as an etching gas, a gas including a chlorine component.

Figure 9A:
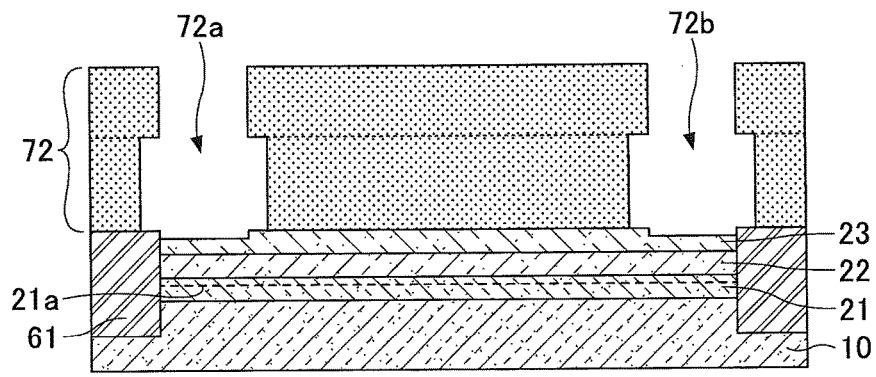
FIGS. 9A, 9B, and 9C are diagrams for explaining processes of the method of manufacturing the semiconductor device in the first embodiment.

Next, as illustrated in FIG. 9A, the resist pattern 71 is removed using an organic solvent or the like, to form a resist pattern 72 having openings 72a and 72b in the regions where the source electrode 32 and the drain electrode 33 are to be formed. More particularly, after removing the resist pattern 71 using the organic solvent or the like, a photoresist is again coated on the electron supply layer 23, and the photoresist is exposed by the exposure apparatus and developed. Hence, the resist pattern 72, having the openings 72a and 72b in the regions where the source electrode 32 and the drain electrode 33 are to be formed, is formed. As illustrated in FIG. 9A, the resist pattern 72 is formed by stacking 2 resist layers.

Figure 9B:
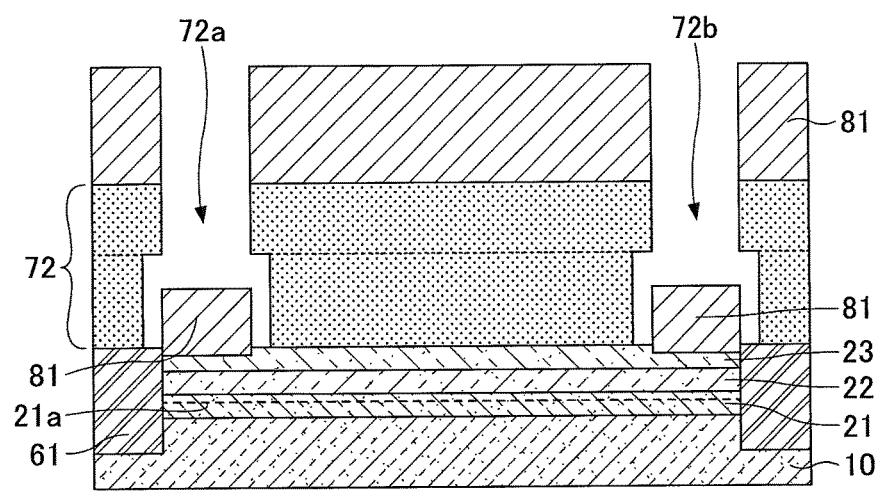

Next, as illustrated in FIG. 9B, a metal multilayer 81 made of Ti/Al is deposited on the surface of the stacked structure formed with the resist pattern 72, by vacuum deposition. More particularly, a Ti layer is deposited on the surface of the stacked structure formed with the resist pattern 72, by vacuum deposition, and an Al layer is thereafter deposited on the Ti layer by vacuum deposition. In this embodiment, the Ti layer is deposited to a thickness of approximately 20 nm, and the Al layer is deposited to a thickness of approximately 200 nm.

Figure 9C:
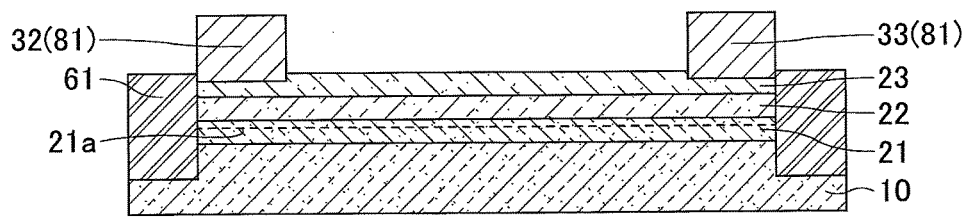

Next, as illustrated in FIG. 9C, the metal multilayer 81 formed on the resist pattern 72 is removed together with the resist pattern 72 by lift-off, by dipping the stacked structure in an organic solvent or the like. As a result, the source electrode 32 and the drain electrode 33 are formed by the metal multilayer 81 remaining within the regions where the openings 72a and 72b of the resist pattern 72 were formed. Thereafter, a thermal process is performed at a temperature of 550° C., in order to establish an ohmic contact between the electron supply layer 23 and each of the source electrode 32 and the drain electrode 33.

Figure 10A:
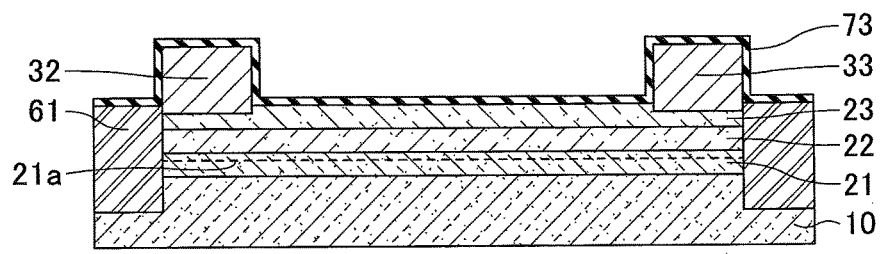
FIGS. 10A, 10B, and 10C are diagrams for explaining processes of the method of manufacturing the semiconductor device in the first embodiment.

Next, as illustrated in FIG. 10A, an insulator layer (hereinafter also referred to as "a hard mask insulator layer") 73 for forming a hard mask which will be described later is formed on the electron supply layer 23, the source electrode 32, and the drain electrode 33. More particularly, an SiN layer having a thickness of approximately 20 nm is deposited on the electron supply layer 23, the source electrode 32, and the drain electrode 33 by plasma CVD (Chemical Vapor Deposition), to form the hard mask insulator layer 73. When forming the hard mask insulator layer 73 by the plasma CVD, silane, ammonia, or the like may be used for a source gas, for example. A refractive index of the hard mask insulator layer 73 at a wavelength of 633 nm is 2.0, and the hard mask insulator layer 73 is a stoichiometric layer.

Figure 10B:
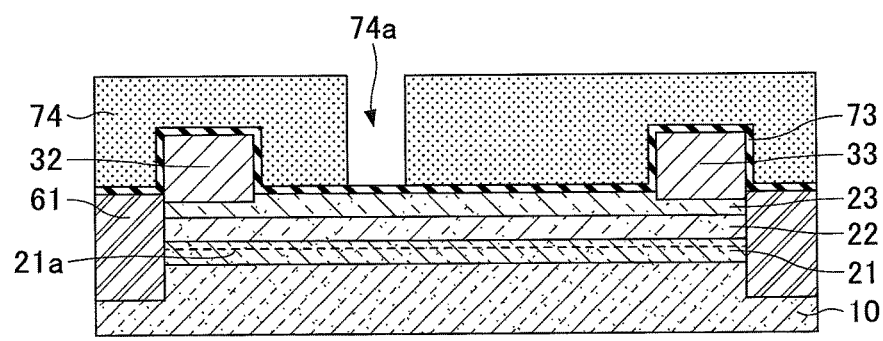

Next, as illustrated in FIG. 10B, a resist pattern 74 having an opening 74a is formed on the hard mask insulator layer 73. More particularly, a photoresist is coated on the hard mask insulator layer 73, and the resist pattern 74 having the opening 74a is formed by exposing the photoresist by the exposure apparatus and developing the exposed photoresist. The opening 74a of the resist pattern 74 has a width of approximately 0.5 µm, and has a size identical to the size of the insulator layer 50 that is formed by oxidizing the electron supply layer 23, as will be described later in the specification.

Figure 10C:
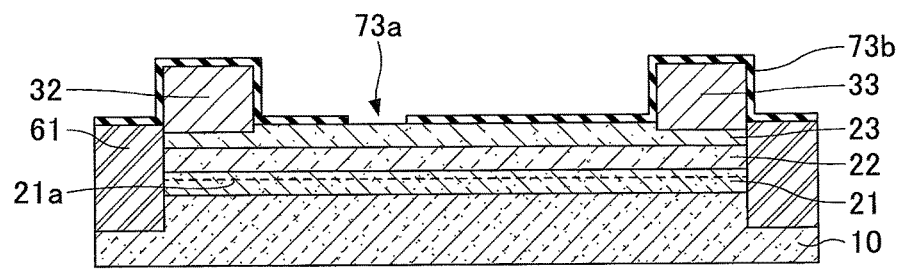

Next, as illustrated in FIG. 10C, an opening 73a is formed by removing the hard mask insulator layer 73 exposed within the opening 74a of the resist pattern 74 by RIE or the like. As a result, a hard mask 73b having the opening 73a is formed by the remaining hard mask insulator layer 73. The resist pattern 74 is thereafter removed using an organic solvent or the like.

Figure 11A:
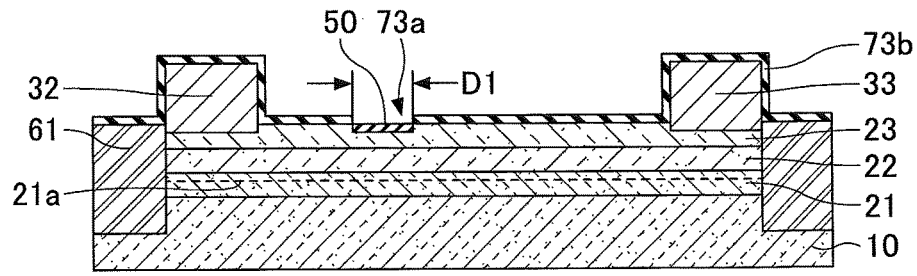
FIGS. 11A, 11B, and 11C are diagrams for explaining processes of the method of manufacturing the semiconductor device in the first embodiment.

Next, as illustrated in FIG. 11A, the insulator layer 50 is formed by oxidizing the surface of the electron supply layer 23 exposed within the opening 73a of the hard mask 73b, by the $H_2O$ oxidation using water vapor. More particularly, an ALD (Atomic Layer Deposition) apparatus is used to form the insulator layer 50 by setting the substrate temperature to 300° C., supplying water vapor ($H_2O$) which becomes an oxidation source, and oxidizing the surface of the electron supply layer 23 exposed within the opening 73a of the hard mask 73b. The insulator layer 50 that is formed in this manner has a thickness of approximately 3 nm, and a width D1 of approximately 0.5 µm.

Figure 11B:
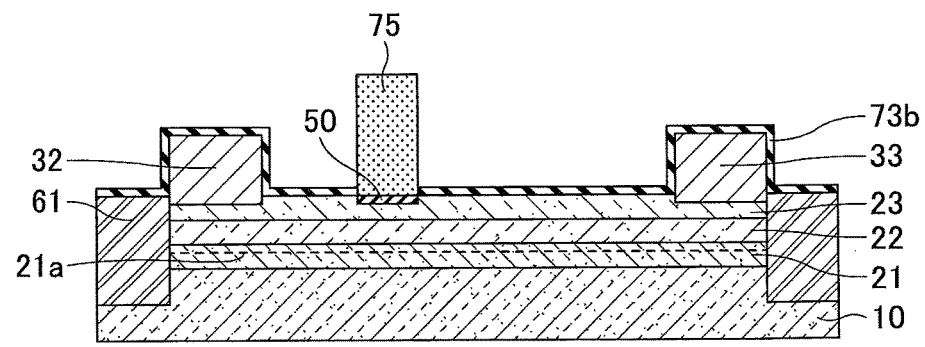

Next, as illustrated in FIG. 11B, a resist pattern 75 is formed on the insulator layer 50. More particularly, a photoresist is formed on the electron supply layer 23, the insulator layer 50, the source electrode 32, and the drain electrode 33, and the resist pattern 75 is formed by exposing the photoresist by the exposure apparatus and developing the exposure photoresist.

Figure 11C:
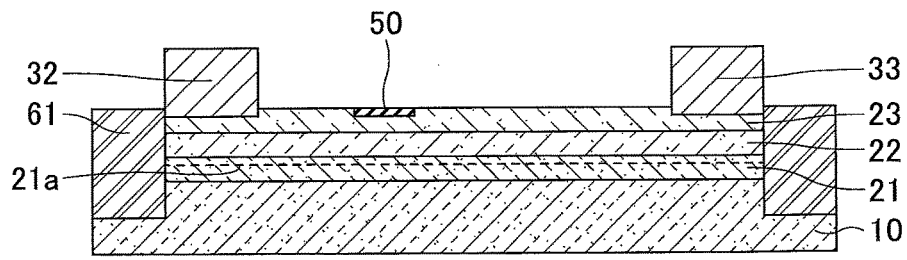

Next, as illustrated in FIG. 11C, the hard mask 73b in regions where no resist pattern 75 is formed is removed using a buffered hydrogen fluoride or the like. Thereafter, the resist pattern 75 is removed using an organic solvent or the like.

Figure 12A:
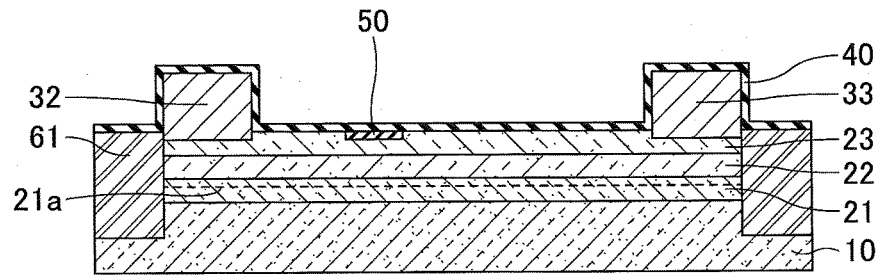
FIGS. 12A, 12B, and 12C are diagrams for explaining processes of the method of manufacturing the semiconductor device in the first embodiment.

Next, as illustrated in FIG. 12A, a protection layer 40, which becomes a passivation layer, is formed on the electron supply layer 23, the insulator layer 50, the source electrode 32, and the drain electrode 33. More particularly, an SiN layer having a thickness of approximately 50 nm is deposited on the electron supply layer 23, the insulator layer 50, the source electrode 32, and the drain electrode 33 by plasma CVD, to form the protection layer 40 that becomes the passivation layer. When forming the protection layer 40 by the plasma CVD, silane, ammonia, or the like may be used for a source gas, for example. A refractive index of the protection layer 40 at the wavelength of 633 nm is 2.0, and the protection layer 40 is a stoichiometric layer. In this embodiment, after performing the process illustrated in FIG. 11A, the process illustrated in FIG. 12A may be performed by omitting the processes illustrated in FIGS. 11B and 11C. In this case, the SiN protection layer 40 is formed on the SiN hard mask 73b, the insulator layer 50, the source electrode 32, and the drain electrode 33.

Figure 12B:
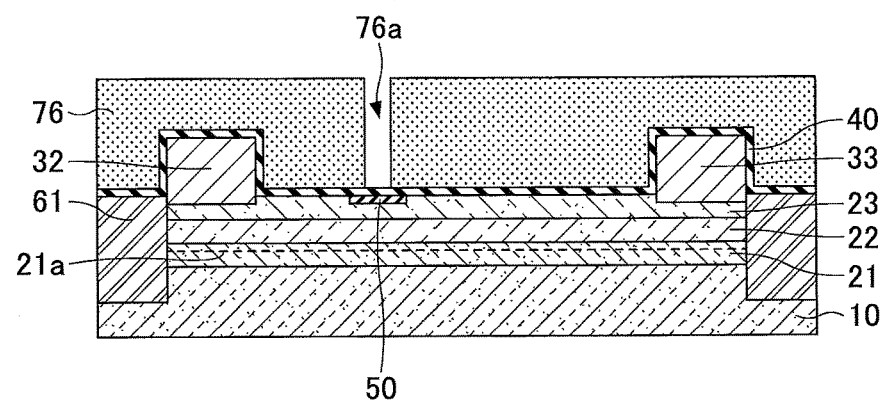

Next, as illustrated in FIG. 12B, a resist pattern 76 having an opening 76a is formed on the protection layer 40. More particularly, an electron beam resist is coated on the protection layer 40, and the resist pattern 76 having the opening 76a is formed by exposing the electron beam resist by an electron beam lithography apparatus and developing the exposed electron beam resist. The opening 76a of the resist pattern 76 that is formed in this manner corresponds to a region where the gate electrode 31 is to be formed, as will be described later, and has a width of approximately 0.15 µm.

Figure 12C:
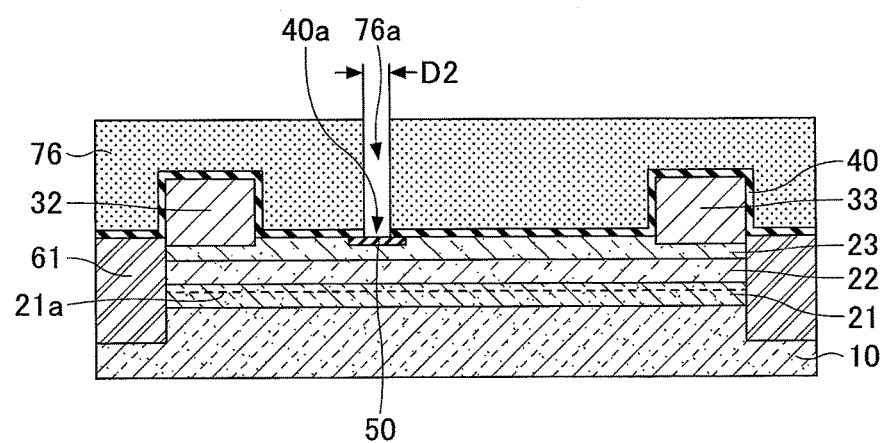

Next, as illustrated in FIG. 12C, the protection layer 40 within the opening 76a of the resist pattern 76 is removed, in order to form an opening 40a in the region where the gate electrode 31 is to be formed. More particularly, the protection layer 40 within the opening 76a of the resist pattern 76 is removed by a dry etching using $SF_6$ as an etching gas, or the like, in order to form the opening 40a in the protection layer 40. This opening 40a is formed to correspond to the region where the gate electrode 31 is to be formed, and has a width D2 of approximately 0.15 µm.

Figure 13A:
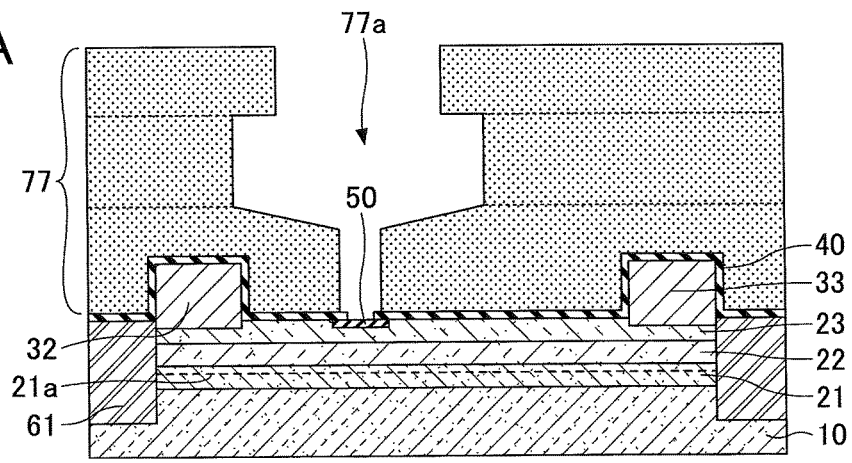
FIGS. 13A, 13B, and 13C are diagrams for explaining processes of the method of manufacturing the semiconductor device in the first embodiment.

Next, as illustrated in FIG. 13A, after removing the resist pattern 76 by an organic solvent or the like, a resist pattern 77 for forming the gate electrode 31 is formed on the protection layer 40. This resist pattern 77 is formed by 3 electron beam resist layers that are stacked, and has an opening 77a in the region where the gate electrode 31 is to be formed. More particularly, the 3 electron beam resist layers are successively formed on the protection layer 40 by repeatedly coating the same, for example. In addition, exposing the electron beam resist by the electron beam lithography apparatus and developing the exposed electron beam resist are repeated for each of the 3 electron beam resist layers, in order to form the opening 77a in the 3 electron beam resist layers. As a result, the opening 77a is formed in the resist pattern 77. The opening 77a of the resist pattern 77 is formed to have a width of 0.8 µm, 1.3 µm, and 0.2 µm for the top, middle, and bottom electron beam resist layers forming the 3 electron beam resist layers.

Figure 13B:
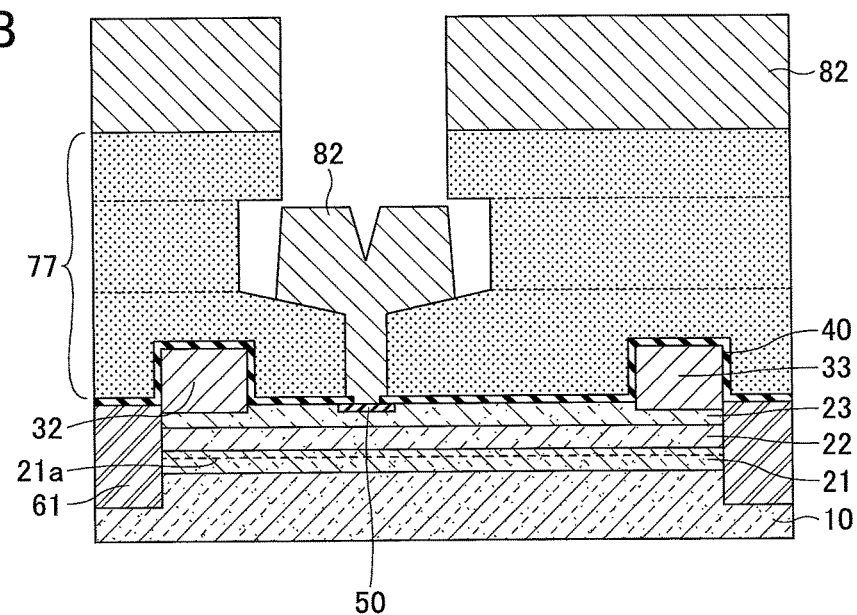

Next, as illustrated in FIG. 13B, a metal multilayer 82 made of Ni/Au is deposited on the surface of the stacked structure formed with the resist pattern 77, by vacuum deposition. More particularly, an Ni layer is deposited on the surface of the stacked structure formed with the resist pattern 77, by vacuum deposition, and an Au layer is thereafter deposited on the Ni layer by vacuum deposition. In this embodiment, the Ni layer is deposited to a thickness of approximately 10 nm, and the Au layer is deposited to a thickness of approximately 300 nm.

Figure 13C:
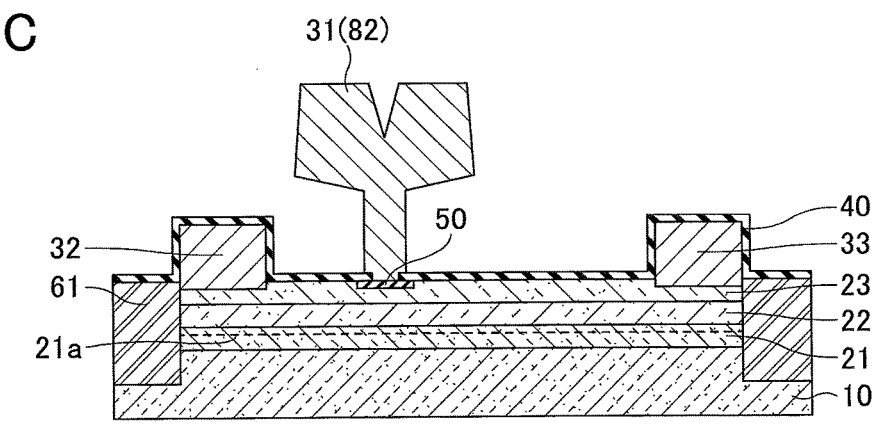

Next, as illustrated in FIG. 13C, the metal multilayer 82 formed on the resist pattern 77 is removed together with the resist pattern 77 by lift-off, by dipping the stacked structure in an organic solvent or the like. As a result, the gate electrode 31 is formed by the metal multilayer 82 remaining within the region where the opening 77a of the resist pattern 77 was formed.

The semiconductor device in this embodiment is manufactured by the processes described above.

Second Embodiment (Semiconductor Device)

Figure 14:
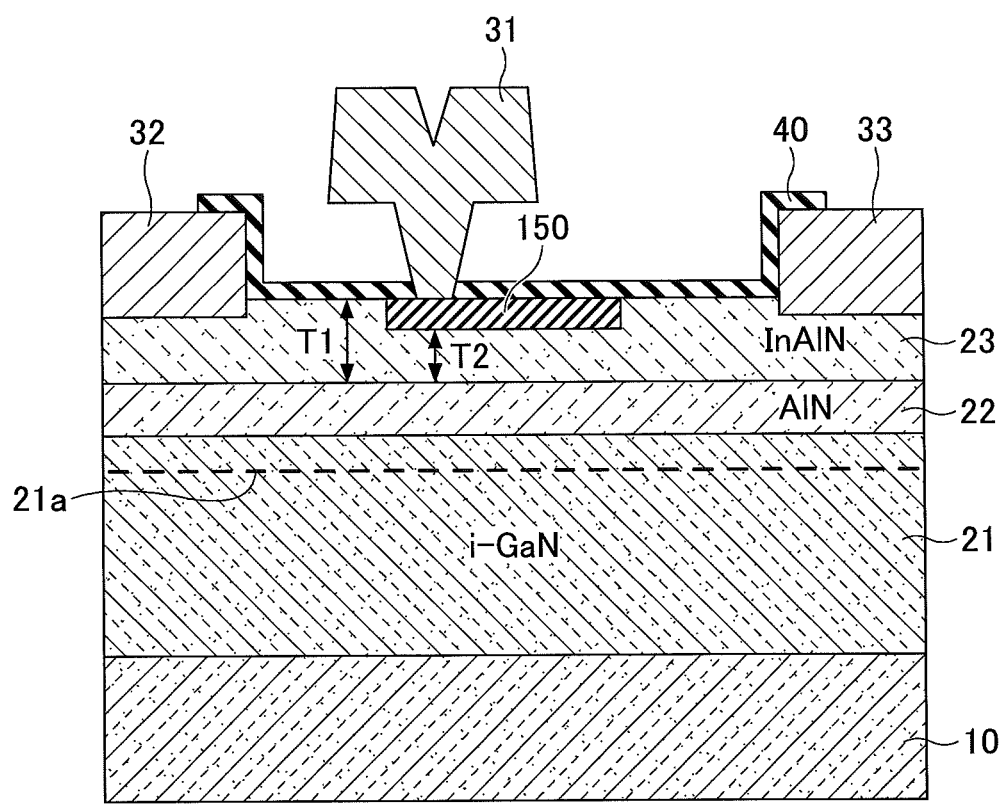
FIG. 14 is a structure diagram illustrating the semiconductor device in a second embodiment.

Next, a description will be given of the semiconductor device in a second embodiment, by referring to FIG. 14. FIG. 14 is a structure diagram illustrating the semiconductor device in the second embodiment. The semiconductor device illustrated in FIG. 14 includes a buffer layer (not illustrated), an i-GaN electron transit layer 21, an AlN intermediate layer 22, and an InAlN electron supply layer 23 that are stacked on a substrate 10. A source electrode 32 and a drain electrode 33 are provided on the electron supply layer 23, and a gate electrode 31 is provided on an insulator layer 150 that is provided on the electron supply layer 23 to form a gate insulator layer, at a position closer to the source electrode 32 than the drain electrode 33. A protection layer 40 made of SiN or the like is formed on the exposed region of the electron supply layer 23. In this embodiment, the substrate 10 is made of semi-insulating SiC, and a 2DEG 21a is generated in the electron transit layer 21 at the vicinity of the interface between the electron transit layer 21 and the intermediate layer 22.

The insulator layer 150 of the semiconductor device in this embodiment is formed by oxidizing the electron supply layer 23. The insulator layer 150 is not only formed in a region directly under the gate electrode 31, but is also formed in a region from the region directly under the gate electrode 31 to an intermediate part between the gate electrode 31 and the drain electrode 33. Hence, it is possible to further improve the insulation provided by the insulator layer 150, and obtain a high output from the semiconductor device.

Because the insulator layer 150 is formed by oxidizing the electron supply layer 23, thickness of the electron supply layer 23 in the region where the insulator layer 150 is formed is smaller than the thickness of the electron supply layer 23 in the region where no insulator layer 150 is formed. When the thickness of the electron supply layer 23 becomes smaller in the region where the insulator layer 150 is formed, the 2DEG 21a directly under this region decreases. In the case of the semiconductor device in this embodiment having the electron transit layer 21 formed by i-GaN and the electron supply layer 23 formed by InAlN, the 2DEG 21a having a high concentration is generated in the electron transit layer 21 at the vicinity of the interface between the electron transit layer 21 and the intermediate layer 22. In the case in which the 2DEG 21a in the electron transit layer 21 has the high concentration, it is possible to increase the drain current, however, a gate breakdown voltage and an off-state breakdown voltage decrease.

Accordingly, in this embodiment, the insulator layer 150 is formed in the region from the gate electrode 31 to the intermediate part between the gate electrode 31 and the drain electrode 33, in order to reduce the thickness of the electron supply layer 23 in the region where the insulator layer 150 is formed, and decrease the density of the 2DEG 21a that is generated. By decreasing the density of the 2DEG 21a directly under the region from the gate electrode 31 to the intermediate part between the gate electrode 31 and the drain electrode 33, it becomes possible to improve the gate breakdown voltage and the off-state breakdown voltage, and obtain the high output from the semiconductor device. In addition, as illustrated in FIG. 15, a depletion layer region 151 can be extended to a desired region, in order to improve a high-frequency response of the semiconductor device.

Figures 15, 16:
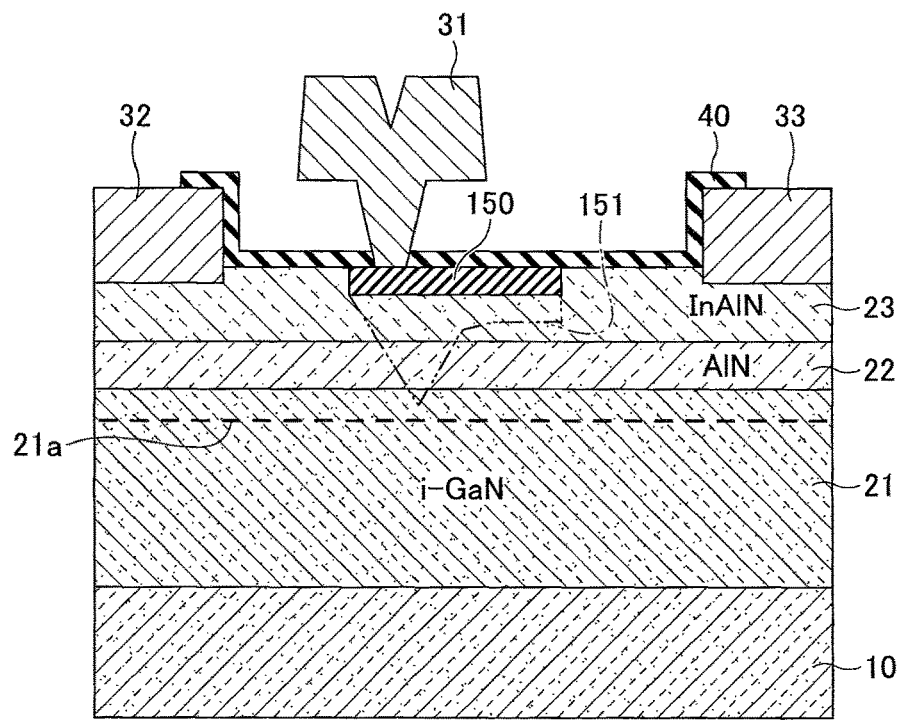
FIG. 15 is a diagram for explaining the semiconductor device in the second embodiment.
FIG. 16 is a diagram for explaining properties of the semiconductor devices in the first embodiment and the second embodiment.

FIG. 15 is a diagram for explaining the semiconductor device in the second embodiment. In FIG. 15, a two-dot chain line indicates a spread of the depletion layer region 151 when a voltage is applied to the gate electrode 31. As illustrated in FIG. 15, the depletion layer region 151 can easily be extended between the gate electrode 31 and the drain electrode 33, to the region in which the 2DEG 21a is generated.

In this embodiment, a thickness T1 of the electron supply layer 23 in the region where no insulator layer 150 is formed is 10 nm, and in a case in which the thickness of the insulator layer 150 is 3 nm, a thickness T2 of the electron supply layer 23 in the region where the insulator layer 150 is formed is 7 nm.

(Properties of Semiconductor Device)

Next, a description will be given of properties of the semiconductor device in the first embodiment and the semiconductor device in the second embodiment, by referring to FIG. 16. FIG. 16 is a diagram for explaining the properties of the semiconductor devices in the first embodiment and the second embodiment. As illustrated in FIG. 16, a gate-source capacitance $C_{gs}$ is 500 (fF/mm) and the same for the semiconductor device in the first embodiment and the semiconductor device in the second embodiment. In addition, a drain-source capacitance $C_{ds}$ is 150 (fF/mm) and the same for the semiconductor device in the first embodiment and the semiconductor device in the second embodiment.

On the other hand, a gate-drain capacitance $C_{gd}$ is 130 (fF/mm) for the semiconductor device in the first embodiment, but is 110 (fF/mm) for the semiconductor device in the second embodiment. In other words, the gate-drain capacitance $C_{gd}$ of the semiconductor device in the second embodiment is lower than that of the semiconductor device in the first embodiment.

In addition, a maximum transmission frequency $f_{max}$ is 240 (GHz) for the semiconductor device in the first embodiment, but is 270 (GHz) for the semiconductor device in the second embodiment. In other words, the maximum transmission frequency $f_{max}$ of the semiconductor device in the second embodiment is higher than that of the semiconductor device in the first embodiment. Accordingly, the frequency response of the semiconductor device in the second embodiment can further be improved compared to that of the semiconductor device in the first embodiment.

(Method of Manufacturing Semiconductor Device)

Next, a description will be given of the method of manufacturing the semiconductor device in the second embodiment, by referring to FIGS. 17A through 22C. FIGS. 17A through 22C are diagrams for explaining processes of the method of manufacturing the semiconductor device in this embodiment.

Figure 17A:
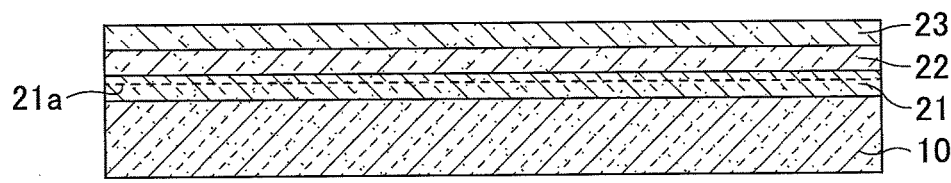
FIGS. 17A, 17B, and 17C are diagrams for explaining processes of the method of manufacturing the semiconductor device in the second embodiment.

First, as illustrated in FIG. 17A, the buffer layer (not illustrated), the electron transit layer 21, the intermediate layer 22, and the electron supply layer 23 are expitaxially grown on the substrate 10 by MOVPE and successively stacked. In this embodiment, each of the buffer layer (not illustrated), the electron transit layer 21, the intermediate layer 22, and the electron supply layer 23 may also be referred to as "a nitride semiconductor layer". The electron transit layer 21 is formed by i-GaN to a thickness of approximately 3 μm, the intermediate layer 22 is formed by i-AlN to a thickness of approximately 1 nm, and the electron supply layer 23 is formed by i-In$_{0.17}$Al$_{0.83}$N to a thickness of approximately 10 nm. Hence, the 2DEG 21a is generated in the electron transit layer 21 at the vicinity of the interface between the electron transit layer 21 and the intermediate layer 22. The substrate 10 is formed by semi-insulating SiC, and the buffer layer (not illustrated) is formed by GaN, AlGaN, or the like.

Figure 17B:
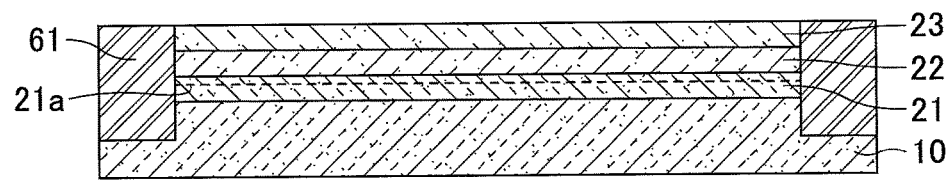

Next, as illustrated in FIG. 17B, an isolation region 61 is formed in the nitride semiconductor layers that are formed on the substrate 10. More particularly, a photoresist is coated on the electron supply layer 23, and a resist pattern (not illustrated), having an opening in a region where the isolation region 61 is to be formed, is formed by exposing the photoresist by the exposure apparatus and developing the exposed photoresist. Thereafter, Ar ions or the like are injected into the nitride semiconductor layers within the opening of the resist pattern, in order to form the isolation region 61. When forming the isolation region 61, the Ar ions or the like may be injected into a part of the substrate 10. The resist pattern is thereafter removed using an organic solvent or the like.

Figure 17C:
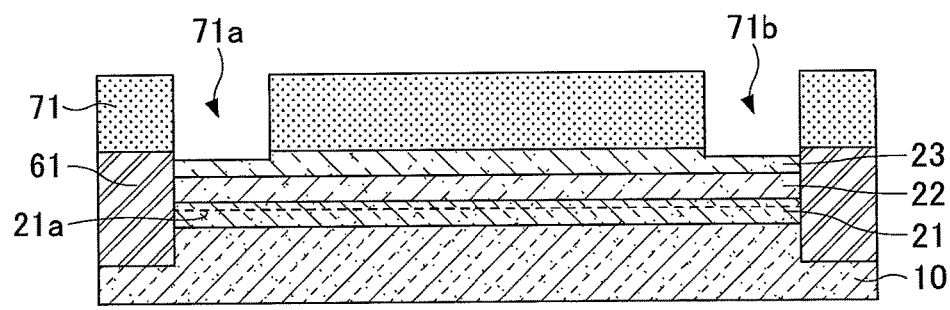

Next, as illustrated in FIG. 17C, a resist pattern 71, having openings 71a and 71b in regions where the source electrode 32 and the drain electrode 33 are to be formed, is formed on the electron supply layer 23, and then, a part at the surface of the electron supply layer 23 is removed within the openings 71a and 71b. More particularly, a photoresist is coated on the electron supply layer 23, and the resist pattern 71, having the openings 71a and 71b in the regions where the source electrode 32 and the drain electrode 33 are to be formed, is formed by exposing the photoresist by the exposure apparatus and developing the exposed photoresist. Thereafter, the part at the surface of the electron supply layer 23, exposed within the openings 71a and 71b of the resist pattern 71 and not covered by the photoresist of the resist pattern 71, is removed by RIE or the like. The RIE may use, as an etching gas, a gas including a chlorine component.

Figure 18A:
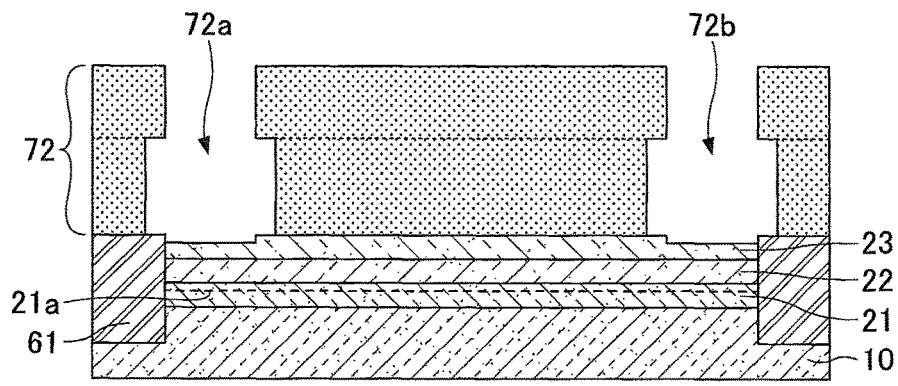
FIGS. 18A, 18B, and 18C are diagrams for explaining processes of the method of manufacturing the semiconductor device in the second embodiment.

Next, as illustrated in FIG. 18A, the resist pattern 71 is removed using an organic solvent or the like, to form a resist pattern 72 having openings 72a and 72b in the regions where the source electrode 32 and the drain electrode 33 are to be formed. More particularly, after removing the resist pattern 71 using the organic solvent or the like, a photoresist is again coated on the electron supply layer 23, and the photoresist is exposed by the exposure apparatus and developed. Hence, the resist pattern 72, having the openings 72a and 72b in the regions where the source electrode 32 and the drain electrode 33 are to be formed, is formed. As illustrated in FIG. 18A, the resist pattern 72 is formed by stacking 2 resist layers.

Figure 18B:
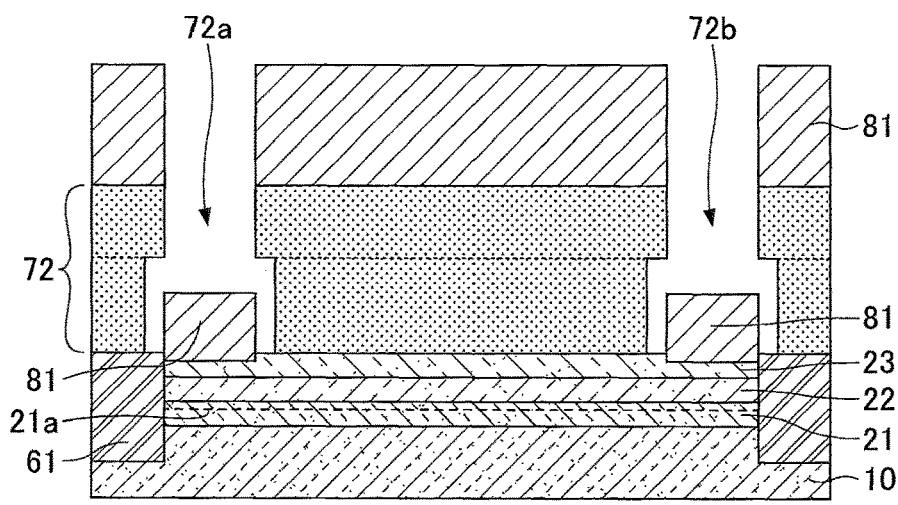

Next, as illustrated in FIG. 18B, a metal multilayer 81 made of Ti/Al is deposited on the surface of the stacked structure formed with the resist pattern 72, by vacuum deposition. More particularly, a Ti layer is deposited on the surface of the stacked structure formed with the resist pattern 72, by vacuum deposition, and an Al layer is thereafter deposited on the Ti layer by vacuum deposition. In this embodiment, the Ti layer is deposited to a thickness of approximately 20 nm, and the Al layer is deposited to a thickness of approximately 200 nm.

Figure 18C:
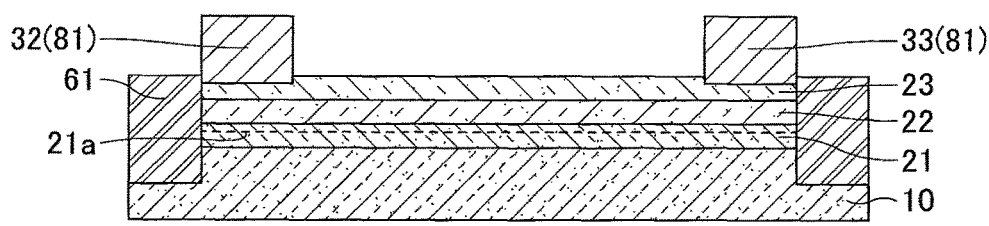

Next, as illustrated in FIG. 18C, the metal multilayer 81 formed on the resist pattern 72 is removed together with the resist pattern 72 by lift-off, by dipping the stacked structure in an organic solvent or the like. As a result, the source electrode 32 and the drain electrode 33 are formed by the metal multilayer 81 remaining within the regions where the openings 72a and 72b of the resist pattern 72 were formed. Thereafter, a thermal process is performed at a temperature of 550° C., in order to establish an ohmic contact between the electron supply layer 23 and each of the source electrode 32 and the drain electrode 33.

Figure 19A:
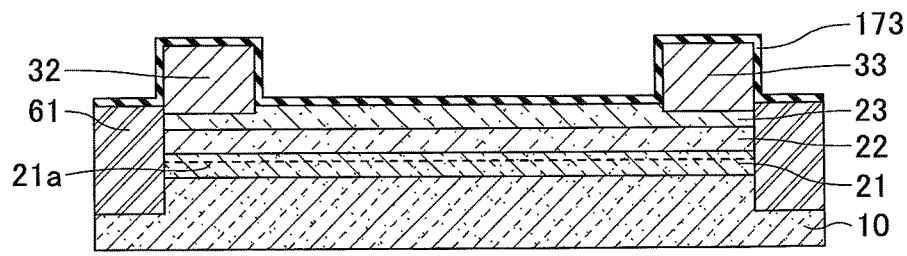
FIGS. 19A, 19B, and 19C are diagrams for explaining processes of the method of manufacturing the semiconductor device in the second embodiment.

Next, as illustrated in FIG. 19A, an insulator layer (hereinafter also referred to as "a hard mask insulator layer") 173 for forming a hard mask which will be described later is formed on the electron supply layer 23, the source electrode 32, and the drain electrode 33. More particularly, an SiN layer having a thickness of approximately 20 nm is deposited on the electron supply layer 23, the source electrode 32, and the drain electrode 33 by plasma CVD, to form the hard mask insulator layer 173. When forming the hard mask insulator layer 173 by the plasma CVD, silane, ammonia, or the like may be used for a source gas, for example. A refractive index of the hard mask insulator layer 173 at the wavelength of 633 nm is 2.0, and the hard mask insulator layer 173 is a stoichiometric layer.

Figure 19B:
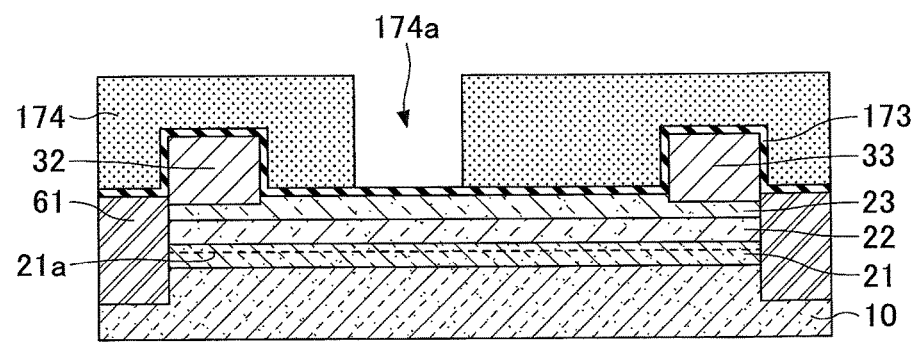

Next, as illustrated in FIG. 19B, a resist pattern 174 having an opening 174a is formed on the hard mask insulator layer 173. More particularly, a photoresist is coated on the hard mask insulator layer 173, and the resist pattern 174 having the opening 174a is formed by exposing the photoresist by the exposure apparatus and developing the exposed photoresist. The opening 174a of the resist pattern 174 has a width of approximately 1.0 μm, and has a size identical to the size of the insulator layer 150 that is formed by oxidizing the electron supply layer 23, as will be described later in the specification. In this embodiment, the insulator layer 150 partially extends from a region directly under the gate electrode 31 towards the drain electrode 33.

Figure 19C:
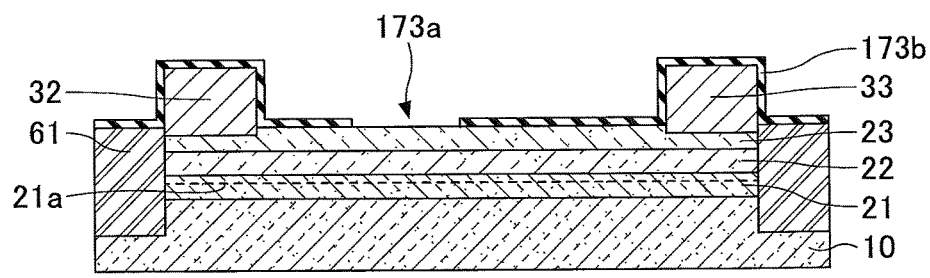

Next, as illustrated in FIG. 19C, an opening 173a is formed by removing the hard mask insulator layer 173 exposed within the opening 174a of the resist pattern 174 by RIE or the like. As a result, a hard mask 173b having the opening 173a is formed by the remaining hard mask insulator layer 173. The resist pattern 174 is thereafter removed using an organic solvent or the like.

Figure 20A:
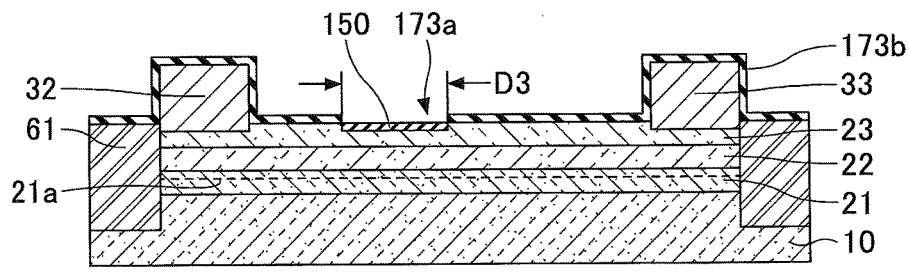
FIGS. 20A, 20B, and 20C are diagrams for explaining processes of the method of manufacturing the semiconductor device in the second embodiment.

Next, as illustrated in FIG. 20A, the insulator layer 150 is formed by oxidizing the surface of the electron supply layer 23 exposed within the opening 173a of the hard mask 173b, by the $H_2O$ oxidation using water vapor. More particularly, the ALD apparatus is used to form the insulator layer 150 by setting the substrate temperature to 300° C., supplying water vapor ($H_2O$) which becomes an oxidation source, and oxidizing the surface of the electron supply layer 23 exposed within the opening 173a of the hard mask 173b. The insulator layer 150 that is formed in this manner has a thickness of approximately 3 nm, and a width D3 of approximately 1.0 μm so as to partially extend from the region directly under the gate electrode 31 towards the drain electrode 33.

Figure 20B:
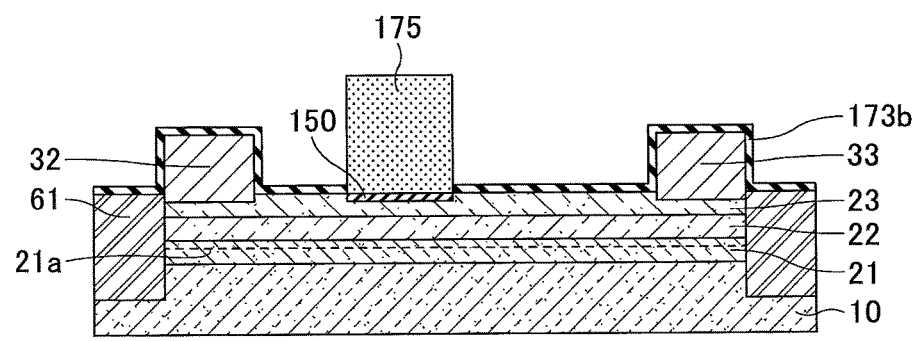

Next, as illustrated in FIG. 20B, a resist pattern 175 is formed on the insulator layer 150. More particularly, a photoresist is formed on the electron supply layer 23, the insulator layer 150, the source electrode 32, and the drain electrode 33, and the resist pattern 175 is formed by exposing the photoresist by the exposure apparatus and developing the exposure photoresist.

Figure 20C:
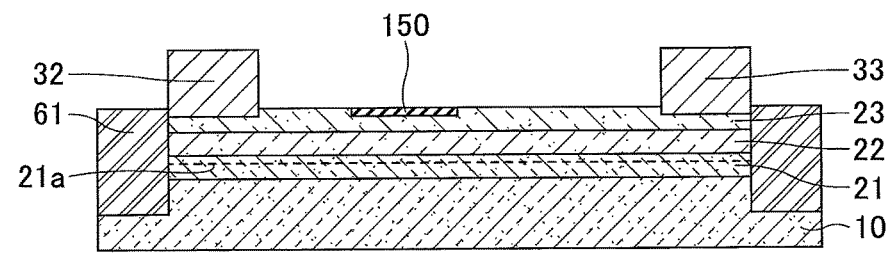

Next, as illustrated in FIG. 20C, the hard mask 173b in regions where no resist pattern 175 is formed is removed using a buffered hydrogen fluoride or the like. Thereafter, the resist pattern 175 is removed using an organic solvent or the like.

Figure 21A:
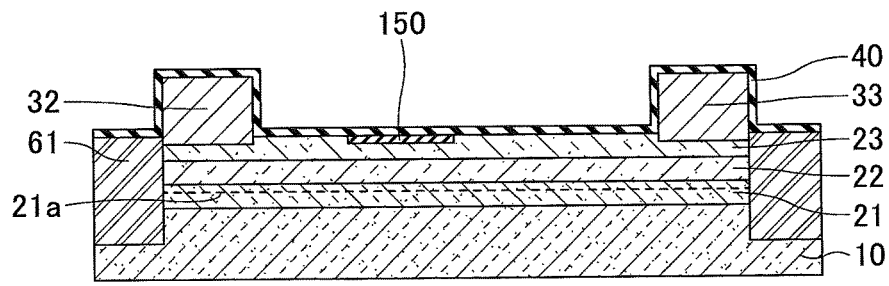
FIGS. 21A, 21B, and 21C are diagrams for explaining processes of the method of manufacturing the semiconductor device in the second embodiment.

Next, as illustrated in FIG. 21A, a protection layer 40, which becomes a passivation layer, is formed on the electron supply layer 23, the insulator layer 150, the source electrode 32, and the drain electrode 33. More particularly, an SiN layer having a thickness of approximately 50 nm is deposited on the electron supply layer 23, the insulator layer 150, the source electrode 32, and the drain electrode 33 by plasma CVD, to form the protection layer 40 that becomes the passivation layer. When forming the protection layer 40 by the plasma CVD, silane, ammonia, or the like may be used for a source gas, for example. A refractive index of the protection layer 40 at the wavelength of 633 nm is 2.0, and the protection layer 40 is a stoichiometric layer. In this embodiment, after performing the process illustrated in FIG. 20A, the process illustrated in FIG. 21A may be performed by omitting the processes illustrated in FIGS. 20B and 20C. In this case, the SiN protection layer 40 is formed on the SiN hard mask 173b, the insulator layer 150, the source electrode 32, and the drain electrode 33.

Figure 21B:
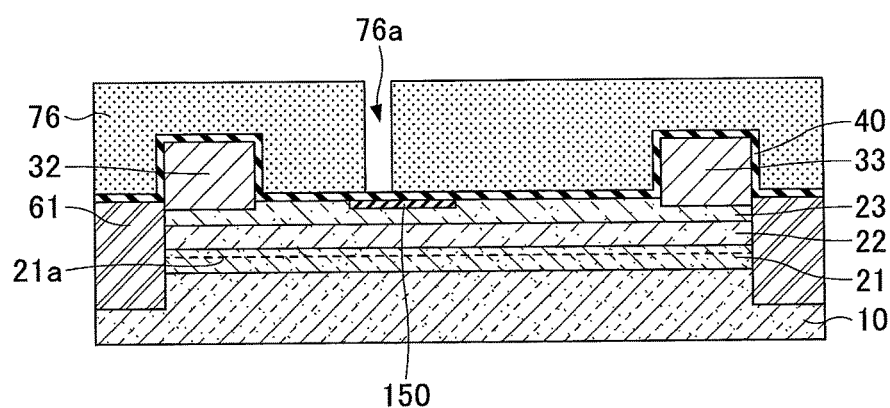

Next, as illustrated in FIG. 21B, a resist pattern 76 having an opening 76a is formed on the protection layer 40. More particularly, an electron beam resist is coated on the protection layer 40, and the resist pattern 76 having the opening 76a is formed by exposing the electron beam resist by the electron beam lithography apparatus and developing the exposed electron beam resist. The opening 76a of the resist pattern 76 that is formed in this manner corresponds to a region where the gate electrode 31 is to be formed, as will be described later, and has a width of approximately 0.15 μm. The opening 76a of the resist pattern 76 is formed so that, when the gate electrode 31 is formed, the insulator layer 150 partially extends from the region directly under the gate electrode 31 towards the drain electrode 33.

Figure 21C:
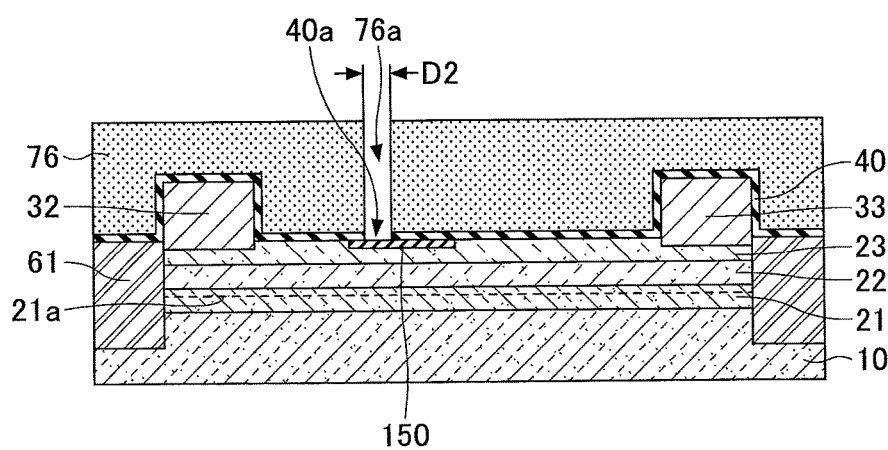

Next, as illustrated in FIG. 21C, the protection layer 40 within the opening 76a of the resist pattern 76 is removed, in order to form an opening 40a in the region where the gate electrode 31 is to be formed. More particularly, the protection layer 40 within the opening 76a of the resist pattern 76 is removed by a dry etching using $SF_6$ as an etching gas, or the like, in order to form the opening 40a in the protection layer 40. This opening 40a is formed to correspond to the region where the gate electrode 31 is to be formed, and has a width D2 of approximately 0.15 μm.

Figure 22A:
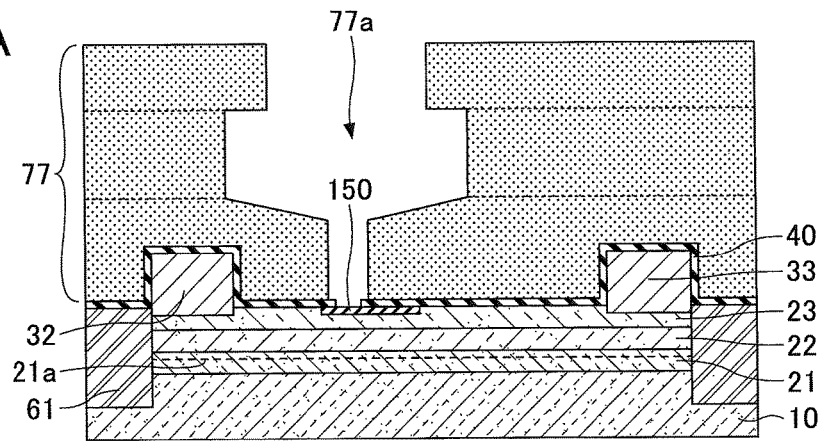
FIGS. 22A, 22B, and 22C are diagrams for explaining processes of the method of manufacturing the semiconductor device in the second embodiment.

Next, as illustrated in FIG. 22A, after removing the resist pattern 76 by an organic solvent or the like, a resist pattern 77 for forming the gate electrode 31 is formed on the protection layer 40. This resist pattern 77 is formed by 3 electron beam resist layers that are stacked, and has an opening 77a in the region where the gate electrode 31 is to be formed. More particularly, the 3 electron beam resist layers are successively formed on the protection layer 40 by repeatedly coating the same, for example. In addition, exposing the electron beam resist by the electron beam lithography apparatus and developing the exposed electron beam resist are repeated for each of the 3 electron beam resist layers, in order to form the opening 77a in the 3 electron beam resist layers. As a result, the opening 77a is formed in the resist pattern 77. The opening 77a of the resist pattern 77 is formed to have a width of 0.8 μm, 1.3 μm, and 0.2 μm for the top, middle, and bottom electron beam resist layers forming the 3 electron beam resist layers.

Figure 22B:
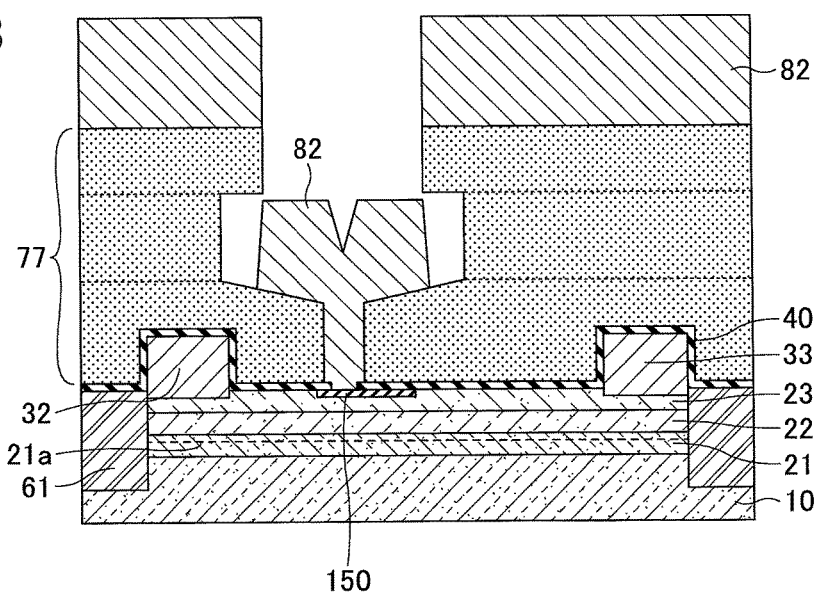

Next, as illustrated in FIG. 22B, a metal multilayer 82 made of Ni/Au is deposited on the surface of the stacked structure formed with the resist pattern 77, by vacuum deposition. More particularly, an Ni layer is deposited on the surface of the stacked structure formed with the resist pattern 77, by vacuum deposition, and an Au layer is thereafter deposited on the Ni layer by vacuum deposition. In this embodiment, the Ni layer is deposited to a thickness of approximately 10 nm, and the Au layer is deposited to a thickness of approximately 300 nm.

Figure 22C:
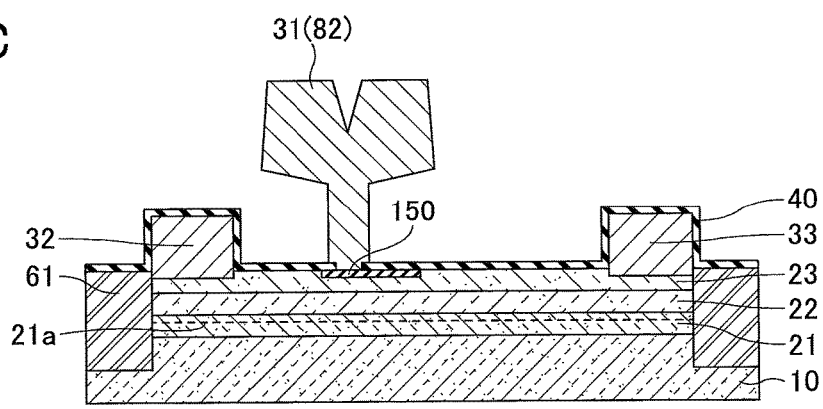

Next, as illustrated in FIG. 22C, the metal multilayer 82 formed on the resist pattern 77 is removed together with the resist pattern 77 by lift-off, by dipping the stacked structure in an organic solvent or the like. As a result, the gate electrode 31 is formed by the metal multilayer 82 remaining within the region where the opening 77a of the resist pattern 77 was formed.

The semiconductor device in this embodiment is manufactured by the processes described above.

Other features of the second embodiment are the same as those of the first embodiment.

Third Embodiment

Next, a description will be given of a third embodiment. In this embodiment, the present invention is applied to a semiconductor device, a power supply unit, and a high-output amplifier (or high-frequency amplifier).

(Semiconductor Device)

Figure 23:
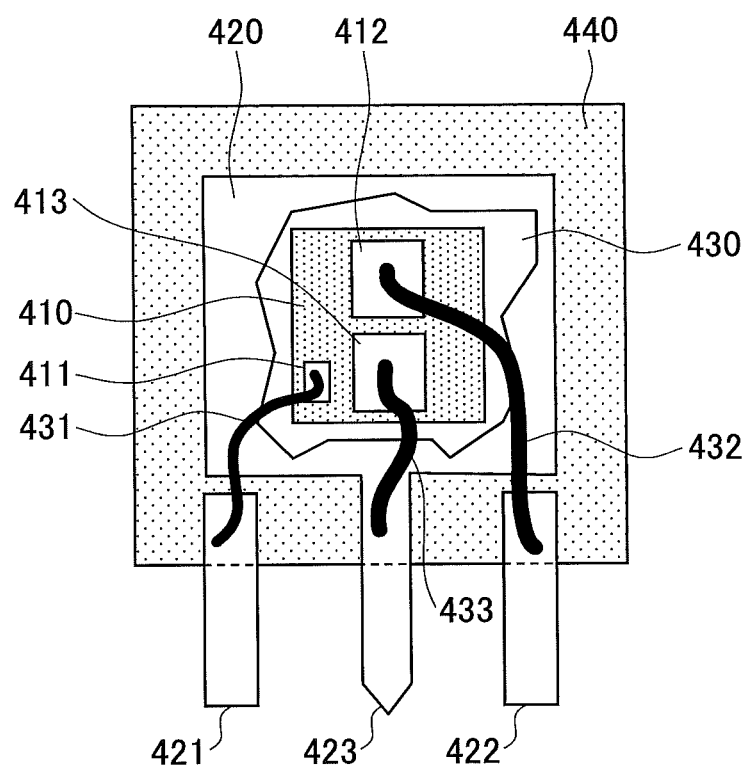
FIG. 23 is a diagram for explaining the semiconductor device in a third embodiment.

The semiconductor device in this embodiment includes a discrete package of the semiconductor device in the first embodiment or the second embodiment described above. A description will be given of the discrete package of the semiconductor device, by referring to FIG. 23. FIG. 23 is a diagram for explaining the semiconductor device in the third embodiment. Because FIG. 23 schematically illustrates the inside of the discrete package including the semiconductor device, the electrodes or the like are arranged at locations that may not match those of the semiconductor device in the first or second embodiment.

First, the semiconductor device in the first or second embodiment is cut by dicing or the like, in order to form a semiconductor chip 410 of a HEMT that uses a GaN-based semiconductor material. This semiconductor chip 410 is fixed on a lead frame 420 by a die-attaching agent 430 such as solder or the like. The semiconductor chip 410 corresponds to the semiconductor device in the first or second embodiment.

Next, a gate electrode 411 is connected to a gate lead 421 by a bonding wire 431, a source electrode 412 is connected to a source lead 422 by a bonding wire 432, and a drain electrode 413 is connected to a drain lead 423 by a bonding wire 433. The bonding wires 431, 432, and 433 are made of a metal material, such as Al or the like. In addition, in this embodiment, the gate electrode 411 is a type of gate electrode pad, and is connected to the gate electrode 31 of the semiconductor device in the first or second embodiment. Moreover, the source electrode 412 is a type of source electrode pad, and is connected to the source electrode 32 of the semiconductor device in the first or second embodiment. Furthermore, the drain electrode 413 is a type of drain electrode pad, and is connected to the drain electrode 33 of the semiconductor device in the first or second embodiment.

Next, a mold resin 440 encapsulates the semiconductor chip 410 or the like by resin encapsulation using transfer molding. As a result, the discrete package of the semiconductor device in the first or second embodiment, including the HEMT that uses the GaN-based semiconductor material, can be manufactured.

(PFC Circuit, Power Supply Unit & High-Output Amplifier)

Next, a description will be given of the PFC circuit, the power supply unit, and the high-output amplifier (or high-frequency amplifier) in this embodiment. The PFC circuit, the power supply unit, and the high-output amplifier (or high-frequency amplifier) in this embodiment respectively are the power supply unit and the high-output amplifier (or high-frequency amplifier) using the semiconductor device in the first or second embodiment.

(PFC Circuit)

Next, a description will be given of the PFC (Power Factor Correction) circuit in this embodiment. The PFC circuit in this embodiment includes the semiconductor device in the first or second embodiment.

Figure 24:
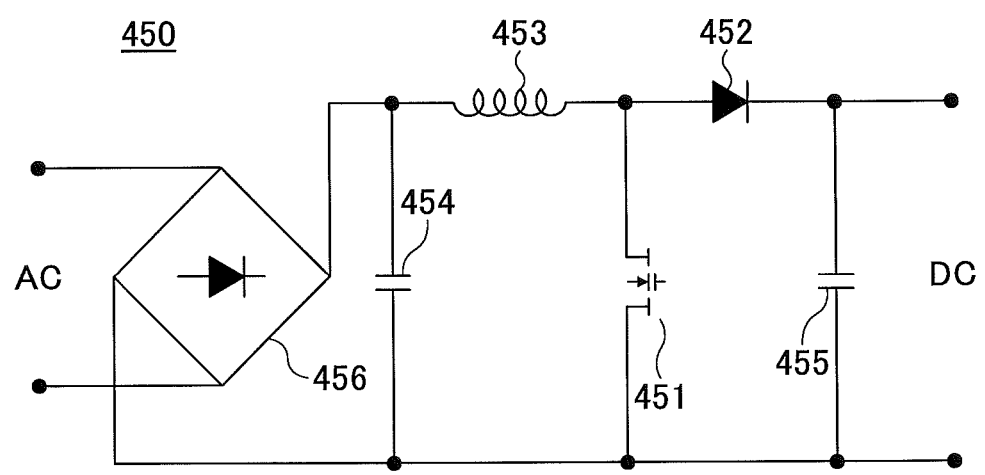
FIG. 24 is a circuit diagram illustrating a PFC (Power Factor Correction) circuit in the third embodiment.

A description of the PFC circuit in this embodiment will be described with reference to FIG. 24. FIG. 24 is a circuit diagram illustrating the PFC circuit in the third embodiment. A PFC circuit 450 illustrated in FIG. 24 includes a switching device (or transistor) 451, a diode 452, a choke coil 453, capacitors 454 and 455, a diode bridge 456, and an AC (Alternating Current) power supply (not illustrated). The HEMT of the semiconductor device in the first or second embodiment is used for the switching device 451.

In the PFC circuit 450, a drain electrode of the switching device 451, an anode terminal of the diode 452, and one terminal of the choke coil 453 are connected. In addition, a source electrode of the switching device 451, one terminal of the capacitor 454, and one terminal of the capacitor 455 are connected. The other terminal of the capacitor 454 and the other terminal of the choke coil 453 are connected. The other terminal of the capacitor 455 and a cathode terminal of the diode 452 are connected. The AC power supply is connected to the two terminals of the capacitor 454 via the diode bridge 456. In this PFC circuit 450, a DC (Direct Current) output is obtained from the two terminals of the capacitor 455.

(Power Supply Unit)

Next, a description will be given of the power supply unit in this embodiment. The power supply unit in this embodiment includes the semiconductor device in the first or second embodiment.

Figure 25:
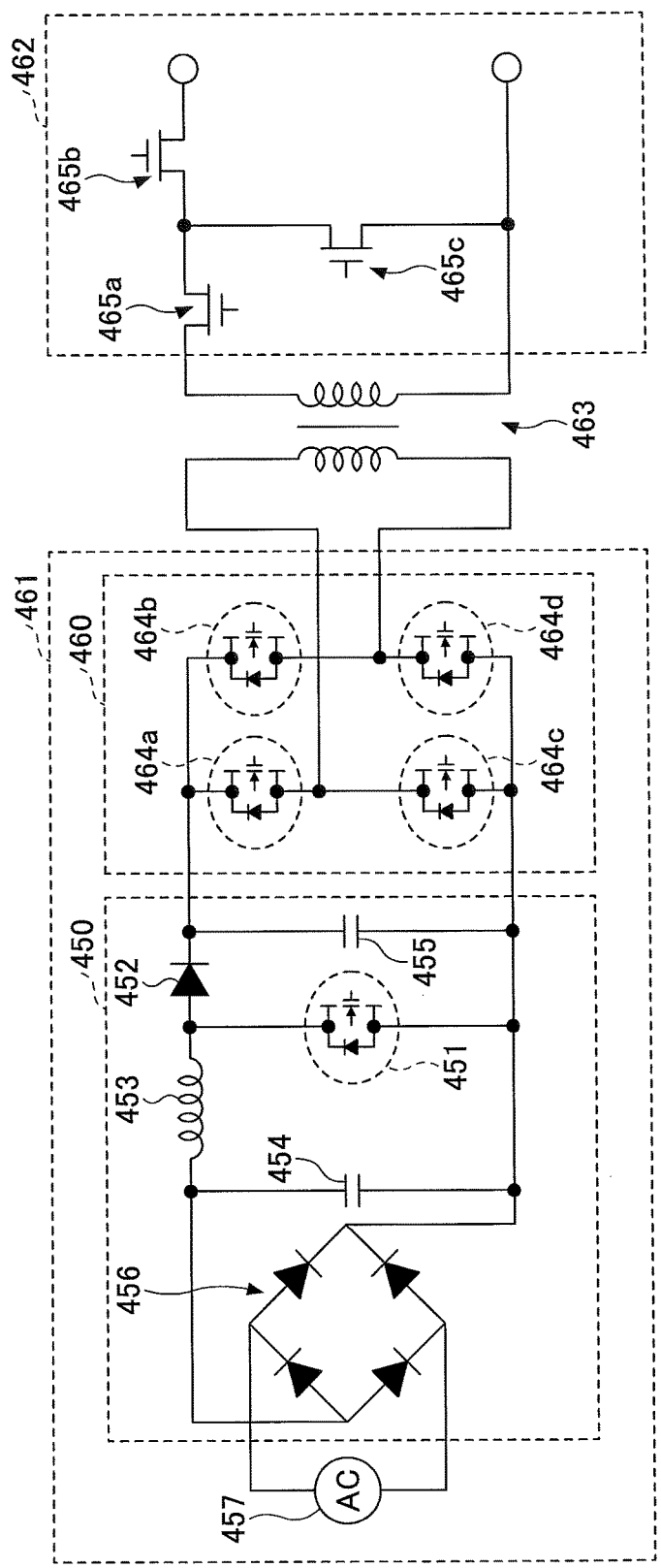
FIG. 25 is a circuit diagram illustrating a power supply unit in the third embodiment.

A description will be given of the power supply unit of this embodiment, by referring to FIG. 25. FIG. 25 is a circuit diagram illustrating the power supply unit in the third embodiment. The power supply unit illustrated in FIG. 25 includes the PFC circuit 450 of this embodiment described above.

The power supply unit in this embodiment includes a high-voltage primary side circuit 461, a low-voltage side secondary side circuit 462, and a transformer 463 arranged between the primary side circuit 461 and the secondary side circuit 462.

The primary side circuit 461 includes the PFC circuit 450 described above, an inverter circuit connected to the two terminals of the capacitor 455 in the PFC circuit 450, such as a full-bridge inverter circuit 460, for example. The full-bridge inverter circuit 460 includes a plurality of (4 in this example) switching devices 464a, 464b, 464c, and 464d. In addition, the secondary side circuit 462 includes a plurality of (3 in this example) switching devices 465l, 465b, and 465c. An AC power supply 457 is connected to the diode bridge 456.

In this embodiment, the HEMT of the semiconductor device in the first or second embodiment is used for the switching device 451 of the PFC circuit 450 in the primary side circuit 461. In addition, the HEMT of the semiconductor device in the first or second embodiment is used for the switching devices 464a, 464b, 464c, and 464d of the full-bridge inverter circuit 460 in the primary side circuit 461. On the other hand, an FET having a known MIS (Metal Insulator Semiconductor) structure using silicon, or the like, is used for the switching devices 465a, 465b, and 465c of the secondary side circuit 462.

(High-Output Amplifier)

Next, a description will be given of the high-output amplifier (or high-frequency amplifier) in this embodiment. The high-output amplifier in this embodiment includes the semiconductor device in the first or second embodiment.

Figure 26:
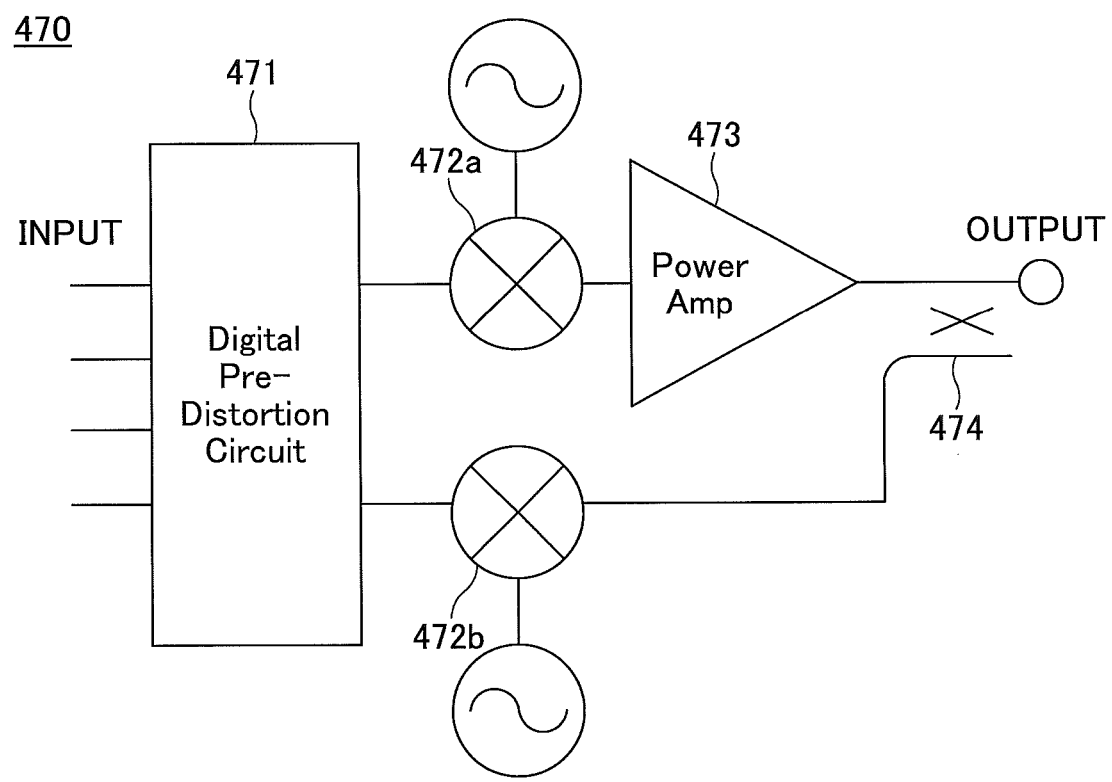
FIG. 26 is a structure diagram illustrating a high-output amplifier in the third embodiment.

A description will be given of the high-output amplifier of this embodiment, by referring to FIG. 26. FIG. 26 is a structure diagram illustrating the high-output amplifier in the third embodiment. The high-output amplifier illustrated in FIG. 26 includes a digital predistortion circuit 471, mixers 472a and 472b, a power amplifier 473, and a directional coupler 474.

The digital predistortion circuit 471 compensates for a non-linear distortion in an input signal. The mixer 472a mixes the input signal compensated of the non-linear distortion, and an AC signal. The power amplifier 473 amplifies the input signal mixed with the AC signal. In this embodiment, the HEMT of the semiconductor device in the first or second embodiment is used for the power amplifier 473. The directional coupler 474 monitors the input signal and an output signal, for example. In FIG. 26, the output signal may be mixed with the AC signal by the mixer 472b, and the output signal mixed with the AC signal may be input to the digital predistortion circuit 471, by switching a switch, for example.

Fourth Embodiment

Next, a description will be given of embodiments provided with a gate insulator layer.

Figure 27:
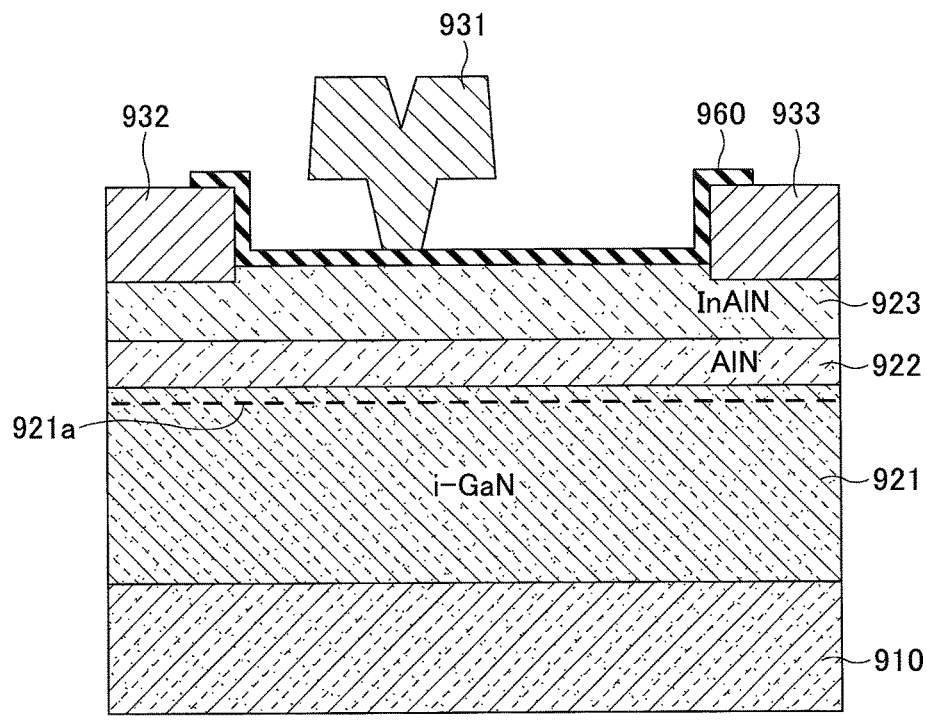
FIG. 27 is a structure diagram illustrating a semiconductor device provided with a gate insulator layer.

In the semiconductor device illustrated in FIG. 1 using InAlN for the electron supply layer 923, the gate leak current $I_g$leak may be reduced by a method using the MIS structure. FIG. 27 is a structure diagram illustrating the semiconductor device using this method and provided with a gate insulator layer. In FIG. 27, those parts that are the same as those corresponding parts in FIG. 1 are designated by the same reference numerals, and a description thereof will be omitted. In FIG. 27, a gate insulator layer 960 made of $Al_2O_3$ or the like is formed on the electron supply layer 923, and the gate electrode 931 is formed on the gate insulator layer 960. However, it is difficult to form a satisfactory gate insulator layer on InAlN, and in a case in which the gate insulator layer 960 is formed on the electron supply layer 923, a problem may be generated in that the current collapse may occur and cause the ON-resistance to become high. It may be regarded that the current collapse in the case in which the gate insulator layer 960 made of $Al_2O_3$ or the like is formed on the electron supply layer 923 made of InAlN is caused by an increase in current trap concentration at an interface between the InAlN and $Al_2O_3$.

(Semiconductor Device)

Figure 28:
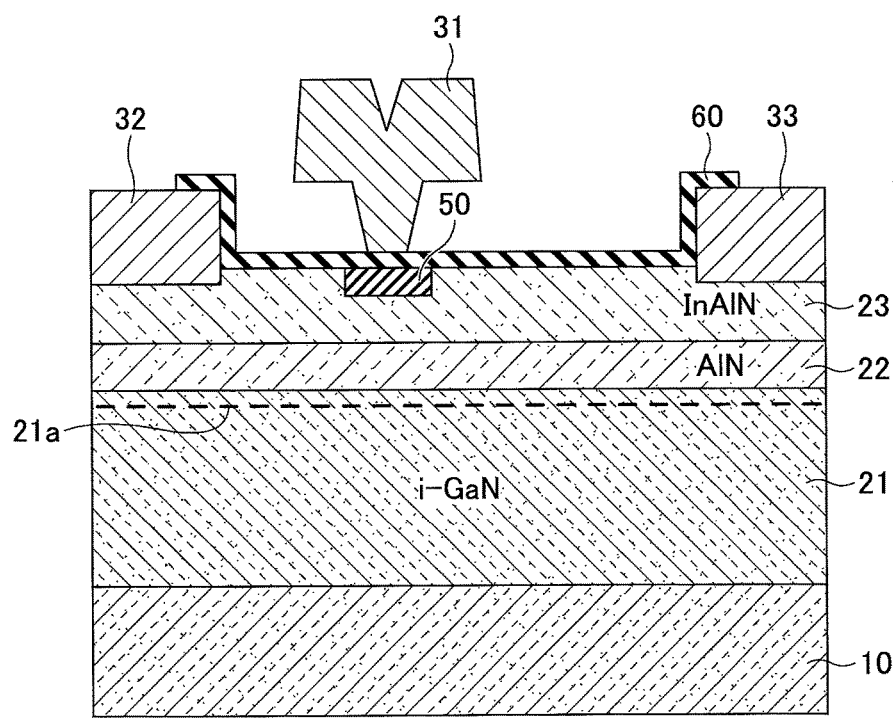
FIG. 28 is a structure diagram illustrating a semiconductor device in a fourth embodiment.

Next, a description will be given of the semiconductor device in a fourth embodiment, by referring to FIG. 28. FIG. 28 is a structure diagram illustrating the semiconductor device in the fourth embodiment. The semiconductor device illustrated in FIG. 28 includes a buffer layer (not illustrated), an i-GaN electron transit layer 21, an AlN intermediate layer 22, and an InAlN electron supply layer 23 that are stacked on a substrate 10. A source electrode 32 and a drain electrode 33 are provided on the electron supply layer 23. An oxide layer 50 is formed by oxidizing a material forming the electron supply layer 23, at a surface of the electron supply layer 23 immediately under a region where a gate electrode 31 is to be formed. An insulator layer 60 that becomes a gate insulator layer is provided on the electron supply layer 23 and the oxide layer 50. The insulator layer 60 is made of $Al_2O_3$ or the like. The gate electrode 31 is provided on the insulator layer 60 in a region where the oxide layer 50 is formed. The source electrode 32 and the drain electrode 33 may be provided on the electron transit layer 21, or on the intermediate layer 22.

In this embodiment, the substrate 10 is made of semi-insulating SiC, and a 2DEG 21a is generated in the electron transit layer 21 at a vicinity of an interface between the electron transit layer 21 and the intermediate layer 22. In this embodiment, the electron transit layer 21 may also be referred to as "a first semiconductor layer", the electron supply layer 23 may also be referred to as "a second semiconductor layer", and the intermediate layer 22 may also be referred to as "a third semiconductor layer".

The oxide layer 50 of the semiconductor device in this embodiment is formed by oxidizing the electron supply layer 23. By forming the oxide layer 50 under the gate electrode 31, it is possible to form a satisfactory insulator layer 60 on the oxide layer 50. As a result, it is possible to improve insulation directly under the gate electrode 31, reduce the gate leak current, and obtain a high output from the semiconductor device. In addition, in a case in which the insulator layer 60 is an oxide, the insulator layer 60 can be formed on the oxide layer 50 satisfactorily matching the material forming the insulator layer 60. In this case, the electrons are uneasily trapped and the electron trap concentration at an interface between the oxide layer 60 and the insulator layer 60, and for this reason, the generation of the current collapse can be suppressed.

In this embodiment, the oxide layer 50 is formed by oxidizing a part of the electron supply layer 23. However, because the electron supply layer 23 is formed by InAlN, the oxide layer 50 includes $In_2O_3$ and $Al_2O_3$ that are formed when the InAlN is oxidized. The $In_2O_3$ has a narrow band gap and a poor capability of preventing the gate leak current. In addition, the $In_2O_3$ is unstable, and inconsistencies or the like are likely to occur in properties thereof. Hence, $In_2O_3$ is not a preferable material for forming the oxide layer 50. On the other hand, $Al_2O_3$ has a wide band gap and is stable. Thus, $Al_2O_3$ is a preferable material for forming the oxide layer 50. Accordingly, in order to obtain a high insulation by the oxide layer 50, an $Al_2O_3$-content of the oxide layer 50 is preferably higher than an $In_2O_3$-content of the oxide layer 50. The oxide layer 50 of the semiconductor device in this embodiment includes more $Al_2O_3$ than $In_2O_3$. As a result, the gate leak current can be reduced, and generation of current collapse can be suppressed.

In this embodiment, the gate electrode 31 is a so-called T-shaped gate electrode having a T-shape. However, the gate electrode 31 is not limited to the T-shaped gate electrode, and other gate electrodes, such as an overhanging type gate electrode and a rectangular gate electrode, may be used for the gate electrode 31. In this embodiment, the oxide layer 50 has a thickness of 1 nm or greater, preferably 5 nm or greater, and more preferably 1 nm or greater and 3 nm or less. In addition, the insulator layer 60 may be formed by a material selected from oxides, nitrides, oxynitrides, or the like. However, because the oxide layer 50 includes a large Al oxide content, the insulator layer 60 is preferably made of $Al_2O_3$, AlN, AlON, or the like, and more preferably made of $Al_2O_3$ which is an Al oxide.

[Oxidation of InAlN]

Methods of oxidizing the nitride semiconductor, such as InAlN, or the like, include $H_2O$ oxidation using water vapor (or water vapor-assisted H2 oxidation), O plasma oxidation, a thermal oxidation using oxygen, or the like. In the thermal oxidation using oxygen, the temperature at the time of the oxidation is approximately 600° C. and relatively high, which is not preferable since the high temperature may damage the semiconductor device that is manufactured. In the $H_2O$ oxidation using water vapor and the O plasma oxidation, the temperature at the time of the oxidation is approximately 300° C. and relatively low, which enables the semiconductor device to be manufactured without being damaged.

Figure 29A:
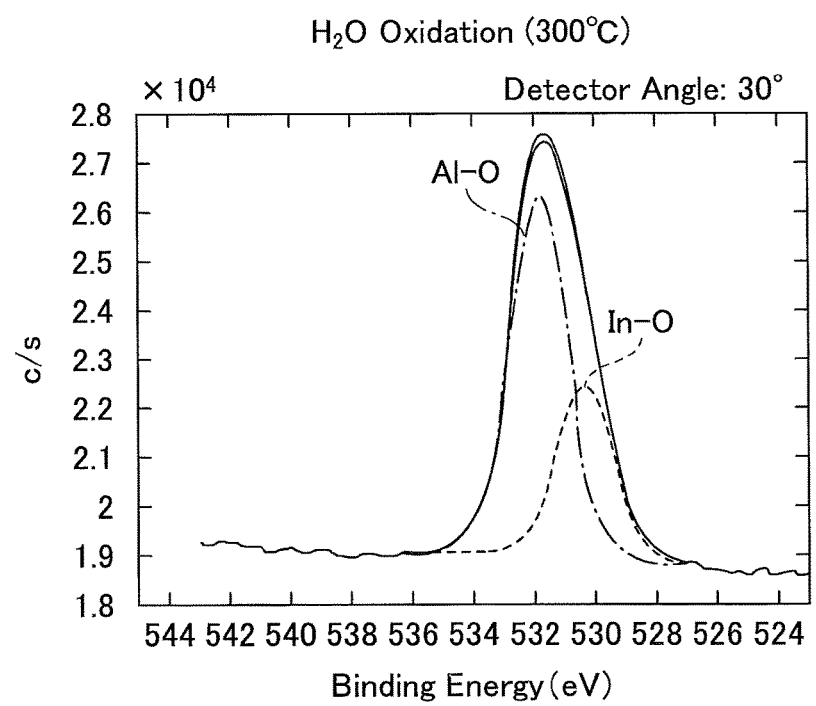
FIGS. 29A and 29B are diagrams illustrating analysis results of an oxide layer analyzed by XPS.
Figure 29B:
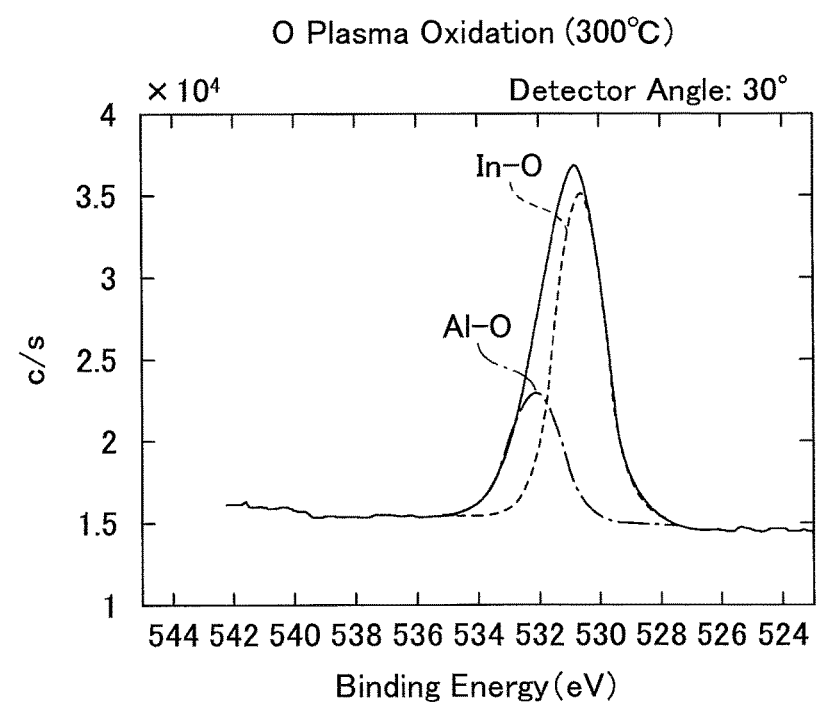

Next, a description will be given of analysis results of the oxide layer analyzed by XPS (X-ray Photoelectron Spectroscopy), by referring to FIGS. 29A and 29B. FIG. 29A illustrates the analysis results for a case in which the oxide layer analyzed by the XPS is an oxide obtained by subjecting InAlN to the $H_2O$ oxidation using water vapor, and FIG. 29B illustrates the analysis results for a case in which the oxide layer analyzed by the XPS is an oxide obtained by subjecting InAlN to the O plasma oxidation. The $H_2O$ oxidation of InAlN using water vapor and the O plasma oxidation of InAlN are both performed at 300° C.

As illustrated in FIG. 29A, in the oxide obtained by subjecting InAlN to the $H_2O$ oxidation using water vapor, more Al—O is observed than In—O. On the other hand, as illustrated in FIG. 29B, in the oxide obtained by subjecting InAlN to the O plasma oxidation, more In—O is observed than Al—O. Accordingly, the oxide obtained by subjecting InAlN to the $H_2O$ oxidation using water vapor includes more $Al_2O_3$ than the oxide obtained by subjecting InAlN to the O plasma oxidation. For this reason, the insulation can be improved by forming the oxide layer 50 by the $H_2O$ oxidation using water vapor, according to which more Al—O is observed than In—O, when compared to the O plasma oxidation.

Figure 30:
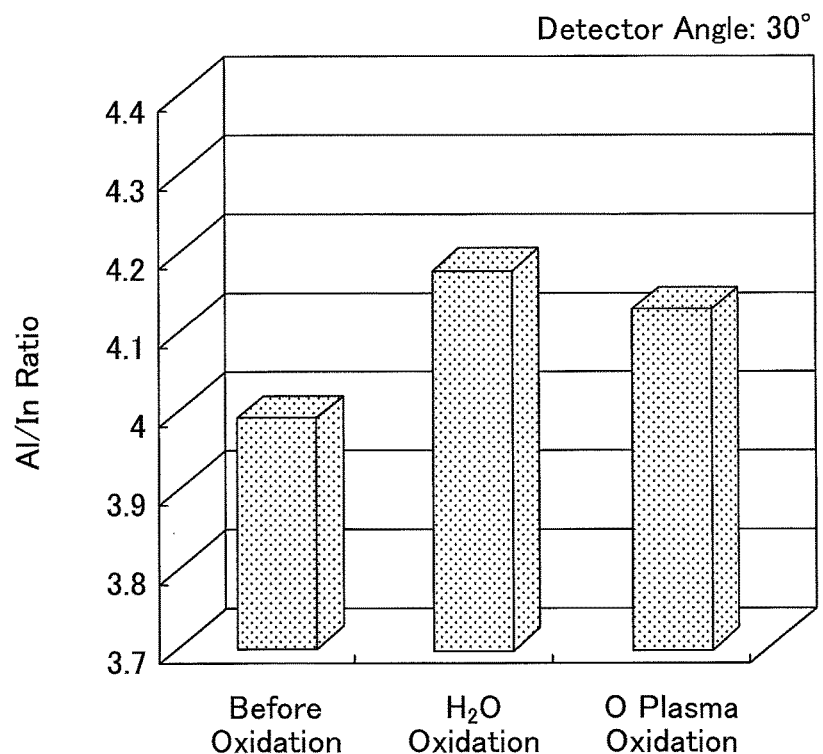
FIG. 30 is a diagram illustrating a correlation between oxidation methods and the Al/In ratio when forming the oxide layer.

FIG. 30 is a diagram illustrating a correlation between the oxidation methods and an Al/In ratio when forming the oxide layer. FIG. 5 illustrates the Al/In ratio of the Al-content with respect to the In-content in the InAlN before oxidation, the oxide obtained by oxidizing InAlN by the $H_2O$ oxidation using water vapor, and the oxide obtained by oxidizing InAlN by the O plasma oxidation. A composition of InAlN is $In_{17}Al_{83}N$. As illustrated in FIG. 30, the Al/In ratio becomes high when InAlN is subjected to the $H_2O$ oxidation using water vapor and also when InAlN is subjected to the O plasma oxidation. In addition, the Al/In ratio is higher for the case in which InAlN is subjected to the $H_2O$ oxidation using water vapor, when compared to the case in which InAlN is subjected to the O plasma oxidation. In other words, the In-content in the oxide obtained by oxidizing InAlN by the $H_2O$ oxidation using water vapor is reduced compared to the oxide obtained by oxidizing InAlN by the O plasma oxidation.

($H_2O$ Oxidation Using Water Vapor)

The reason why the Al/In ratio becomes high in the case in which InAlN is subjected to the $H_2O$ oxidation using water vapor, when compared to the case in which InAlN is subjected to the O plasma oxidation, is as described above in conjunction with the first embodiment.

In this embodiment, the substrate or the like is heated when oxidizing InAlN by the $H_2O$ oxidation using water vapor, similarly as in the case of the first embodiment described above.

In the semiconductor device in this embodiment, the oxide layer 50 is formed by oxidizing a part of the surface of the InAlN forming the electron supply layer 23, and the insulator layer 60 made of $Al_2O_3$ or the like is formed on the oxide layer 50. The method of oxidizing the part of the surface of the InAlN forming the electron supply layer 23 may be the $H_2O$ oxidation using water vapor, or the O plasma oxidation. However, the $H_2O$ oxidation using water vapor is more preferable in that the In-content can be reduced more and the composition ratio of Al can be made high.

Figure 31:
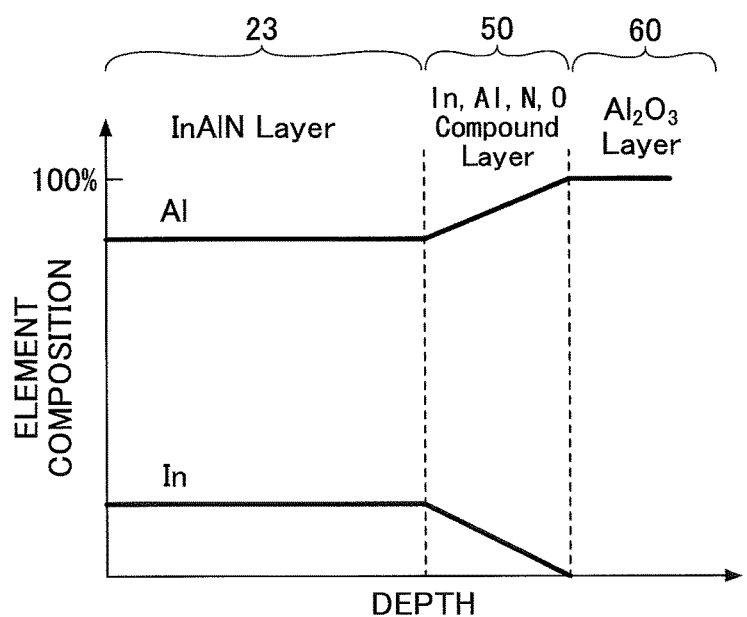
FIG. 31 is a diagram illustrating a composition distribution of the oxide layer of the semiconductor device in the fourth embodiment.

As described above, when oxidizing the InAlN forming the electron supply layer 23 in order to form the oxide layer 50, the In-content is reduced and the Al-content is increased as the oxidation progresses. When forming the oxide layer 50, the oxidation gradually progresses from the surface of the InAlN. Hence, as illustrated in FIG. 31, at the surface of the oxide layer 50, the In-content is reduced more and more $Al_2O_3$ is formed than at a part of the oxide layer 50 deeper into the electron supply layer 23 from the surface of the oxide layer 50. FIG. 31 is a diagram illustrating a composition distribution of the oxide layer of the semiconductor device in the fourth embodiment.

In the case in which the insulator layer 60 is made of $Al_2O_3$, identical to the $Al_2O_3$ forming the oxide layer 50, the insulator 60 matches well to the oxide layer 50 when the insulator layer 60 is formed on the oxide layer 50. As a result, an interface trap is uneasily formed at the interface between the oxide layer 50 and the insulator layer 60. For this reason, the electrons are uneasily trapped between the oxide layer 50 and the insulator layer 60, and the generation of the current collapse can be suppressed.

(Properties of Semiconductor Device)

Figure 32:
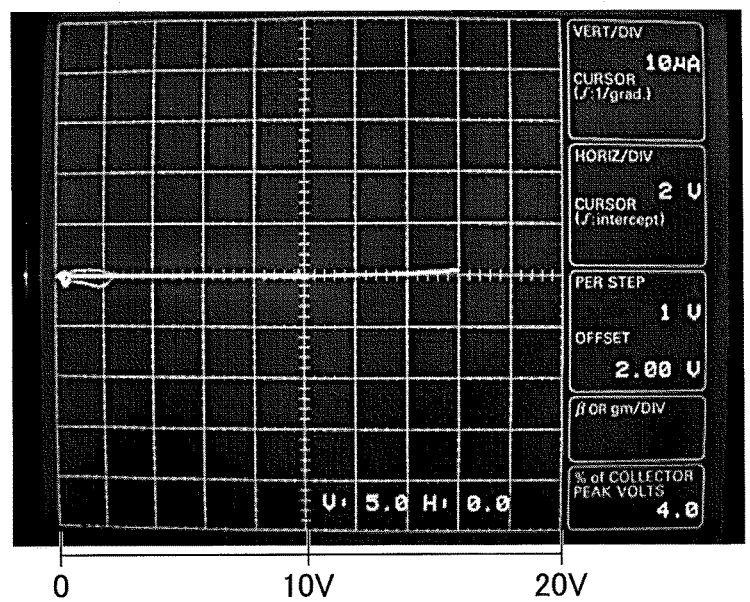
FIG. 32 is a correlation diagram of a gate voltage and a leak current of the semiconductor device in the fourth embodiment.
Figure 33:
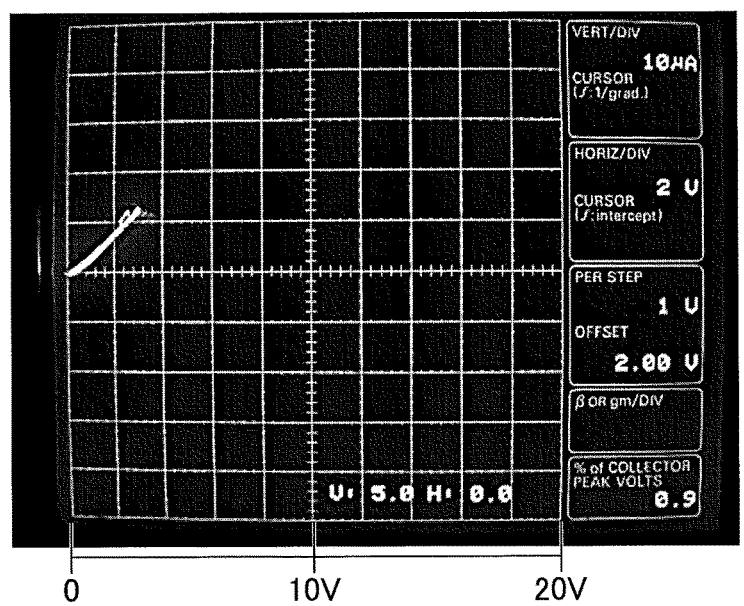
FIG. 33 is a correlation diagram of the gate voltage and the leak current of the semiconductor device illustrated in FIG. 1.

Next, a description will be given of the properties of the semiconductor device in this embodiment. FIGS. 32 and 33 illustrate measured results of the gate leak current that flows when a voltage is applied across the gate electrode and the drain electrode. In FIGS. 32 and 33, the abscissa indicates the applied voltage, and the ordinate indicates the gate leak current. FIG. 32 is a correlation diagram of the gate voltage and the leak current of the semiconductor device in the fourth embodiment illustrated in FIG. 28. FIG. 33 is a correlation diagram of the gate voltage and the leak current of the semiconductor device illustrated in FIG. 1.

According to the semiconductor device in this embodiment, no gate leak current flows even when the voltage of up to 16 V is applied across the gate electrode and the drain electrode, as illustrated in FIG. 32. On the other hand, according to the semiconductor device illustrated in FIG. 1, the gate leak current flows when the voltage is applied across the gate electrode and the drain electrode, as illustrated in FIG. 33. Hence, it is confirmed that the semiconductor device in this embodiment can suppress the generation of the gate leak current. The generation of the gate leak current is suppressed and the gate leak current can be reduced according to the semiconductor device in this embodiment, because the oxide layer 50 and the insulator layer 60 are formed immediately below the gate electrode 31.

Figure 34:
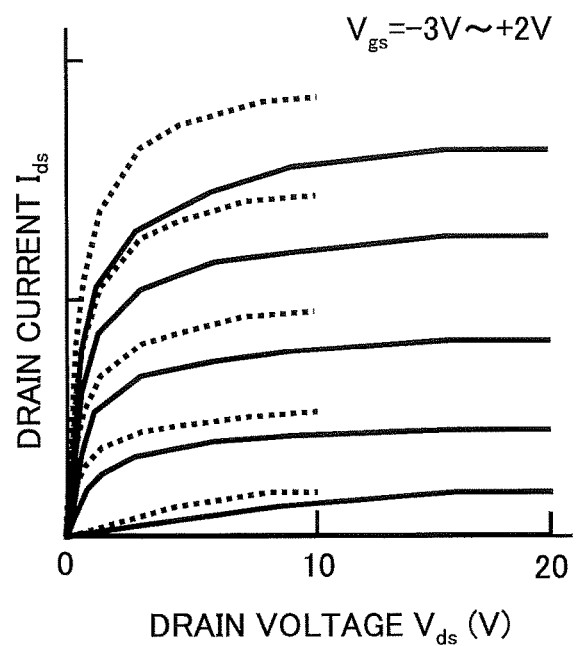
FIG. 34 is a correlation diagram of a drain voltage and a drain current of the semiconductor device in the fourth embodiment.
Figure 35:
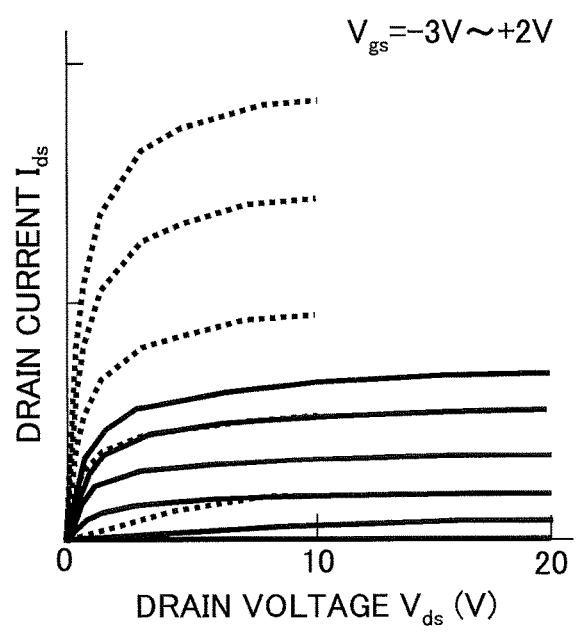
FIG. 35 is a correlation diagram of the drain voltage and the drain current of the semiconductor device illustrated in FIG. 27.

Next, a description will be given of the current collapse of the semiconductor device in this embodiment, in comparison with the current collapse of the semiconductor device illustrated in FIG. 27. FIGS. 34 and 35 illustrate relationships between a drain voltage $V_{ds}$ and a drain current $I_{ds}$ when a gate voltage $V_{gs}$ is varied, for a case in which the drain voltage $V_{ds}$ is increased up to 10 V, and for a case in which the drain voltage $V_{ds}$ is increased up to 20 V. FIG. 34 is a correlation diagram of the drain voltage and the drain current of the semiconductor device in the fourth embodiment illustrated in FIG. 28, and FIG. 35 is a correlation diagram of the drain voltage and the drain current of the semiconductor device illustrated in FIG. 27.

According to the semiconductor device having the structure illustrated in FIG. 27, the drain current $I_{ds}$ decreases due to the current collapse in the case in which the drain voltage $V_{ds}$ is increased up to 20 V, as illustrated in FIG. 35. On the other hand, according to the semiconductor device in this embodiment having the structure illustrated in FIG. 28, the drain current $I_{ds}$ does not show a relative decrease even in the case in which the drain voltage $V_{ds}$ is increased up to 20 V, and the generation of the current collapse is suppressed.

Therefore, according to the semiconductor device in this embodiment, it is possible to reduce the gate leak current. In addition, because the generation of the current collapse can be suppressed, it is possible to suppress the ON-resistance from becoming high.

(Method of Manufacturing Semiconductor Device)

Next, a description will be given of the method of manufacturing the semiconductor device in the fourth embodiment, by referring to FIGS. 36A through 41. FIGS. 36A through 41 are diagrams for explaining processes of the method of manufacturing the semiconductor device in this embodiment.

Figure 36A:
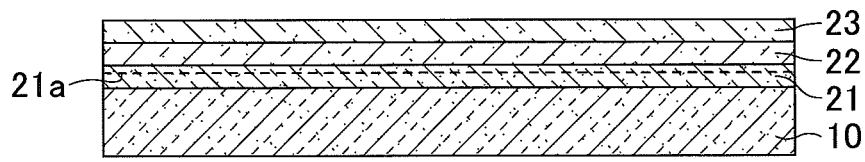
FIGS. 36A, 36B, and 36C are diagrams for explaining processes of a method of manufacturing the semiconductor device in the fourth embodiment.

First, as illustrated in FIG. 36A, the buffer layer (not illustrated), the electron transit layer 21, the intermediate layer 22, and the electron supply layer 23 are expitaxially grown on the substrate 10 by MOVPE (Metal Organic Vapor Phase Epitaxy) and successively stacked. In this embodiment, each of the buffer layer (not illustrated), the electron transit layer 21, the intermediate layer 22, and the electron supply layer 23 may also be referred to as "a nitride semiconductor layer". The electron transit layer 21 is formed by i-GaN to a thickness of approximately 3 μm, the intermediate layer 22 is formed by i-AlN to a thickness of approximately 1 nm, and the electron supply layer 23 is formed by i-$In_{0.17}Al_{0.83}N$ to a thickness of approximately 10 nm. Hence, the 2DEG 21a is generated in the electron transit layer 21 at the vicinity of the interface between the electron transit layer 21 and the intermediate layer 22. The substrate 10 is formed by semi-insulating SiC, and the buffer layer (not illustrated) is formed by GaN, AlGaN, or the like.

Figure 36B:
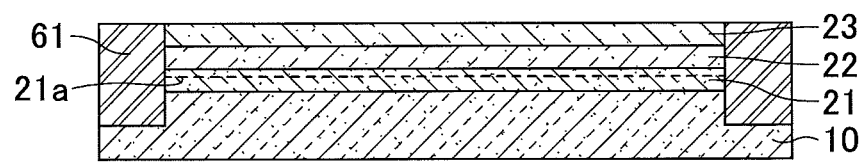

Next, as illustrated in FIG. 36B, an isolation region 61 is formed in the nitride semiconductor layers that are formed on the substrate 10. More particularly, a photoresist is coated on the electron supply layer 23, and a resist pattern (not illustrated), having an opening in a region where the isolation region 61 is to be formed, is formed by exposing the photoresist by an exposure apparatus and developing the exposed photoresist. Thereafter, Ar ions or the like are injected into the nitride semiconductor layers within the opening of the resist pattern, in order to form the isolation region 61. When forming the isolation region 61, the Ar ions or the like may be injected into a part of the substrate 10. The resist pattern is thereafter removed using an organic solvent or the like.

Figure 36C:
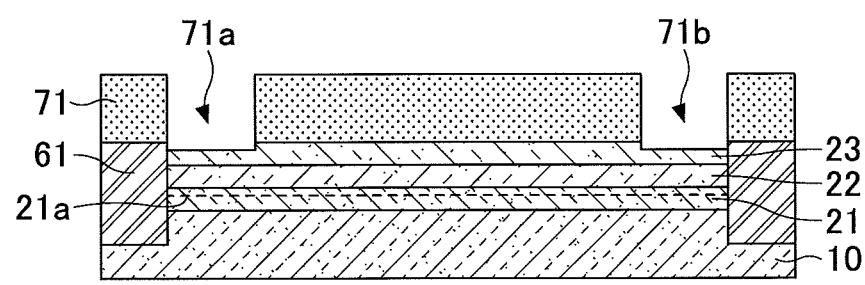

Next, as illustrated in FIG. 36C, a resist pattern 71, having openings 71a and 71b in regions where the source electrode 32 and the drain electrode 33 are to be formed, is formed on the electron supply layer 23, and then, a part at the surface of the electron supply layer 23 is removed within the openings 71a and 71b. More particularly, a photoresist is coated on the electron supply layer 23, and the resist pattern 71, having the openings 71a and 71b in the regions where the source electrode 32 and the drain electrode 33 are to be formed, is formed by exposing the photoresist by the exposure apparatus and developing the exposed photoresist. Thereafter, the part at the surface of the electron supply layer 23, exposed within the openings 71a and 71b of the resist pattern 71 and not covered by the photoresist of the resist pattern 71, is removed by RIE (Reactive Ion Etching) or the like. The RIE may use, as an etching gas, a gas including a chlorine component.

Figure 37A:
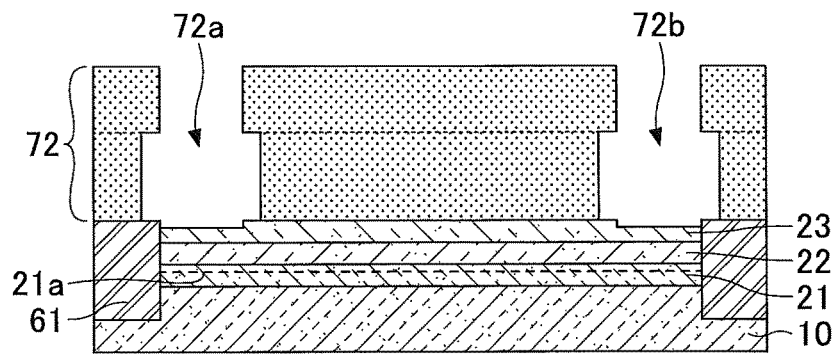
FIGS. 37A, 37B, and 37C are diagrams for explaining processes of the method of manufacturing the semiconductor device in the fourth embodiment.

Next, as illustrated in FIG. 37A, the resist pattern 71 is removed using an organic solvent or the like, to form a resist pattern 72 having openings 72a and 72b in the regions where the source electrode 32 and the drain electrode 33 are to be formed. More particularly, after removing the resist pattern 71 using the organic solvent or the like, a photoresist is again coated on the electron supply layer 23, and the photoresist is exposed by the exposure apparatus and developed. Hence, the resist pattern 72, having the openings 72a and 72b in the regions where the source electrode 32 and the drain electrode 33 are to be formed, is formed. As illustrated in FIG. 37A, the resist pattern 72 is formed by stacking 2 resist layers.

Figure 37B:
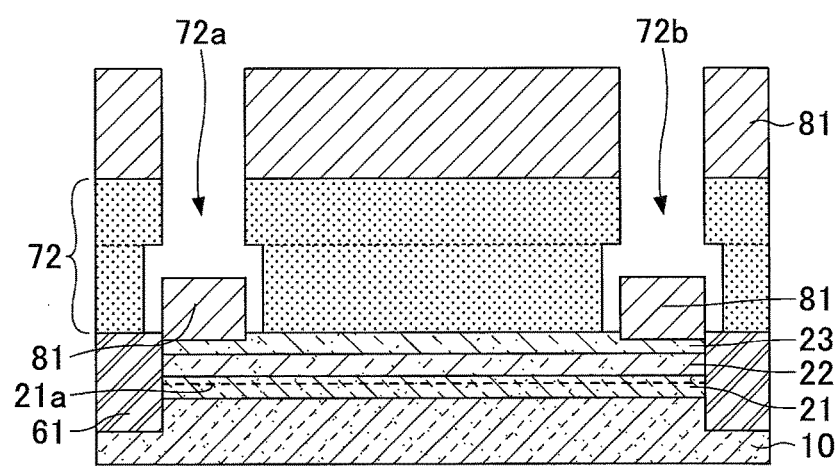

Next, as illustrated in FIG. 37B, a metal multilayer 81 made of Ti/Al is deposited on the surface of the stacked structure formed with the resist pattern 72, by vacuum deposition. More particularly, a Ti layer is deposited on the surface of the stacked structure formed with the resist pattern 72, by vacuum deposition, and an Al layer is thereafter deposited on the Ti layer by vacuum deposition. In this embodiment, the Ti layer is deposited to a thickness of approximately 20 nm, and the Al layer is deposited to a thickness of approximately 200 nm.

Figure 37C:
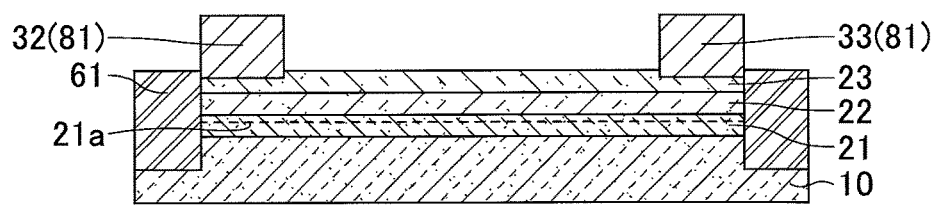

Next, as illustrated in FIG. 37C, the metal multilayer 81 formed on the resist pattern 72 is removed together with the resist pattern 72 by lift-off, by dipping the stacked structure in an organic solvent or the like. As a result, the source electrode 32 and the drain electrode 33 are formed by the metal multilayer 81 remaining within the regions where the openings 72a and 72b of the resist pattern 72 were formed. Thereafter, a thermal process is performed at a temperature of 550° C., in order to establish an ohmic contact between the electron supply layer 23 and each of the source electrode 32 and the drain electrode 33.

Figure 38A:
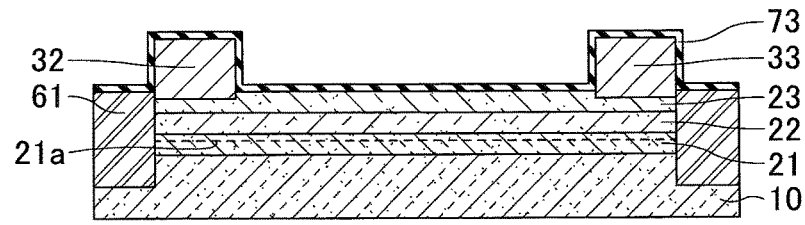
FIGS. 38A, 38B, and 38C are diagrams for explaining processes of the method of manufacturing the semiconductor device in the fourth embodiment.

Next, as illustrated in FIG. 38A, an insulator layer (hereinafter also referred to as "a hard mask insulator layer") 73 for forming a hard mask which will be described later is formed on the electron supply layer 23, the source electrode 32, and the drain electrode 33. More particularly, an SiN layer having a thickness of approximately 20 nm is deposited on the electron supply layer 23, the source electrode 32, and the drain electrode 33 by plasma CVD (Chemical Vapor Deposition), to form the hard mask insulator layer 73. When forming the hard mask insulator layer 73 by the plasma CVD, silane, ammonia, or the like may be used for a source gas, for example. A refractive index of the hard mask insulator layer 73 at a wavelength of 633 nm is 2.0, and the hard mask insulator layer 73 is a stoichiometric layer.

Figure 38B:
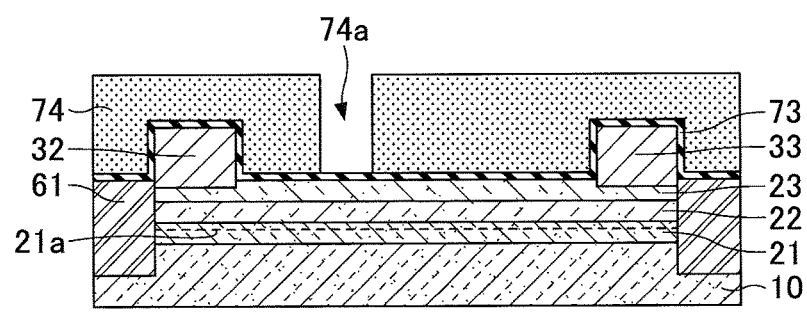

Next, as illustrated in FIG. 38B, a resist pattern 74 having an opening 74a is formed on the hard mask insulator layer 73. More particularly, a photoresist is coated on the hard mask insulator layer 73, and the resist pattern 74 having the opening 74a is formed by exposing the photoresist by the exposure apparatus and developing the exposed photoresist. The opening 74a of the resist pattern 74 has a width of approximately 0.5 μm, and has a size identical to the size of the oxide layer 50 that is formed by oxidizing the electron supply layer 23, as will be described later in the specification.

Figure 38C:
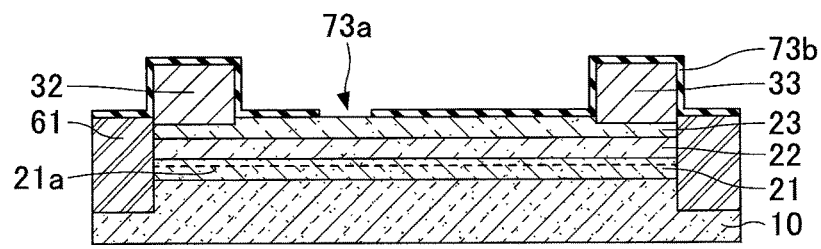

Next, as illustrated in FIG. 38C, an opening 73a is formed by removing the hard mask insulator layer 73 exposed within the opening 74a of the resist pattern 74 by RIE or the like. As a result, a hard mask 73b having the opening 73a is formed by the remaining hard mask insulator layer 73. The resist pattern 74 is thereafter removed using an organic solvent or the like.

Figure 39A:
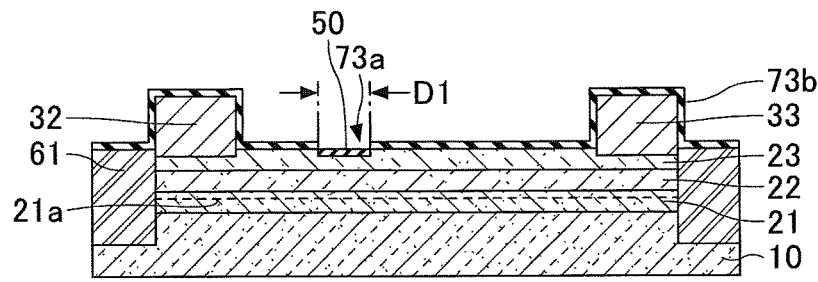
FIGS. 39A, 39B, and 39C are diagrams for explaining processes of the method of manufacturing the semiconductor device in the fourth embodiment.

Next, as illustrated in FIG. 39A, the oxide layer 50 is formed by oxidizing the surface of the electron supply layer 23 exposed within the opening 73a of the hard mask 73b, by the $H_2O$ oxidation using water vapor. More particularly, an ALD (Atomic Layer Deposition) apparatus is used to form the oxide layer 50 by setting the substrate temperature to 300° C., supplying water vapor ($H_2O$) which becomes an oxidation source, and oxidizing the surface of the electron supply layer 23 exposed within the opening 73a of the hard mask 73b. The insulator layer 50 that is formed in this manner has a thickness of approximately 1.5 nm, and a width D1 of approximately 0.5 μm.

Figure 39B:
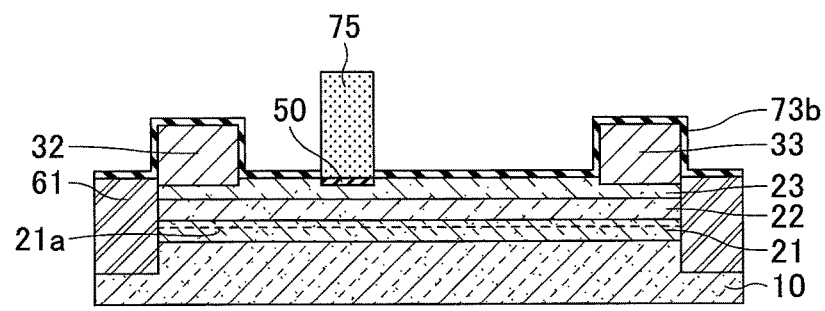

Next, as illustrated in FIG. 39B, a resist pattern 75 is formed on the oxide layer 50. More particularly, a photoresist is formed on the electron supply layer 23, the oxide layer 50, the source electrode 32, and the drain electrode 33, and the resist pattern 75 is formed by exposing the photoresist by the exposure apparatus and developing the exposure photoresist.

Figure 39C:
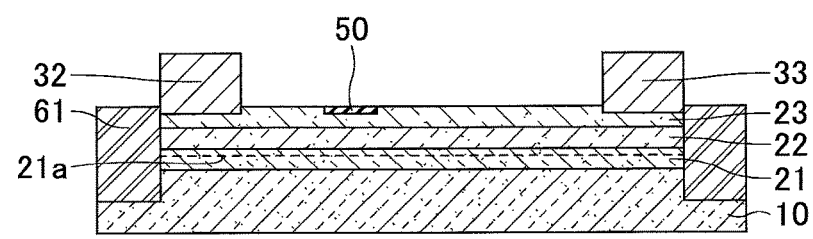

Next, as illustrated in FIG. 39C, the hard mask 73b in regions where no resist pattern 75 is formed is removed using a buffered hydrogen fluoride or the like. Thereafter, the resist pattern 75 is removed using an organic solvent or the like.

Figure 40A:
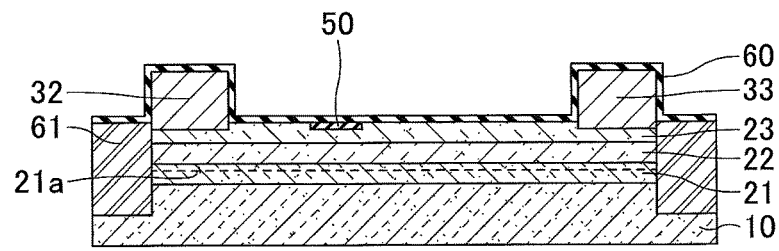
FIGS. 40A, 40B, and 40C are diagrams for explaining processes of the method of manufacturing the semiconductor device in the fourth embodiment.

Next, as illustrated in FIG. 40A, an insulator layer 60, which becomes a gate insulator layer, is formed on the electron supply layer 23, the oxide layer 50, the source electrode 32, and the drain electrode 33. More particularly, an $Al_2O_3$ layer having a thickness of approximately 2 nm is deposited on the electron supply layer 23, the oxide layer 50, the source electrode 32, and the drain electrode 33 by ALD (Atomic Layer Deposition), to form the insulator layer 60 that becomes the gate insulator layer. When forming the insulator layer 60 by the ALD, TMA (Trimethylaluminium), $H_2O$, or the like may be used for a source gas, for example, and the deposition may be performed at a substrate temperature of 300° C., for example.

Figure 40B:
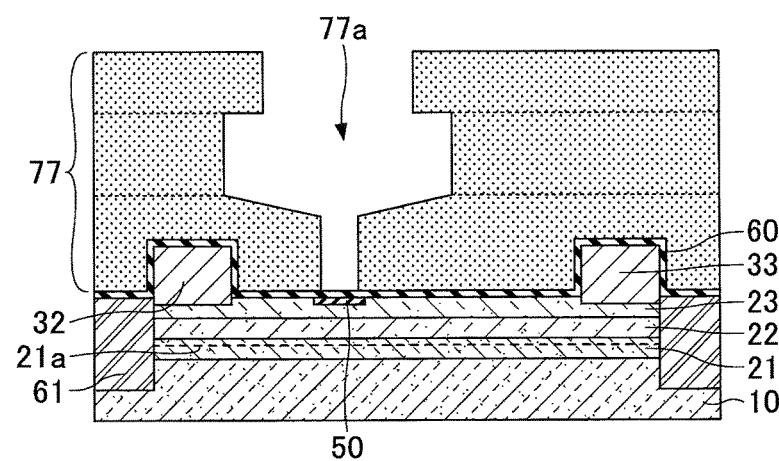

Next, as illustrated in FIG. 40B, a resist pattern 77 for forming the gate electrode 31 is formed on the insulator layer 60. This resist pattern 77 is formed by 3 electron beam resist layers that are stacked, and has an opening 77a in the region where the gate electrode 31 is to be formed. More particularly, the 3 electron beam resist layers are successively formed on the insulator layer 60 by repeatedly coating the same, for example. In addition, exposing the electron beam resist by the electron beam lithography apparatus and developing the exposed electron beam resist are repeated for each of the 3 electron beam resist layers, in order to form the opening 77a in the 3 electron beam resist layers. As a result, the opening 77a is formed in the resist pattern 77. The opening 77a of the resist pattern 77 is formed to have a width of 0.8 µm, 1.3 µm, and 0.2 µm for the top, middle, and bottom electron beam resist layers forming the 3 electron beam resist layers.

Figure 40C:
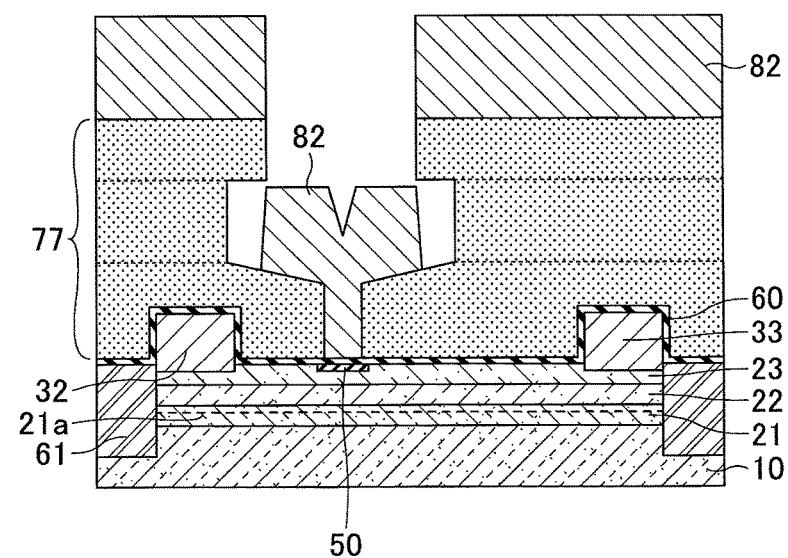

Next, as illustrated in FIG. 40C, a metal multilayer 82 made of Ni/Au is deposited on the surface of the stacked structure formed with the resist pattern 77, by vacuum deposition. More particularly, an Ni layer is deposited on the surface of the stacked structure formed with the resist pattern 77, by vacuum deposition, and an Au layer is thereafter deposited on the Ni layer by vacuum deposition. In this embodiment, the Ni layer is deposited to a thickness of approximately 10 nm, and the Au layer is deposited to a thickness of approximately 300 nm.

Figure 41:
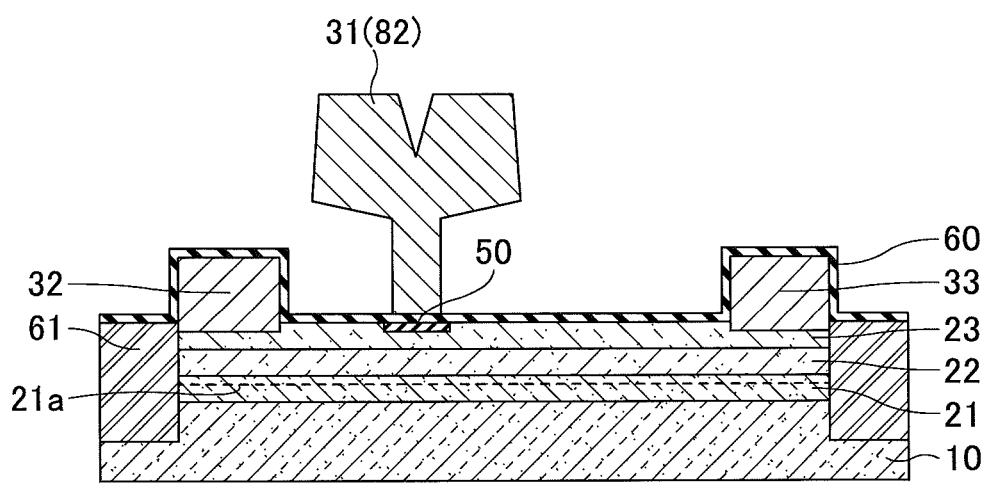
FIG. 41 is a diagram for explaining the process of the method of manufacturing the semiconductor device in the fourth embodiment.

Next, as illustrated in FIG. 41, the metal multilayer 82 formed on the resist pattern 77 is removed together with the resist pattern 77 by lift-off, by dipping the stacked structure in an organic solvent or the like. As a result, the gate electrode 31 is formed by the metal multilayer 82 remaining within the region where the opening 77a of the resist pattern 77, on the insulator layer 60, was formed.

The semiconductor device in this embodiment is manufactured by the processes described above.

Fifth Embodiment

Next, a description will be given of the semiconductor device in a fifth embodiment. In this embodiment, the semiconductor device has the same structure as the semiconductor device in the fourth embodiment, however, the $H_2O$ oxidation using water vapor, performed to form the oxide layer 50, is performed for a time that is two times longer than that used in the fourth embodiment. Hence, the thickness of the oxide layer 50 formed in this fifth embodiment is approximately 3.0 nm. In other words, the thickness of the oxide layer 50 of the semiconductor device in the fifth embodiment is two times the thickness of the oxide layer 50 of the semiconductor device in the fourth embodiment.

When the $H_2O$ oxidation using water vapor is performed, the oxidation gradually progresses from the surface of the electron supply layer 23. Hence, the In composition ratio at the surface of the oxide layer 50 of the semiconductor device in this fifth embodiment becomes lower than that of the semiconductor device in the fourth embodiment. In other words, the Al composition ratio at the surface of the oxide layer 50 of the semiconductor device in this fifth embodiment becomes higher than that of the semiconductor device in the fourth embodiment, and the proportion of $Al_2O_3$ in this fifth embodiment is higher than that of the fourth embodiment. In this fifth embodiment in which an $Al_2O_3$ layer is formed as the insulator layer 60 on the oxide layer 50 having the high proportion of $Al_2O_3$, it is possible to further reduce the electrodes trapped at the interface between the oxide layer 50 and the insulator layer 60 when compared to the fourth embodiment. As a result, this fifth embodiment can further suppress the generation of the current collapse.

(Properties of Semiconductor Device)

Figure 42:
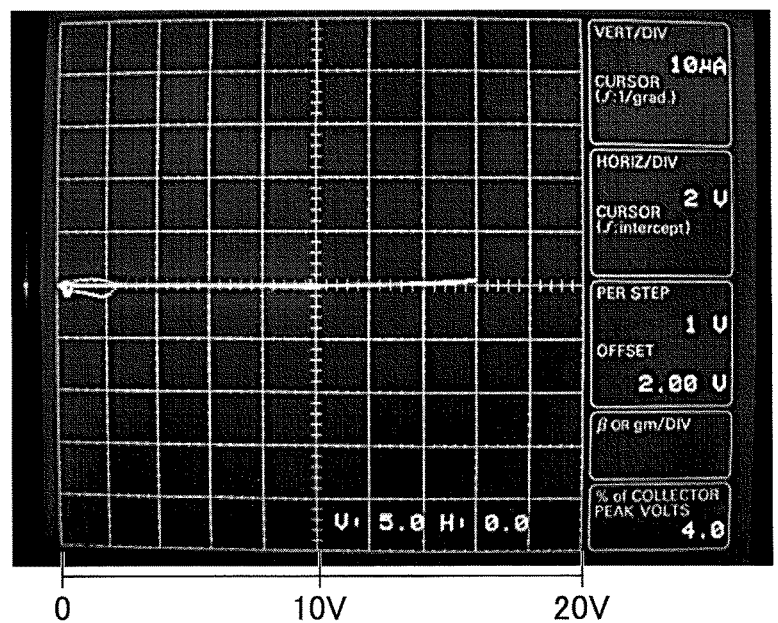
FIG. 42 is a correlation diagram of the gate voltage and the leak current of the semiconductor device in a fifth embodiment.

Next, a description will be given of the properties of the semiconductor device in this embodiment. FIG. 42 illustrates measured results of the gate leak current that flows when a voltage is applied across the gate electrode and the drain electrode of the semiconductor device in this embodiment. In FIG. 42, the abscissa indicates the applied voltage, and the ordinate indicates the gate leak current. FIG. 42 is a correlation diagram of the gate voltage and the leak current of the semiconductor device in the fifth embodiment.

According to the semiconductor device in this embodiment, no gate leak current flows even when the voltage of up to 16 V is applied across the gate electrode and the drain electrode, as illustrated in FIG. 42. On the other hand, according to the semiconductor device illustrated in FIG. 1, the gate leak current flows when the voltage is applied across the gate electrode and the drain electrode, as illustrated in FIG. 33. Hence, it is confirmed that the semiconductor device in this embodiment can suppress the generation of the gate leak current. The generation of the gate leak current is suppressed and the gate leak current can be reduced according to the semiconductor device in this embodiment, because the oxide layer 50 and the insulator layer 60 are formed immediately below the gate electrode 31.

Figure 43:
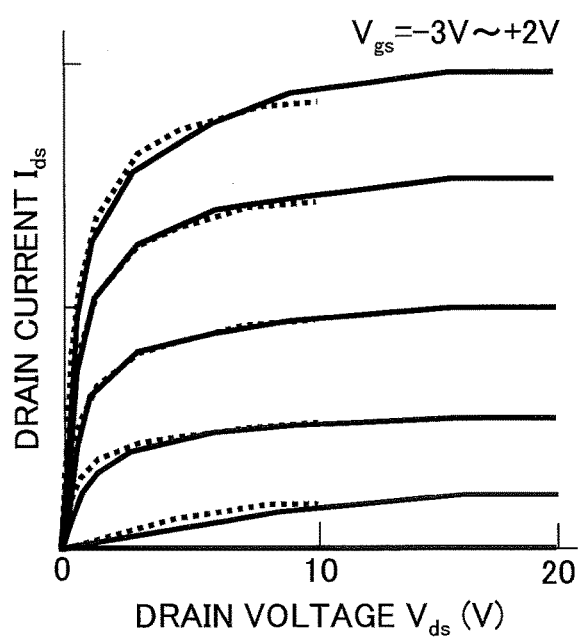
FIG. 43 is a correlation diagram of the drain voltage and the drain current of the semiconductor device in the fifth embodiment.

Next, a description will be given of the current collapse of the semiconductor device in this embodiment, in comparison with the current collapse of the semiconductor device illustrated in FIG. 27. FIG. 43 illustrates a relationship between the drain voltage $V_{ds}$ and the drain current $I_{ds}$ when the gate voltage $V_{gs}$ is varied, for a case in which the drain voltage $V_{ds}$ is increased up to 10 V, and for a case in which the drain voltage $V_{ds}$ is increased up to 20 V. FIG. 43 is a correlation diagram of the drain voltage and the drain current of the semiconductor device in the fifth embodiment.

According to the semiconductor device having the structure illustrated in FIG. 27, the drain current $I_{ds}$ decreases due to the current collapse in the case in which the drain voltage $V_{ds}$ is increased up to 20 V, as illustrated in FIG. 35. On the other hand, according to the semiconductor device in this embodiment, the drain current $I_{ds}$ does not decrease even in the case in which the drain voltage $V_{ds}$ is increased up to 20 V, as illustrated in FIG. 43, and the generation of the current collapse is suppressed. In addition, when the properties of the semiconductor device in this embodiment illustrated in FIG. 43 and the properties of the semiconductor device in the fourth embodiment illustrated in FIG. 34 are compared, it is confirmed that the generation of the current collapse can be suppressed more in this embodiment than in the fourth embodiment. It may be regarded that this embodiment can further suppress the generation of the current collapse, even when compared to the fourth embodiment, because the oxidation time of InAlN by the $H_2O$ oxidation using water vapor is longer than that of the fourth embodiment and the thickness of the oxidation layer 50 becomes greater than that of the fourth embodiment. In addition, it may be regarded that this embodiment can further suppress the generation of the current collapse, because the Al composition ratio at the surface of the oxide layer 50 in this embodiment is higher than that of the fourth embodiment.

Therefore, according to the semiconductor device in this embodiment, it is possible to reduce the gate leak current. In addition, because the generation of the current collapse can be suppressed, it is possible to suppress the ON-resistance from becoming high.

Other features of the fifth embodiment are the same as those of the fourth embodiment.

Sixth Embodiment (Semiconductor Device)

Figure 44:
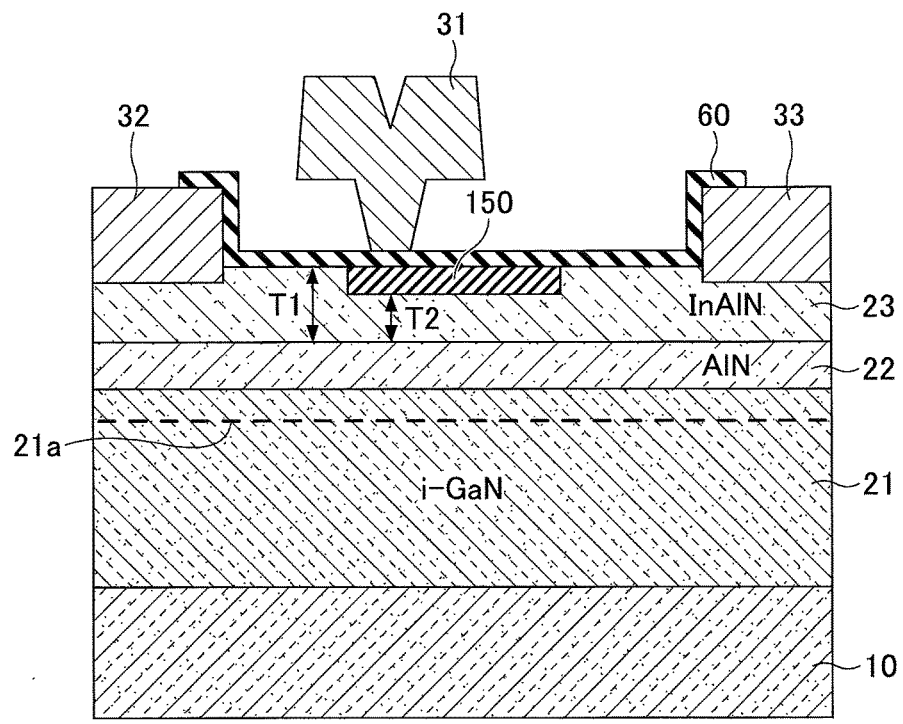
FIG. 44 is a structure diagram illustrating the semiconductor device in a sixth embodiment.

Next, a description will be given of the semiconductor device in a sixth embodiment, by referring to FIG. 44. FIG. 44 is a structure diagram illustrating the semiconductor device in the sixth embodiment. The semiconductor device illustrated in FIG. 44 includes a buffer layer (not illustrated), an i-GaN electron transit layer 21, an AlN intermediate layer 22, and an InAlN electron supply layer 23 that are stacked on a substrate 10. A source electrode 32 and a drain electrode 33 are provided on the electron supply layer 23. An oxide layer 150 is formed by oxidizing a material forming the electron supply layer 23, at a surface of the electron supply layer 23 immediately under a region where a gate electrode 31 is to be formed. An insulator layer 60 that becomes a gate insulator layer is provided on the electron supply layer 23 and the oxide layer 150. The insulator layer 60 is made of $Al_2O_3$ or the like. The gate electrode 31 is provided on the insulator layer 60 in a region where the oxide layer 150 is formed. In this embodiment, the substrate 10 is made of semi-insulating SiC, and a 2DEG 21a is generated in the electron transit layer 21 at the vicinity of the interface between the electron transit layer 21 and the intermediate layer 22.

The oxide layer 150 of the semiconductor device in this embodiment is formed by oxidizing the electron supply layer 23. The oxide layer 150 is not only formed in a region directly under the gate electrode 31, but is also formed in a region from the region directly under the gate electrode 31 to an intermediate part between the gate electrode 31 and the drain electrode 33. Hence, it is possible to further improve the insulation provided by the oxide layer 150, and obtain a high output from the semiconductor device.

Because the oxide layer 150 is formed by oxidizing the electron supply layer 23, thickness of the electron supply layer 23 in the region where the oxide layer 150 is formed is smaller than the thickness of the electron supply layer 23 in the region where no oxide layer 150 is formed. When the thickness of the electron supply layer 23 becomes smaller in the region where the oxide layer 150 is formed, the 2DEG 21a directly under this region decreases. In the case of the semiconductor device in this embodiment having the electron transit layer 21 formed by i-GaN and the electron supply layer 23 formed by InAlN, the 2DEG 21a having a high concentration is generated in the electron transit layer 21 at the vicinity of the interface between the electron transit layer 21 and the intermediate layer 22. In the case in which the 2DEG 21a in the electron transit layer 21 has the high concentration, it is possible to increase the drain current, however, a gate breakdown voltage and an off-state breakdown voltage decrease.

Accordingly, in this embodiment, the oxide layer 150 is formed in the region from directly under the gate electrode 31 to the intermediate part between the gate electrode 31 and the drain electrode 33, in order to reduce the thickness of the electron supply layer 23 in the region where the oxide layer 150 is formed. Hence, it is possible to decrease the density of the 2DEG 21a that is generated in the region from directly under the gate electrode 31 to the intermediate part between the gate electrode 31 and the drain electrode 33. By decreasing the density of the 2DEG 21a in the region from directly under the gate electrode 31 to the intermediate part between the gate electrode 31 and the drain electrode 33, it becomes possible to improve the gate breakdown voltage and the off-state breakdown voltage, and obtain the high output from the semiconductor device. In addition, as illustrated in FIG. 45, a depletion layer region 151 can be extended to a desired region, in order to improve a high-frequency response of the semiconductor device.

Figure 45:
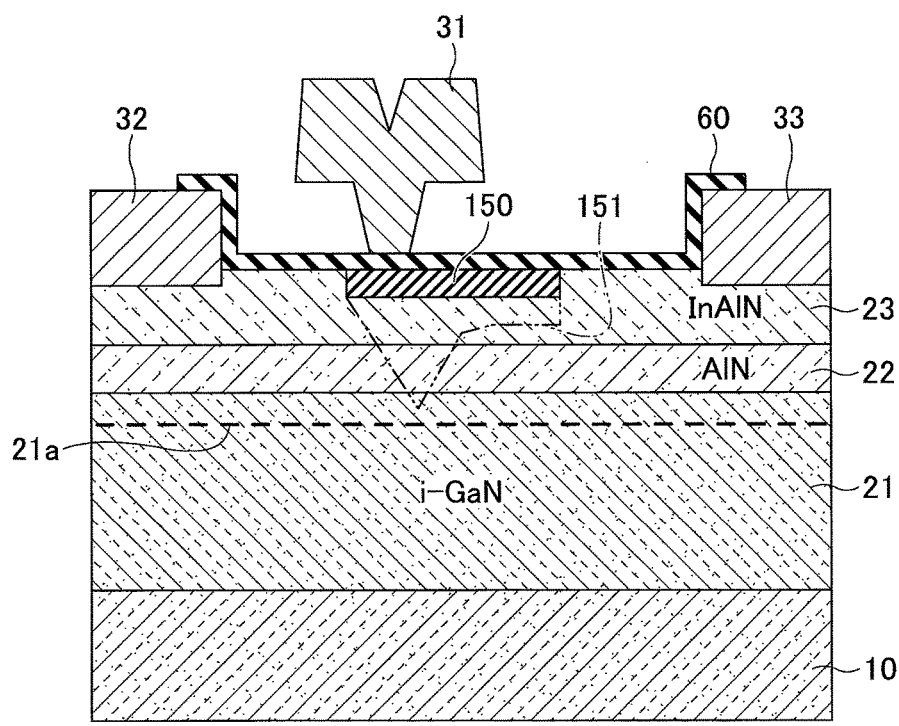
FIG. 45 is a diagram for explaining the semiconductor device in the sixth embodiment.

FIG. 45 is a diagram for explaining the semiconductor device in the sixth embodiment. In FIG. 45, a two-dot chain line indicates a spread of the depletion layer region 151 when a voltage is applied to the gate electrode 31. As illustrated in FIG. 45, the depletion layer region 151 can easily be extended between the gate electrode 31 and the drain electrode 33, to the region in which the 2DEG 21a is generated.

In this embodiment, a thickness T1 of the electron supply layer 23 in the region where no oxide layer 150 is formed is 10 nm, and in a case in which the thickness of the oxide layer 150 is 3 nm, a thickness T2 of the electron supply layer 23 in the region where the oxide layer 150 is formed is 7 nm.

(Properties of Semiconductor Device)

Figure 46:
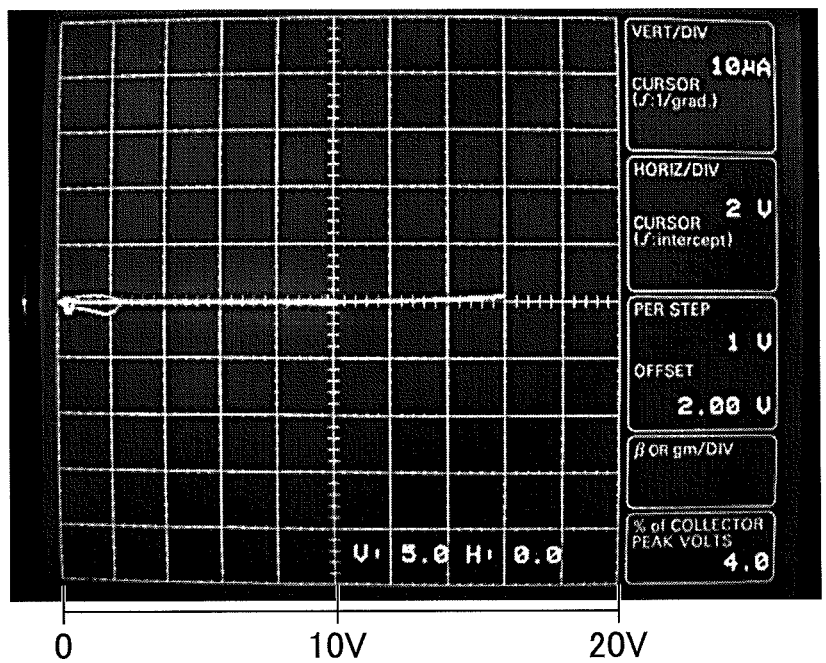
FIG. 46 is a correlation diagram of the gate voltage and the leak current of the semiconductor device in the sixth embodiment.

Next, a description will be given of the properties of the semiconductor device in this embodiment. FIG. 46 illustrates measured results of the gate leak current that flows when a voltage is applied across the gate electrode and the drain electrode of the semiconductor device in this embodiment. In FIG. 46, the abscissa indicates the applied voltage, and the ordinate indicates the gate leak current. FIG. 46 is a correlation diagram of the gate voltage and the leak current of the semiconductor device in the fifth embodiment.

According to the semiconductor device in this embodiment, no gate leak current flows even when the voltage of up to 16 V is applied across the gate electrode and the drain electrode, as illustrated in FIG. 46. On the other hand, according to the semiconductor device illustrated in FIG. 1, the gate leak current flows when the voltage is applied across the gate electrode and the drain electrode, as illustrated in FIG. 33. Hence, it is confirmed that the semiconductor device in this embodiment can suppress the generation of the gate leak current. The generation of the gate leak current is suppressed and the gate leak current can be reduced according to the semiconductor device in this embodiment, because the oxide layer 150 and the insulator layer 60 are formed immediately below the gate electrode 31.

Next, a description will be given of properties of the semiconductor device in the fourth embodiment and the semiconductor device in the sixth embodiment, by referring to FIG. 47. FIG. 47 is a diagram for explaining the properties of the semiconductor devices in the fourth embodiment and the sixth embodiment. As illustrated in FIG. 47, a gate-source capacitance $C_{gs}$ is 500 (fF/mm) and the same for the semiconductor device in the fourth embodiment and the semiconductor device in the sixth embodiment. In addition, a drain-source capacitance $C_{ds}$ is 150 (fF/mm) and the same for the semiconductor device in the fourth embodiment and the semiconductor device in the sixth embodiment.

On the other hand, a gate-drain capacitance $C_{gd}$ is 130 (fF/mm) for the semiconductor device in the fourth embodiment, but is 110 (fF/mm) for the semiconductor device in the sixth embodiment. In other words, the gate-drain capacitance $C_{gd}$ of the semiconductor device in the sixth embodiment is lower than that of the semiconductor device in the fourth embodiment.

In addition, a maximum transmission frequency $f_{max}$ is 240 (GHz) for the semiconductor device in the fourth embodiment, but is 250 (GHz) for the semiconductor device in the sixth embodiment. In other words, the maximum transmission frequency $f_{max}$ of the semiconductor device in the sixth embodiment is higher than that of the semiconductor device in the fourth embodiment. Accordingly, the frequency response of the semiconductor device in the sixth embodiment can further be improved compared to that of the semiconductor device in the fourth embodiment.

(Method of Manufacturing Semiconductor Device)

Next, a description will be given of the method of manufacturing the semiconductor device in the sixth embodiment, by referring to FIGS. 48A through 53. FIGS. 48A through 53 are diagrams for explaining processes of the method of manufacturing the semiconductor device in this embodiment.

Figure 48A:
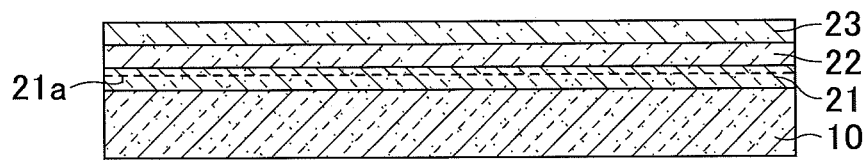
FIGS. 48A, 48B, and 48C are diagrams for explaining processes of a method of manufacturing the semiconductor device in the sixth embodiment.

First, as illustrated in FIG. 48A, the buffer layer (not illustrated), the electron transit layer 21, the intermediate layer 22, and the electron supply layer 23 are expitaxially grown on the substrate 10 by MOVPE and successively stacked. In this embodiment, each of the buffer layer (not illustrated), the electron transit layer 21, the intermediate layer 22, and the electron supply layer 23 may also be referred to as "a nitride semiconductor layer". The electron transit layer 21 is formed by i-GaN to a thickness of approximately 3 μm, the intermediate layer 22 is formed by i-AlN to a thickness of approximately 1 nm, and the electron supply layer 23 is formed by i-In$_{0.17}$Al$_{0.83}$N to a thickness of approximately 10 nm. Hence, the 2DEG 21a is generated in the electron transit layer 21 at the vicinity of the interface between the electron transit layer 21 and the intermediate layer 22. The substrate 10 is formed by semi-insulating SiC, and the buffer layer (not illustrated) is formed by GaN, AlGaN, or the like.

Figure 48B:
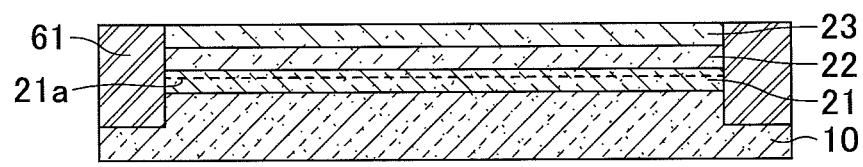

Next, as illustrated in FIG. 48B, an isolation region 61 is formed in the nitride semiconductor layers that are formed on the substrate 10. More particularly, a photoresist is coated on the electron supply layer 23, and a resist pattern (not illustrated), having an opening in a region where the isolation region 61 is to be formed, is formed by exposing the photoresist by the exposure apparatus and developing the exposed photoresist. Thereafter, Ar ions or the like are injected into the nitride semiconductor layers within the opening of the resist pattern, in order to form the isolation region 61. When forming the isolation region 61, the Ar ions or the like may be injected into a part of the substrate 10. The resist pattern is thereafter removed using an organic solvent or the like.

Figure 48C:
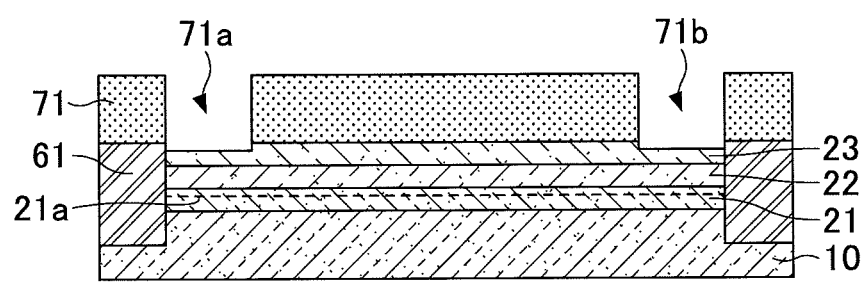

Next, as illustrated in FIG. 48C, a resist pattern 71, having openings 71a and 71b in regions where the source electrode 32 and the drain electrode 33 are to be formed, is formed on the electron supply layer 23, and then, a part at the surface of the electron supply layer 23 is removed within the openings 71a and 71b. More particularly, a photoresist is coated on the electron supply layer 23, and the resist pattern 71, having the openings 71a and 71b in the regions where the source electrode 32 and the drain electrode 33 are to be formed, is formed by exposing the photoresist by the exposure apparatus and developing the exposed photoresist. Thereafter, the part at the surface of the electron supply layer 23, exposed within the openings 71a and 71b of the resist pattern 71 and not covered by the photoresist of the resist pattern 71, is removed by RIE or the like. The RIE may use, as an etching gas, a gas including a chlorine component.

Figure 49A:
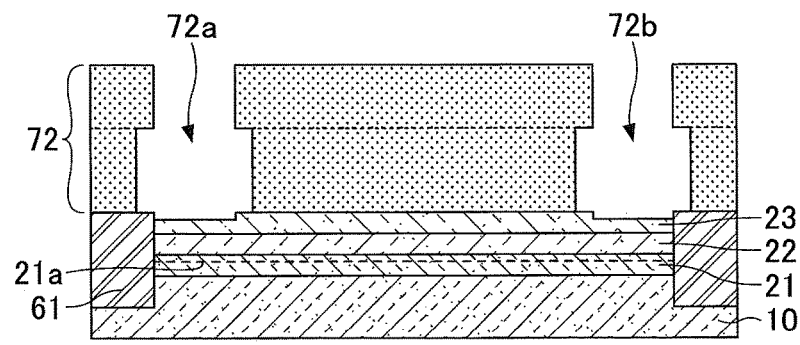
FIGS. 49A, 49B, and 49C are diagrams for explaining processes of the method of manufacturing the semiconductor device in the sixth embodiment.

Next, as illustrated in FIG. 49A, the resist pattern 71 is removed using an organic solvent or the like, to form a resist pattern 72 having openings 72a and 72b in the regions where the source electrode 32 and the drain electrode 33 are to be formed. More particularly, after removing the resist pattern 71 using the organic solvent or the like, a photoresist is again coated on the electron supply layer 23, and the photoresist is exposed by the exposure apparatus and developed. Hence, the resist pattern 72, having the openings 72a and 72b in the regions where the source electrode 32 and the drain electrode 33 are to be formed, is formed. As illustrated in FIG. 18A, the resist pattern 72 is formed by stacking 2 resist layers.

Figure 49B:
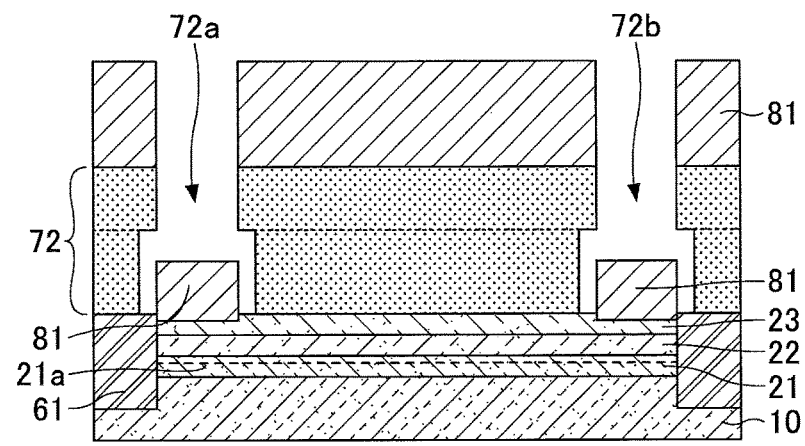

Next, as illustrated in FIG. 49B, a metal multilayer 81 made of Ti/Al is deposited on the surface of the stacked structure formed with the resist pattern 72, by vacuum deposition. More particularly, a Ti layer is deposited on the surface of the stacked structure formed with the resist pattern 72, by vacuum deposition, and an Al layer is thereafter deposited on the Ti layer by vacuum deposition. In this embodiment, the Ti layer is deposited to a thickness of approximately 20 nm, and the Al layer is deposited to a thickness of approximately 200 nm.

Figure 49C:
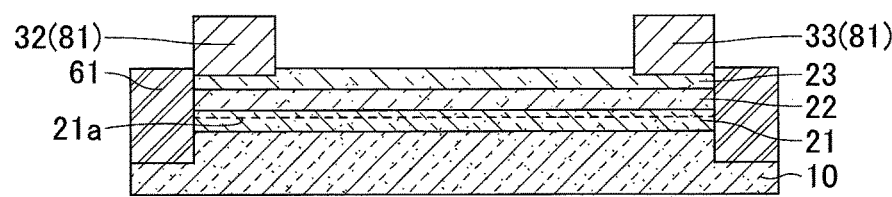

Next, as illustrated in FIG. 49C, the metal multilayer 81 formed on the resist pattern 72 is removed together with the resist pattern 72 by lift-off, by dipping the stacked structure in an organic solvent or the like. As a result, the source electrode 32 and the drain electrode 33 are formed by the metal multilayer 81 remaining within the regions where the openings 72a and 72b of the resist pattern 72 were formed. Thereafter, a thermal process is performed at a temperature of 550° C., in order to establish an ohmic contact between the electron supply layer 23 and each of the source electrode 32 and the drain electrode 33.

Figure 50A:
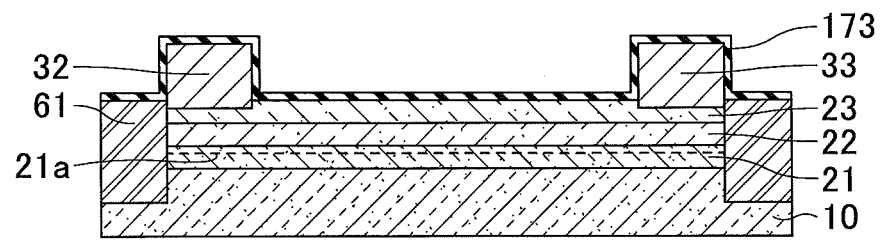
FIGS. 50A, 50B, and 50C are diagrams for explaining processes of the method of manufacturing the semiconductor device in the sixth embodiment.

Next, as illustrated in FIG. 50A, an insulator layer (hereinafter also referred to as "a hard mask insulator layer") 173 for forming a hard mask which will be described later is formed on the electron supply layer 23, the source electrode 32, and the drain electrode 33. More particularly, an SiN layer having a thickness of approximately 20 nm is deposited on the electron supply layer 23, the source electrode 32, and the drain electrode 33 by plasma CVD, to form the hard mask insulator layer 173. When forming the hard mask insulator layer 173 by the plasma CVD, silane, ammonia, or the like may be used for a source gas, for example. A refractive index of the hard mask insulator layer 173 at the wavelength of 633 nm is 2.0, and the hard mask insulator layer 173 is a stoichiometric layer.

Figure 50B:
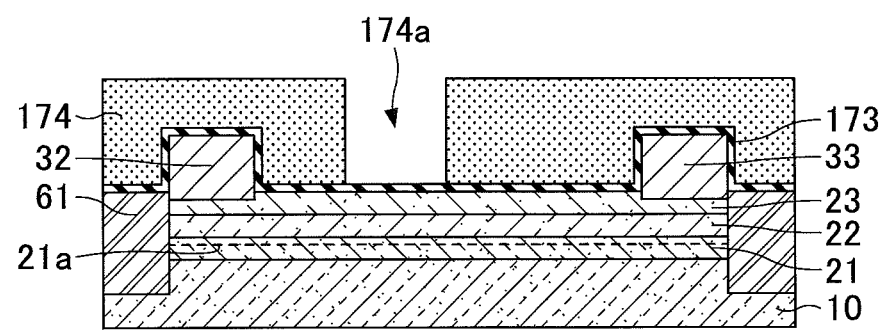

Next, as illustrated in FIG. 50B, a resist pattern 174 having an opening 174a is formed on the hard mask insulator layer 173. More particularly, a photoresist is coated on the hard mask insulator layer 173, and the resist pattern 174 having the opening 174a is formed by exposing the photoresist by the exposure apparatus and developing the exposed photoresist. The opening 174a of the resist pattern 174 has a width of approximately 1.0 μm, and has a size identical to the size of the oxide layer 150 that is formed by oxidizing the electron supply layer 23, as will be described later in the specification. In this embodiment, the oxide layer 150 partially extends from a region directly under the gate electrode 31 towards the drain electrode 33.

Figure 50C:
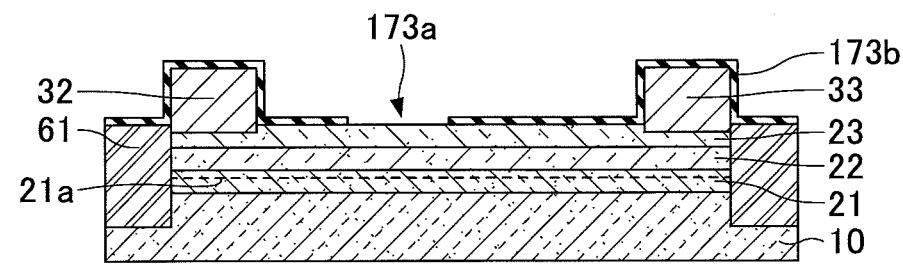

Next, as illustrated in FIG. 50C, an opening 173a is formed by removing the hard mask insulator layer 173 exposed within the opening 174a of the resist pattern 174 by RIE or the like. As a result, a hard mask 173b having the opening 173a is formed by the remaining hard mask insulator layer 173. The resist pattern 174 is thereafter removed using an organic solvent or the like.

Figure 51A:
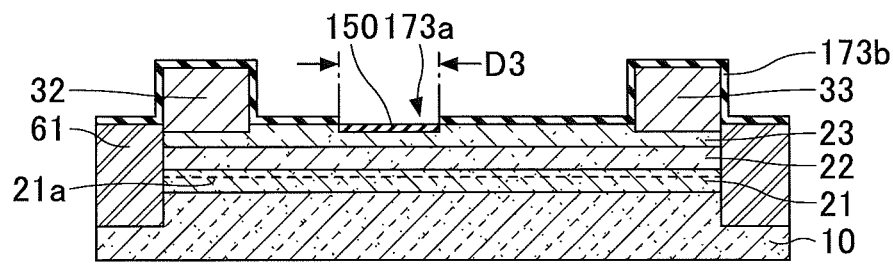
FIGS. 51A, 51B, and 51C are diagrams for explaining processes of the method of manufacturing the semiconductor device in the sixth embodiment.

Next, as illustrated in FIG. 51A, the oxide layer 150 is formed by oxidizing the surface of the electron supply layer 23 exposed within the opening 173a of the hard mask 173b, by the $H_2O$ oxidation using water vapor. More particularly, the ALD apparatus is used to form the oxide layer 150 by setting the substrate temperature to 300° C., supplying water vapor ($H_2O$) which becomes an oxidation source, and oxidizing the surface of the electron supply layer 23 exposed within the opening 173a of the hard mask 173b. The oxide layer 150 that is formed in this manner has a thickness of approximately 1.5 nm, and a width D3 of approximately 1.0 μm so as to partially extend from the region directly under the gate electrode 31 towards the drain electrode 33.

Figure 51B:
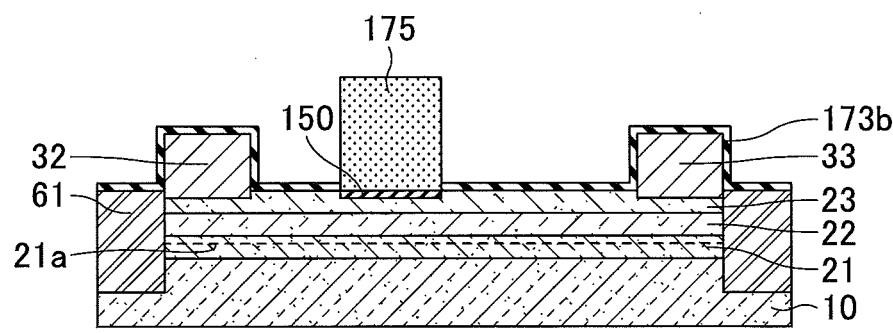

Next, as illustrated in FIG. 51B, a resist pattern 175 is formed on the oxide layer 150. More particularly, a photoresist is formed on the electron supply layer 23, the oxide layer 150, the source electrode 32, and the drain electrode 33, and the resist pattern 175 is formed by exposing the photoresist by the exposure apparatus and developing the exposure photoresist.

Figure 51C:
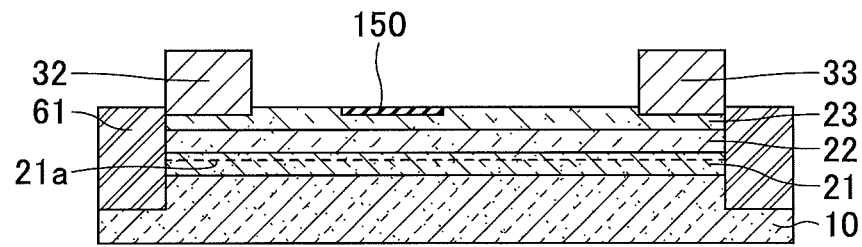

Next, as illustrated in FIG. 51C, the hard mask 173b in regions where no resist pattern 175 is formed is removed using a buffered hydrogen fluoride or the like. Thereafter, the resist pattern 175 is removed using an organic solvent or the like.

Figure 52A:
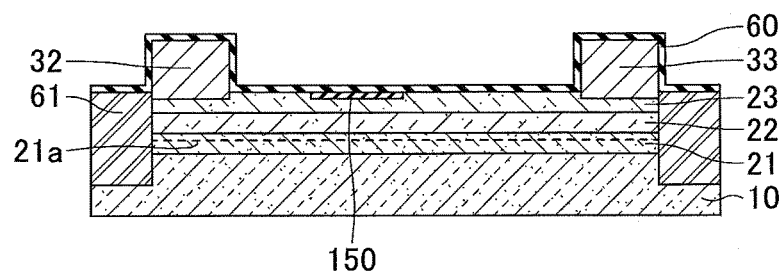
FIGS. 52A, 52B, and 52C are diagrams for explaining processes of the method of manufacturing the semiconductor device in the sixth embodiment.

Next, as illustrated in FIG. 52A, an insulator layer 60, which becomes a gate insulator layer, is formed on the electron supply layer 23, the oxide layer 150, the source electrode 32, and the drain electrode 33. More particularly, an $Al_2O_3$ layer having a thickness of approximately 2 nm is deposited on the electron supply layer 23, the oxide layer 150, the source electrode 32, and the drain electrode 33 by ALD, to form the insulator layer 60 that becomes the gate insulator layer. When forming the insulator layer 60 by the ALD, TMA, $H_2O$, or the like may be used for a source gas, for example, and the deposition may be performed at a substrate temperature of 300° C., for example.

Figure 52B:
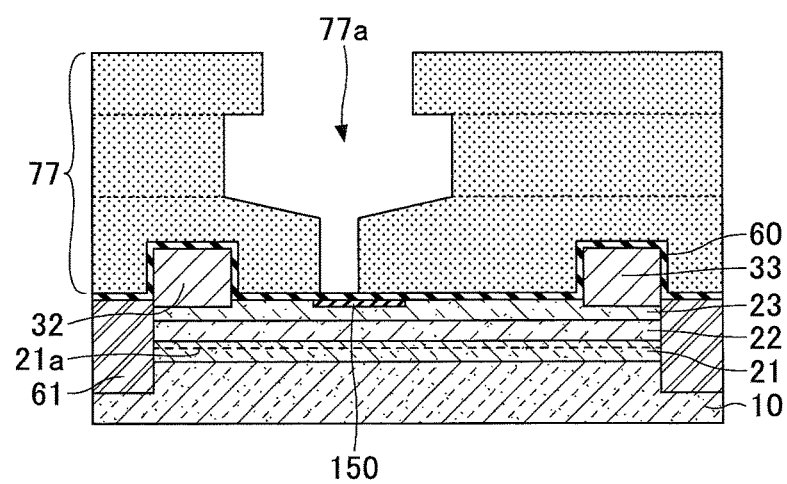

Next, as illustrated in FIG. 52B, a resist pattern 77 for forming the gate electrode 31 is formed on the insulator layer 60. This resist pattern 77 is formed by 3 electron beam resist layers that are stacked, and has an opening 77a in the region where the gate electrode 31 is to be formed. More particularly, the 3 electron beam resist layers are successively formed on the insulator layer 60 by repeatedly coating the same, for example. In addition, exposing the electron beam resist by the electron beam lithography apparatus and developing the exposed electron beam resist are repeated for each of the 3 electron beam resist layers, in order to form the opening 77a in the 3 electron beam resist layers. As a result, the opening 77a is formed in the resist pattern 77. The opening 77a of the resist pattern 77 is formed to have a width of 0.8 μm, 1.3 μm, and 0.2 μm for the top, middle, and bottom electron beam resist layers forming the 3 electron beam resist layers.

Figure 52C:
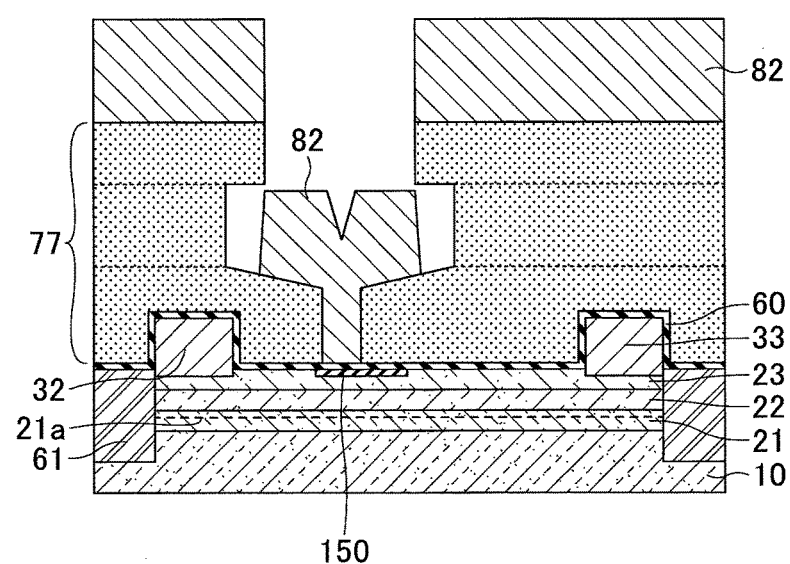

Next, as illustrated in FIG. 52C, a metal multilayer 82 made of Ni/Au is deposited on the surface of the stacked structure formed with the resist pattern 77, by vacuum deposition. More particularly, an Ni layer is deposited on the surface of the stacked structure formed with the resist pattern 77, by vacuum deposition, and an Au layer is thereafter deposited on the Ni layer by vacuum deposition. In this embodiment, the Ni layer is deposited to a thickness of approximately 10 nm, and the Au layer is deposited to a thickness of approximately 300 nm.

Figure 53:
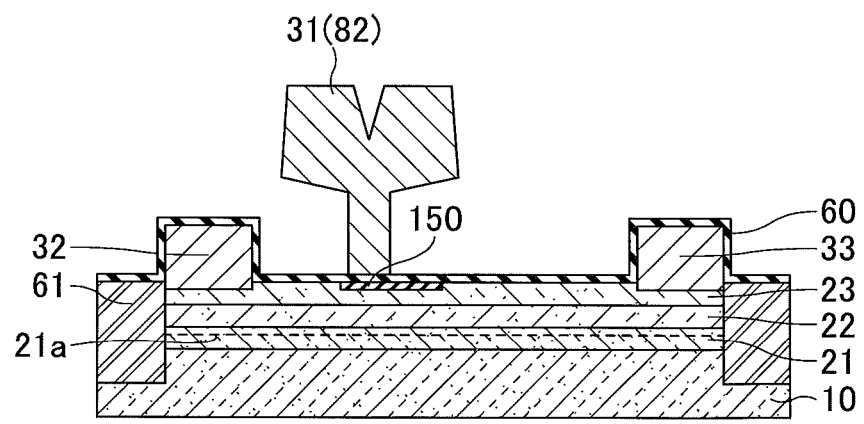
FIG. 53 is a diagram for explaining the process of the method of manufacturing the semiconductor device in the sixth embodiment.

Next, as illustrated in FIG. 53, the metal multilayer 82 formed on the resist pattern 77 is removed together with the resist pattern 77 by lift-off, by dipping the stacked structure in an organic solvent or the like. As a result, the gate electrode 31 is formed by the metal multilayer 82 remaining within the region where the opening 77a of the resist pattern 77 was formed.

The semiconductor device in this embodiment is manufactured by the processes described above.

Other features of the sixth embodiment are the same as those of the fourth embodiment.

Seventh Embodiment

Next, a description will be given of a seventh embodiment. In this embodiment, the present invention is applied to a semiconductor device, a power supply unit, and a high-output amplifier (or high-frequency amplifier).
(Semiconductor Device)

The semiconductor device in this embodiment includes a discrete package of the semiconductor device in any of the fourth through sixth embodiments described above. A description of the discrete package of the semiconductor device may be the same as that described above in conjunction with FIG. 23, and a description thereof will be omitted.
(PFC Circuit, Power Supply Unit & High-Output Amplifier)

Next, a description will be given of the PFC circuit, the power supply unit, and the high-output amplifier (or high-frequency amplifier) in this embodiment. The PFC circuit, the power supply unit, and the high-output amplifier (or high-frequency amplifier) in this embodiment respectively are the power supply unit and the high-output amplifier (or high-frequency amplifier) using the semiconductor device in any of the fourth through sixth embodiments.
(PFC Circuit)

The PFC circuit in this embodiment may be the same as that described above in conjunction with FIG. 24, and a description thereof will be omitted.
(Power Supply Unit)

The power supply unit in this embodiment may be the same as that described above in conjunction with FIG. 25, and a description thereof will be omitted.
(High-Output Amplifier)

The high-output amplifier (or high-frequency amplifier) in this embodiment may be the same as that described above in conjunction with FIG. 26, and a description thereof will be omitted.

In each of the embodiments described above, the source electrode 32 and the drain electrode 33 may be formed on the electron transit layer 21 forming the first semiconductor layer, or on the electron supply layer 23 forming the second semiconductor layer.

According to each of the embodiments described above, it is possible to reduce the gate leak current in the HEMT that uses InAlN for the electron supply layer and has the Schottky gate electrode.

Although the embodiments are numbered with, for example, "first," "second," . . . "seventh," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
    a first semiconductor layer made of a nitride semiconductor and provided on a substrate surface;
    a second semiconductor layer made of a nitride semiconductor including InAlN and provided above a surface of the first semiconductor layer opposite from the substrate surface;
    a source electrode and a drain electrode respectively provided on the surface of the first semiconductor layer or a first surface of the second semiconductor layer opposite from the first semiconductor layer;
    an insulator layer made of a material including Al and In and provided on the first surface of the second semiconductor layer; and
    a gate electrode provided on a surface of the insulator layer,
    wherein an Al-content of the insulator layer is higher than an In-content of the insulator layer.

2. The semiconductor device as claimed in claim 1, wherein the insulator layer extends in a direction parallel to the substrate surface from a region directly under the gate electrode towards the drain electrode to an intermediate part between the gate electrode and the drain electrode.

3. The semiconductor device as claimed in claim 1, wherein the insulator layer is formed by an oxidized surface part of the second semiconductor layer.

4. The semiconductor device as claimed in claim 1, further comprising:
    a third semiconductor layer made of a nitride semiconductor and provided between the surface of the first semiconductor layer and a second surface of the second semiconductor layer opposite from the first surface thereof.

5. The semiconductor device as claimed in claim 4, wherein the third semiconductor layer is made of the nitride semiconductor including AlN.

6. The semiconductor device as claimed in claim 1, wherein the first semiconductor layer is made of the nitride semiconductor including GaN.

7. The semiconductor device as claimed in claim 1, wherein the insulator has a thickness of 1 nm or greater and 5 nm or less.

8. The semiconductor device as claimed in claim 1, further comprising:
    a protection layer made of an insulating material and provided on the first surface of the second semiconductor layer and the surface of the insulator layer,
    wherein the gate electrode is provided on a surface of the protection layer in a region where the insulator layer is provided.

9. The semiconductor device as claimed in claim 8, wherein the protection layer is made of the insulating material selected from a group consisting of oxides, nitrides, and oxynitrides.

10. The semiconductor device as claimed in claim 1, further comprising:
    a protection layer made of an insulating material and provided on the first surface of the second semiconductor layer and the surface of the insulator layer,
    wherein the protection layer and the gate electrode cover the surface of the insulator layer in its entirety.

11. The semiconductor device as claimed in claim 10, wherein the protection layer is made of the insulating material selected from a group consisting of $Al_2O_3$, AlN, and AlON.

12. The semiconductor device as claimed in claim 10, wherein the gate electrode makes contact with the protection layer.

13. The semiconductor device as claimed in claim 1, wherein a length of a surface of the gate electrode in contact with the surface of the insulator layer and extending along a direction parallel to the substrate surface is shorter than a length of the surface of the insulator layer extending along the direction parallel to the substrate surface.

14. The semiconductor device as claimed in claim 1, further comprising:
    a substrate made of a semi-insulating SiC and having the substrate surface.

15. A semiconductor chip comprising:
    a HEMT (High Electron Mobility Transistor),
    wherein the HEMT is formed by a semiconductor device according to claim 1.

16. A power supply unit comprising:
    a semiconductor device according to claim 1.

17. An amplifier comprising:
    a semiconductor device according to claim 1.

* * * * *